US012768073B2

(12) United States Patent
Takamura et al.

(10) Patent No.: US 12,768,073 B2
(45) Date of Patent: Oct. 20, 2026

(54) FABRICATING APPARATUS OF SiC EPITAXIAL WAFER AND FABRICATION METHOD OF THE SiC EPITAXIAL WAFER

(71) Applicant: ROHM CO., LTD., Kyoto (JP)

(72) Inventors: Makoto Takamura, Kyoto (JP); Takuji Maekawa, Kyoto (JP); Mitsuru Morimoto, Kyoto (JP); Noriyuki Masago, Kyoto (JP); Takayasu Oka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 310 days.

(21) Appl. No.: 18/361,951

(22) Filed: Jul. 31, 2023

(65) Prior Publication Data

US 2023/0374698 A1 Nov. 23, 2023

Related U.S. Application Data

(63) Continuation of application No. PCT/JP2021/040770, filed on Nov. 5, 2021.

(30) Foreign Application Priority Data

Feb. 1, 2021 (JP) ................................ 2021-014677

(51) Int. Cl.
*C30B 25/12* (2006.01)
*C23C 16/32* (2006.01)
(Continued)

(52) U.S. Cl.
CPC ............ *C30B 25/12* (2013.01); *C23C 16/325* (2013.01); *C23C 16/45502* (2013.01);
(Continued)

(58) Field of Classification Search
CPC ......... C30B 25/12; C30B 25/10; C30B 25/14; C30B 25/20; C30B 29/36; C23C 16/325;
(Continued)

(56) References Cited

U.S. PATENT DOCUMENTS 4,401,689 A 8/1983 Ban
5,472,909 A * 12/1995 Akatsuka .............. H01L 21/306 438/560

(Continued)

FOREIGN PATENT DOCUMENTS

DE 10335460 A1 3/2005
DE 102017127169 A1 5/2019

(Continued)

OTHER PUBLICATIONS

German Office Action issued Jan. 16, 2024 in corresponding German Patent Application No. 11 2021 006 680.3, 14 pages.

(Continued)

*Primary Examiner* — Robert M Kunemund
(74) *Attorney, Agent, or Firm* — XSENSUS LLP

(57) ABSTRACT

A fabricating apparatus (2) of an sic epitaxial wafer disclosed herein includes: a growth furnace (100A); a gas mixing preliminary chamber (107) disposed outside the growth furnace and configured to mix carrier gas and/or material gas and to regulate a pressure thereof; a wafer boat (210) configured so that a plurality of SiC wafer pairs (200WP), in which two substrates each having an SiC single crystal in contact with each other in a back-to-back manner, are disposed at equal intervals with a gap therebetween; and a heating unit (101) configured to heat the wafer boat disposed in the growth furnace to an epitaxial growth temperature. The carrier gas and/or the material gas are introduced into the growth furnace after preliminarily being mixed and pressure-regulated in the gas mixing preliminary chamber (107) to grow an SiC layer on a surface of each of the plurality of SiC wafer pairs.

20 Claims, 32 Drawing Sheets

(51) Int. Cl.

| | |
|---|---|
| ***C23C 16/455*** | (2006.01) |
| ***C23C 16/458*** | (2006.01) |
| ***C23C 16/46*** | (2006.01) |
| ***C30B 25/10*** | (2006.01) |
| ***C30B 25/14*** | (2006.01) |
| ***C30B 25/20*** | (2006.01) |
| ***C30B 29/36*** | (2006.01) |
| ***H10P 14/20*** | (2026.01) |

(52) U.S. Cl.
CPC .......... *C23C 16/4587* (2013.01); *C23C 16/46* (2013.01); *C30B 25/10* (2013.01); *C30B 25/14* (2013.01); *C30B 25/20* (2013.01); *C30B 29/36* (2013.01); *H10P 14/20* (2026.01); *H10P 14/2904* (2026.01); *H10P 14/3408* (2026.01)

(58) Field of Classification Search
CPC .......... C23C 16/45502; C23C 16/4587; C23C 16/46; H01L 21/02378; H01L 21/02529; H01L 21/02634; H01P 14/20; H01P 14/2904; H01P 14/3408
See application file for complete search history.

(56) References Cited

U.S. PATENT DOCUMENTS

| | | | |
|---|---|---|---|
| 8,916,451 | B2 | 12/2014 | Bayram et al. |
| 2011/0312162 | A1 | 12/2011 | Iacopi |
| 2014/0220764 | A1 | 8/2014 | Bayram et al. |
| 2017/0098694 | A1 | 4/2017 | Tamura |

FOREIGN PATENT DOCUMENTS

| | | | | | |
|---|---|---|---|---|---|
| JP | 62-173712 | A | | 7/1987 | |
| JP | H05-326422 | A | | 12/1993 | |
| JP | H06-20961 | A | | 1/1994 | |
| JP | H06-314660 | A | | 11/1994 | |
| JP | H06349738 | A | | 12/1994 | |
| JP | 2004075493 | A | * | 3/2004 | |
| JP | 2004140320 | A | * | 5/2004 | |
| JP | 2005-109408 | A | | 4/2005 | |
| JP | 3647176 | B2 | * | 5/2005 | |
| JP | 3881562 | B2 | * | 2/2007 | ............. C30B 29/36 |
| JP | 2012-517526 | A | | 8/2012 | |
| JP | 2013-124215 | A | | 6/2013 | |
| JP | 2014-058411 | A | | 4/2014 | |
| JP | 2015-230998 | A | | 12/2015 | |
| JP | 5910430 | B2 | | 4/2016 | |
| JP | 2017-059670 | A | | 3/2017 | |
| JP | 6206786 | B2 | | 10/2017 | |
| JP | 2019-210161 | A | | 12/2019 | |

OTHER PUBLICATIONS

International Search Report and Written Opinion mailed on Dec. 28, 2021, received for PCT Application PCT/JP2021/040770, filed on Nov. 5, 2021, 15 pages including English Translation.
Notice of Reasons for Refusal dated Sep. 30, 2025, in corresponding Japanese patent application No. JP2022-578057 (6 pages; with English translation).
Notice of Reasons for Refusal dated Jul. 1, 2025, in corresponding Japanese patent application No. JP2022-578057 (6 pages; with English translation).
Notice of Reasons for Refusal dated Mar. 3, 2026, in corresponding Japanese patent application No. JP2022-578057 (6 pages; with English translation).
Office Action issued on May 20, 2026 in corresponding German patent application No. 11 2021 006 680.3 (8 pages; with English translation).
Decision of Refusal drafted on Jun. 30, 2026, and mailed on Jul. 7, 2026, in corresponding Japanese patent application No. JP2022-578057 (5 pages; with English machine translation).

* cited by examiner

| | OPERATION | 100%Ar ← | 50%/50% | → 100%$H_2$ |
|---|---|---|---|---|
| VAPOR PHASE | DILUTION (TOTAL PARTIAL PRESSURE) | CONSTANT | | |
| | FLOW VELOCITY | CONSTANT | | |
| | SUPPRESSION EFFECT OF Si NUCLEAR GROWTH | LOW | MEDIUM | HIGH |
| SiC SURFACE | Si ETCHING | WITHOUT ETCHING | MEDIUM | LARGE |
| | C ETCHING | WITHOUT ETCHING | MEDIUM | LARGE |
| | SUPPRESSION EFFECT OF Si SUBLIMATION | CONSTANT | | |
| | GRAPHENE ETCHING | WITHOUT ETCHING | MEDIUM | LARGE |

FABRICATING APPARATUS OF SiC EPITAXIAL WAFER AND FABRICATION METHOD OF THE SiC EPITAXIAL WAFER

CROSS-REFERENCE TO RELATED APPLICATIONS

This is a continuation application (CA) of PCT Application No. PCT/JP2021/040770, filed on Nov. 5, 2021, which claims priority to Japanese Patent Application No. 2021-014677 filed on Feb. 1, 2021, the entire contents of each of which are incorporated herein by reference.

FIELD

The embodiments described herein relate to a fabricating apparatus of a SiC epitaxial wafer, and a fabrication method of the SiC epitaxial wafer.

BACKGROUND

In recent years, since Silicon Carbide (SiC) semiconductors have wider bandgap energy and has high breakdown voltage performance at high electric field than silicon semiconductors or GaAs semiconductors, much attention has been given to such SiC semiconductors capable of realizing high breakdown voltage, high current use, low on resistance, high degree of efficiency, power consumption reduction, high speed switching, and the like.

As a method of forming an SiC wafer, for example, there are a method of forming an SiC epitaxial growth layer by a Chemical Vapor Deposition (CVD) method on an SiC single crystal substrate by a sublimation method; a method of bonding an SiC single crystal substrate by the sublimation method to an SiC CVD polycrystalline substrate and also form an SiC epitaxial growth layer on the SiC single crystal substrate by the CVD method; and the like.

Conventionally, there have been provided devices made of SiC, such as Schottky Barrier Diodes (SBDs), Metal Oxide Semiconductor Field Effect Transistors (MOSFETs), and Insulated Gate Bipolar Transistors (IGBTs), for power control applications.

DESCRIPTION OF EMBODIMENTS

Figure 1:
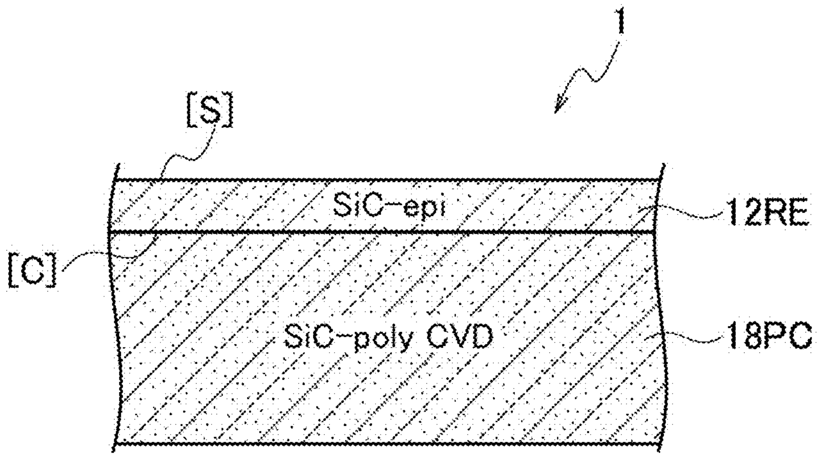
FIG. 1 illustrates a cross-sectional diagram of an SiC epitaxial wafer according to a first embodiment.

Next, certain embodiments will now be explained with reference to drawings. In the description of the following drawings to be explained, the identical or similar reference sign is attached to the identical or similar part. However, the drawings are merely schematic. Moreover, the embodiments described hereinafter merely exemplify the device and method for materializing the technical idea; and the embodiments do not specify the material, shape, structure, placement, etc. of each part as the following. The embodiments disclosed herein may be differently modified.

In the following description of the embodiments, [C] means a C plane of SiC and [S] means an Si plane of SiC.

SiC semiconductor substrates on which such SiC based devices as conventional are formed have been sometimes fabricated by bonding a single-crystal SiC semiconductor substrate onto a polycrystal SiC semiconductor substrate in order to reduce fabricating costs or to provide desired physical properties.

In the technology of bonding the single-crystal SiC semiconductor substrate to the polycrystal SiC semiconductor substrate, it has been necessary to bond the high-quality single-crystal SiC semiconductor substrate to the polycrystal SiC semiconductor substrate without defects in order to grow up an epitaxial layer on the single-crystal SiC semiconductor substrate bonded to the polycrystal SiC semiconductor substrate. However, a polishing process for ensuring surface roughness required in order to bond the single-crystal SiC semiconductor substrate to the polycrystal SiC semiconductor substrate by room temperature bonding or diffusion bonding becomes costly, and a yield may be decreased due to film defects generated at the bonding interface therebetween.

Moreover, in a method of epitaxially grown on an SiC single crystal substrate via a graphene layer, there has been a problem that, since single-crystal SiC epitaxial growth is performed at a high temperature of 1500 to 1600° C., the graphene is etched with hydrogen or other active species in a high temperature state before the epitaxial growth starts.

Moreover, it has been a problem to simultaneously grow a uniform SiC layer on a plurality of substrates to realize both high quality and low cost.

The embodiments provide a fabricating apparatus of an SiC epitaxial wafer and a fabrication method of the SiC epitaxial wafer, having high quality and capable of reducing costs.

According to one aspect of the embodiments, there is provided a fabricating apparatus of an SiC epitaxial wafer, the fabricating apparatus comprising: a growth furnace; a gas mixing preliminary chamber disposed outside the growth furnace, the gas mixing preliminary chamber configured to mix carrier gas and/or material gas and to regulate a pressure thereof; a wafer boat configured so that a plurality of SiC wafer pairs, in which two substrates each having an SiC single crystal in contact with each other in a back-to-back manner, are disposed at equal intervals with a gap therebetween; and a heating unit configured to heat the wafer boat disposed in the growth furnace to an epitaxial growth temperature, wherein the carrier gas and/or the material gas are introduced into the growth furnace after preliminarily being mixed and pressure-regulated in the gas mixing preliminary chamber to grow an SiC layer on a surface of each of the plurality of SiC wafer pairs.

According to another aspect of the embodiments, there is provided a fabrication method of an SiC epitaxial wafer, the fabrication method comprising: disposing a growth furnace; disposing a gas mixing preliminary chamber configured to mix carrier gas and/or material gas and regulate a pressure thereof outside the growth furnace; preparing an SiC wafer pair in which two substrates including an SiC single crystal being in contact with each other in a back-to-back manner; disposing a plurality of the SiC wafer pairs at equal intervals with a gap between each other in a wafer boat; disposing the wafer boat in the growth furnace; heating the wafer boat to an epitaxial growth temperature; introducing carrier gas and/or material gas into the gas mixing preliminary chamber; mixing the carrier gas and/or the material gas and regulating the pressure thereof in advance in the gas mixing preliminary chamber; introducing the carrier gas and/or the material gas into the growth furnace after mixing and pressure-regulating of the carrier gas and/or the material gas; and growing an SiC layer on a surface of each of the plurality of SiC wafer pairs.

(SiC Epitaxial Wafer)

First Embodiment

FIG. 1 illustrates a cross-sectional diagram of an SiC epitaxial wafer 1 according to the first embodiment.

As illustrated in FIG. 1, the SiC epitaxial wafer 1 according to the first embodiment includes: a hexagonal SiC epitaxial growth layer 12RE; and an SiC polycrystalline growth layer disposed on a C plane of the SiC epitaxial growth layer 12E.

Details of the fabrication method of the SiC epitaxial wafer 1 according to the first embodiment will be described below (refer to FIGS. 12A to 21).

Second Embodiment

Figure 2:
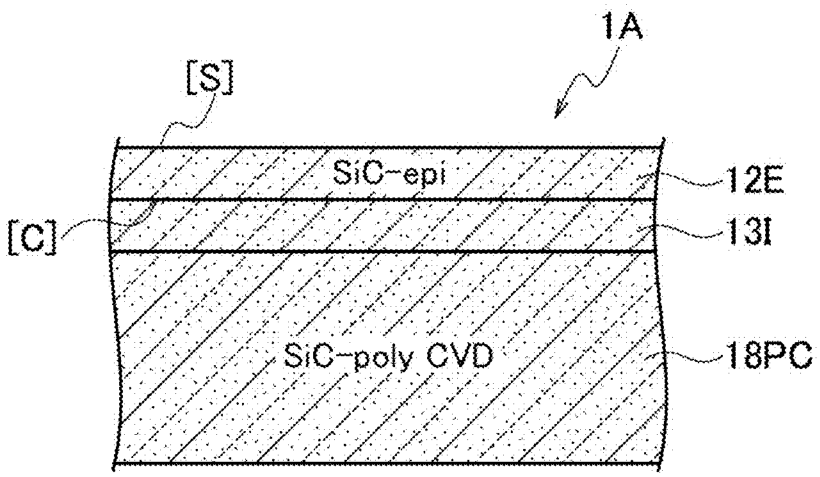
FIG. 2 illustrates a cross-sectional diagram of an SiC epitaxial wafer according to a second embodiment.

FIG. 2 illustrates a cross-sectional diagram of an SiC epitaxial wafer 1A according to the second embodiment.

As illustrated in FIG. 2, the SiC epitaxial wafer 1A according to the second embodiment includes: a hexagonal SiC single crystal layer 131; an SiC epitaxial growth layer 12E disposed on an Si plane of the SiC single crystal layer 131; and an SiC polycrystalline growth layer 18PC disposed on a C plane opposite to the Si plane of the SiC single crystal layer 131.

Details of the fabrication method of the SiC epitaxial wafer 1A according to the second embodiment will be described below (refer to FIGS. 21 to 31).

(Fabricating Apparatus of SiC Epitaxial Wafer)

Figure 3:
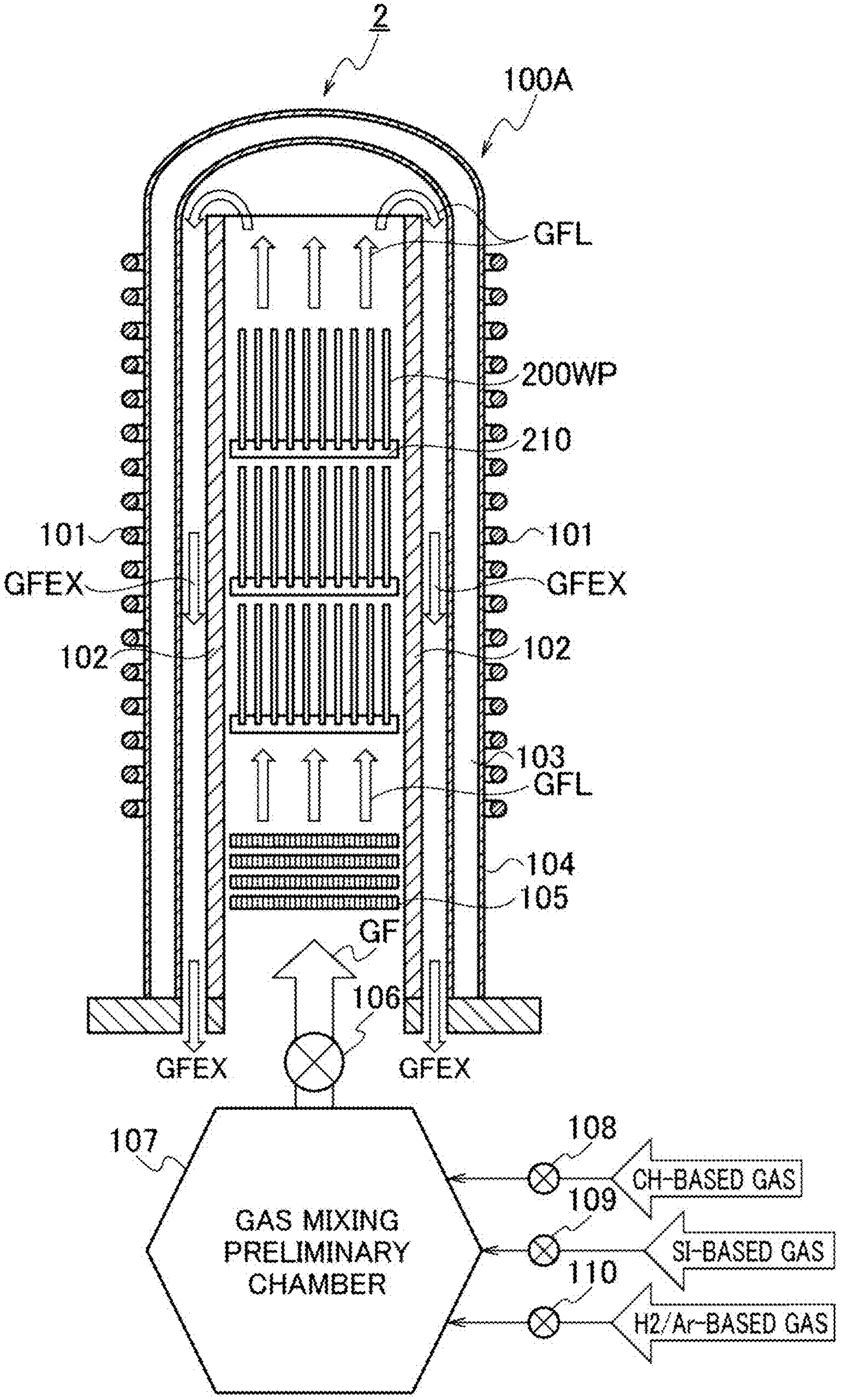
FIG. 3 illustrates a cross-sectional diagram of a fabricating apparatus of an SiC epitaxial wafer according to the embodiments.

FIG. 3 illustrates a schematic cross-sectional structure diagram of a fabricating apparatus 2 of an SiC epitaxial wafer according to the embodiments.

As illustrated in FIG. 3, the fabricating apparatus 2 of the SiC epitaxial wafer according to the embodiments includes: a growth furnace 100A; a gas mixing preliminary chamber 107 disposed outside the growth furnace 100A and configured to mix carrier gas and/or material gas and to regulate a pressure thereof; a wafer boat 210 configured so that SiC wafer pairs 200WP, in which two substrates each having an SiC single crystal in contact with each other in a back-to-back manner, are disposed at equal intervals with a gap therebetween; and a heating unit 101 configured to heat the wafer boat 210 disposed in the growth furnace 100A to an epitaxial growth temperature TG.

The carrier gas and/or the material gas are introduced into the growth furnace 100A after preliminarily being mixed and pressure-regulated in the gas mixing preliminary chamber 107 to grow an SiC layer on a surface of each of the plurality of SiC wafer pairs 200WP. In the embodiments, one of the SiC wafer pair may be composed of an SiC wafer and the other may be composed of a dummy substrate.

As illustrated in FIG. 3, the growth furnace 100A includes an inner tube 102 and an outer tube 104, and has a configuration of a vertical-structured double-tube furnace hot-wall type Low Pressure Chemical Vapor Deposition (LP-CVD) apparatus. The inner tube 102 is formed of graphite or the like. The outer tube 104 is formed of silica or the like. A heat insulating material 103 is disposed between the inner tube 102 and the outer tube 104.

The wafer boat 210 is disposed near the center of the inside the inner tube 102 in the growth furnace 100A, as illustrated in FIG. 3.

The substrate may include the hexagonal SiC epitaxial growth layer 12RE as illustrated in FIG. 1, and the SiC layer may include the SiC polycrystalline growth layer 18PC formed on the C plane of the SiC epitaxial growth layer 12RE.

Alternatively, as illustrated in FIG. 2, the substrate may include a hexagonal SiC single crystal layer 131 and the SiC epitaxial growth layer 12E disposed on the Si plane of the SiC single crystal layer 131, and the SiC layer may include the SiC polycrystalline growth layer 18PC disposed on the C plane opposite to the Si plane of SiC single crystal layer 131.

Figure 12A:
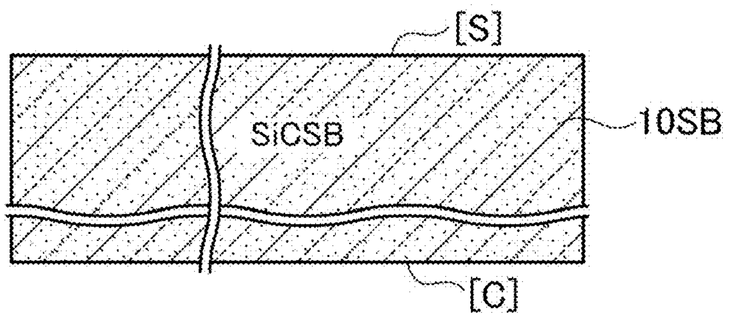
FIG. 12A illustrates a fabrication method of an SiC epitaxial wafer according to the first embodiment, which illustrates a cross-sectional diagram of an SiC single crystal substrate.
Figure 12B:
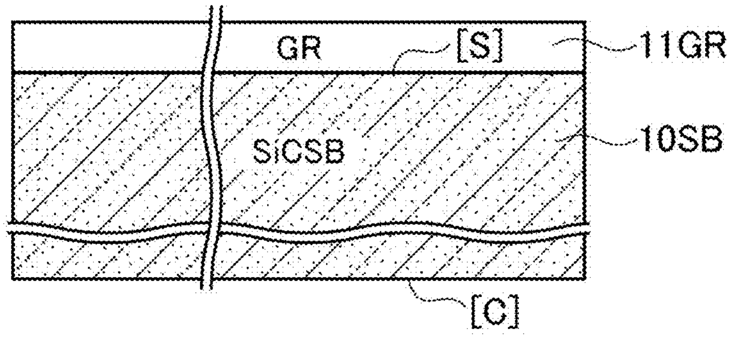
FIG. 12B illustrates the fabrication method of the SiC epitaxial wafer according to the first embodiment, which illustrates a cross-sectional diagram of a structure in which a graphene layer is formed on the SiC single crystal substrate.
Figure 12C:
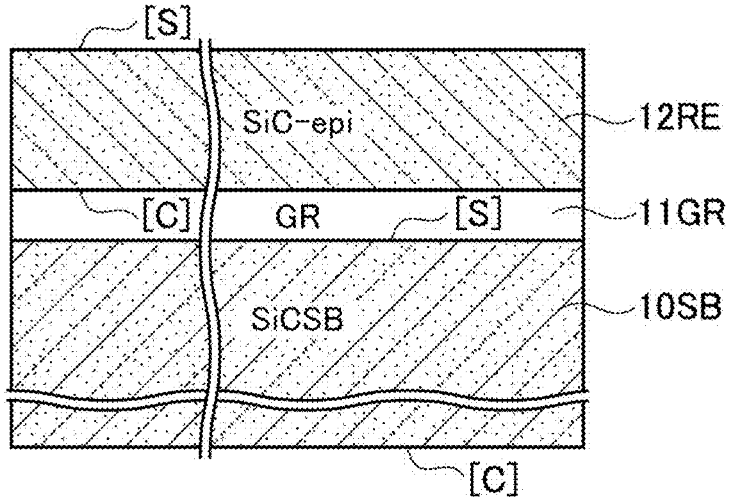
FIG. 12C illustrates the fabrication method of the SiC epitaxial wafer according to the first embodiment, which illustrates a cross-sectional diagram of a structure in which an SiC epitaxial growth layer is formed on the graphene layer.

Alternatively, as illustrated in FIG. 12C described below, the substrate may include an SiC single crystal substrate 10SB and a graphene layer 11GR formed on the SiC single crystal substrate 10SB, and the SiC layer may include an SiC epitaxial growth layer 12RE formed by remote epitaxial growth on the SiC single crystal substrate 10SB via the graphene layer 11GR.

The heating unit 101 can heat the wafer boat 210 to the epitaxial growth temperature TG.

The heating unit 101 includes a high frequency heating coil for induction heating, a resistance heating heater, or a heating lamp for lamp annealing.

A reaction chamber can be raised to the epitaxial growth temperature TG by preheating, in an argon (Ar) atmosphere of 0.9 atm near the atmospheric pressure from 0.1 Torr. The low pressure CVD-SiC remote epitaxial growth can be realized by using the fabricating apparatus 2 according to the first embodiment.

The vacuous gas mixing preliminary chamber 107 is provided at a gas introduction side, and the material gas is mixed with the hydrogen gas in advance before the epitaxial growth.

The wafer boat 210 is made of SiC or made of SiC-coated graphite.

Into the gas mixing preliminary chamber 107, CH-based gas is introduced through a gas control valve 108, Si-based gas is introduced through a gas control valve 109, and $H_2$/Ar-based gas is introduced as carrier gas through a gas control valve 110.

In the embodiments, the Si-based gas contains at least one selected from the group consisting of $SiH_4$, $SiH_3F$, $SiH_2F_2$, $SiHF_3$, and $SiF_4$, for example.

The CH-based gas contains at least one selected from the group consisting of $C_3H_8$, $C_2H_4$, $C_2H_2$, $CF_4$, $C_2F_6$, $C_3F_8$, $C_4F_6$, $C_4F_8$, $C_5F_8$, $CHF_3$, $CH_2F_2$, $CH_3F$, and $C_2HF_5$, for example.

At least one of $N_2$, HCl, and $F_2$, for example, can be applied to the carrier gas other than the $H_2$/Ar-based gas.

Moreover, doping may be performed when forming the SiC epitaxial growth layers 12E, 12RE, and the SiC polycrystalline growth layer 18PC. To the dopant materials at that time, at least one of nitrogen (N), phosphorus (P), and arsenic (As) can be applied, as n type doping impurities, and at least one of boron (B), aluminum (Al), and trimethylaluminum (TMA) can be applied as p type doping impurities.

The carrier gas and/or the material gas is introduced from a lower portion of the growth furnace 100A. When a plurality of SiC wafer pairs 200WP are disposed in the heated wafer boat 210, the gas flows over the surface of the SiC wafer pairs 200WP and rises, reverses the flow direction at an upper portion of the growth furnace 100A and then falls, and then is evacuated from a lower portion of the growth furnace 100A.

When a plurality of SiC wafer pairs 200WP are disposed in the wafer boat 210, it is configured so that the flow of the carrier gas and/or the material gas is in parallel to the substrate surface of the SiC wafer pairs 200WP.

When a mixed gas outlet valve 106 connected to an output side of the gas mixing preliminary chamber 107 is opened, the carrier gas and/or the material gas is introduced into the growth furnace 100A from the lower portion of the growth furnace 100A, as illustrated by the mixed gas flow direction GF.

The carrier gas and/or the material gas introduced into the growth furnace 100A passes through a gas diffusion plate 105 and the gas flow in the apparatus is uniformed.

The carrier gas and/or the material gas flows over the surface of each of the plurality of SiC wafer pairs 200WP disposed in the heated wafer boat 210 and rises as illustrated by the gas flow direction GFL in the apparatus, and then reverses the flow direction at the uppermost portion of the growth furnace 100A and then falls.

Furthermore, the carrier gas and/or the material gas is evacuated from the lowermost portion of the growth furnace 100A, as illustrated by the gas exhaust flow direction GFEX.

In the fabricating apparatus 2 according to the first embodiment, the plurality of SiC wafer pairs 200WP are disposed so that the gas flow is parallel to the substrate surface.

(Fabrication Method of SiC Epitaxial Wafer)

The fabrication method of the SiC epitaxial wafer according to the embodiments includes: disposing a growth furnace 100A; disposing a gas mixing preliminary chamber 107 configured to mix carrier gas and/or material gas and regulate the pressure thereof outside the growth furnace 100A;

preparing an SiC wafer pair 200WP in which two substrates including an SiC single crystal being in contact with each other in a back-to-back manner; disposing a plurality of SiC wafer pairs 200WP at equal intervals with a gap between each other in a wafer boat 210; disposing the wafer boat 210 in the growth furnace 100A; heating the wafer boat 210 to an epitaxial growth temperature TG; introducing carrier gas and/or material gas into the gas mixing preliminary chamber 107; mixing the carrier gas and/or the material gas and regulating the pressure thereof in advance in the gas mixing preliminary chamber 107; introducing the carrier gas and/or the material gas into the growth furnace 100A after mixing and pressure-regulating of the carrier gas and/or the material gas; and growing an SiC layer on a surface of each of the plurality of SiC wafer pairs 200WP.

The carrier gas and/or the material gas is introduced from the lower portion of the growth furnace 100A, flows over the surface of each of the plurality of SiC wafer pairs 200WP disposed in the heated wafer boat 210 and rises, reverses the flow direction at the upper portion of the growth furnace 100A and then falls, and then is evacuated from the lower portion of the growth furnace 100A.

The fabrication method includes flowing inactive gas, such as argon and/or nitrogen, during the period from the start of heating until the growth temperature TG is reached and the growth is started.

The fabrication method includes: mixing the carrier gas and/or the material gas and regulating the pressure thereof to the growth pressure, in the gas mixing preliminary chamber 107; and introducing the mixed gas of the carrier gas and/or the material gas into the gas mixing preliminary chamber 107 at a timing when starting the growth of the SiC layer.

The carrier gas may be hydrogen and/or argon and/or nitrogen gas. Moreover, the material gas supplied with the carrier gas during the growth of the SiC layer may be at least one selected by the group consisting of silicon hydride, halide, halogen hydride gas, and hydrocarbon gas.

When introducing the mixed gas of the carrier gas and/or the material gas into the growth furnace 100A, there may be adjusting the growth pressure and/or the carrier gas and the material gas partial pressure ratio, in accordance with the epitaxial growth temperature, to suppress a variation of the layer thickness of the graphene layer.

Moreover, there may be included disposing an SiC single crystal substrate 10SB as the substrate in the growth furnace 100A and forming a graphene layer 11GR on the SiC single crystal substrate 10SB by an SiC surface thermal decomposition method; and forming an SiC epitaxial growth layer 12RE on the graphene layer 11GR. The step of forming the graphene layer 11GR and the step of forming the SiC epitaxial growth layer 12E may be continuously performed in the same growth furnace 100A.

The material gas may contain Si-based gas of at least one selected from the group consisting of $SiH_4$, $SiH_3F$, $SiH_2F_2$, $SiHF_3$, and $SiF_4$.

Alternatively, the material gas may contain CH-based gas of at least one selected from the group consisting of $C_3H_8$, $C_2H_4$, $C_2H_2$, $CF_4$, $C_2F_6$, $C_3F_8$, $C_4F_6$, $C_4F_5$, $C_5F_8$, $CHF_3$, $CH_2F_2$, $CH_3F$, and $C_2HF_5$.

Moreover, at least one of $H_2$, Ar, $N_2$, HCl, and $F_2$ can be applied to the carrier gas.

The n type doping impurities used when forming the SiC epitaxial growth layer 12RE and the SiC polycrystalline growth layer 18PC may contain at least one of nitrogen (N), phosphorus (P), and arsenic (As), and the p type doping impurities may contain at least of boron (B), aluminum (Al), and trimethylaluminum (TMA).

In accordance with the fabricating apparatus of the SiC epitaxial wafer according to the embodiments, since it is not necessary to place a gas pipeline in the high temperature atmosphere, the material gas is not thermally decomposed in such a pipeline, and thereby it is possible to suppress a blockade and particles generation in the gas outlet. Moreover, there is no need to have different pipelines for different gas species in order to prevent the blockage of the gas outlet. Since the distance to the substrate can be secured, a distribution of each gas species can be uniformed on the substrate.

In accordance with the fabricating apparatus of the SiC epitaxial wafer according to the embodiments, the distribution of each gas species can be uniformed on the substrate by disposing the wafer vertically, without bringing a gas supplying pipeline in the growth furnace so that the substrate surface is parallel to the gas flow.

In accordance with the fabricating apparatus of the SiC epitaxial wafer according to the embodiments, no gas supply line is brought in the furnace, and all gases are mixed in advance, and thereby unevenness in the gas mixing ratio on the SiC substrate can be suppressed and uniform crystal growth can be realized.

In accordance with the fabricating apparatus of the SiC epitaxial wafer according to the embodiments, many substrates can be processed at once by flowing the gas in the direction from the bottom to the top of the deposition chamber, and by disposing the surface of the plurality of substrates in parallel to the gas flow using the vertical wafer boat.

In the fabricating apparatus of the SiC epitaxial wafer according to the embodiments, although an example of disposing the substrate in parallel to the gas flow is illustrated, when a plurality of substrates are arranged in parallel to the gas flow, there is a tendency to increase a film formation rate and thereby uniformity in substrate surface is excellent.

(Process Steps of Fabricating Apparatus of SiC Epitaxial Wafer)

Process steps to which the fabricating apparatus 2 according to the first embodiment is applied will now be described.

There will be described an example of forming an SiC epitaxial growth layer 12RE by remote epitaxial growth via a graphene layer 11GR after forming the graphene layer 11GR on the Si plane of the SiC single-crystal substrate 10SB.

(A) A wafer boat and substrates are set in the growth furnace 100A and are preheated in a vacuum. The preheating at this time can realize degassing inside the growth furnace 100A.

(B) Next, in anticipation of the temperature drop due to a gas introduction, the preheating is performed at a higher temperature. The preheating at this time can uniform the temperature to the temperature at the time of the hydrogen etching.

(C) Next, hydrogen gas is introduced to etch the SiC substrate surface. By etching the SiC substrate surface, it is possible to clean the surface and stabilize nanofacets.

(D) Next, argon (Ar) gas is introduced under a high vacuum, and the substrate temperature is uniformed at 1500° C. after the pressure thereof is regulated at approximately 0.01 atm.

(E) Next, epitaxial growth of the graphene layer is performed by surface thermal decomposition. In the epitaxial growth of the graphene layer, approximately the buffer layer BL plus one layer is targeted by time control.

(F) Next, the introduction of the argon (Ar) gas is stopped and the temperature is re-uniformed to approximately 1600°

C. plus alpha (+α) in consideration the amount of gas introduction temperature drop under the high vacuum. In this case, α is determined in accordance with growth conditions.

(G) Next, the mixed gas of the carrier gas and/or the material gas is introduced rapidly from the gas mixing preliminary chamber 107 to be pressure-regulated to perform the remote epitaxial growth.

In the remote epitaxial growth, for example, an $n^+$ drift layer approximately 10 μm can be formed after forming an $n^{++}$ buffer layer of approximately 1 μm, in the SiC based device. In the formation of the $n^{++}$ buffer layer/$n^+$ drift layer, the remote epitaxial growth can be performed by adjusting gas compositions respectively defined.

(H) The gas system is switched to the Ar gas to complete the remote epitaxial growth.

(I) After slow cooling, the gas system is evacuated through a cooling scavenger, and the wafer boat and the substrates are unloaded.

The present embodiments can provide the SiC epitaxial wafer including the SiC epitaxial growth layer on the SiC polycrystalline growth layer with the same or better quality and lower cost than an SiC single crystal substrate grown by the sublimation method.

The present embodiments can provide the fabricating apparatus of the SiC epitaxial wafer and the fabrication method of the SiC epitaxial wafer, having high quality and capable of reducing costs, using the vertical-structured double-tube furnace hot-wall type LP-CVD apparatus.

The fabricating apparatus of the SiC epitaxial wafer according to the embodiments can perform, in situ as a series of processes, the step of forming the graphene layer 11GR on the SiC single crystal substrate 10SB using the vertical-structured tube type CVD apparatus in which a plurality of SiC single crystal substrates 10SB are disposed with a gap between each other in the deposition chamber; and the step of performing the remote epitaxial growth of the single crystal SiC epitaxial growth layer 12RE on the SiC single crystal substrate 10SB via the graphene layer 11GR. Consequently, it is possible to avoid surface contamination of the graphene layer 11GR. In the series of processes, each step may be individually performed in a dedicated reaction chamber (three chambers connected), in order to avoid an interference with each other's process due to residual gas components caused by hydrogen adsorption to a reaction chamber inner wall during the etching of the SiC substrate surface with high-temperature hydrogen gas, caused by Si deposition on the reaction chamber inner wall due to the Si sublimation generated in the thermal decomposition of SiC surface during the graphene layer formation, or caused by adsorption of the reactive gas used for the single crystal SiC epitaxial growth to a jig or the like in the reaction chamber. At that time, the reaction chambers are connected to each other by a high heat-resistant vacuum transfer chamber so as to make it possible to perform an in-situ process in a vacuum.

Moreover, in the fabricating apparatus of the SiC epitaxial wafer according to the embodiments, the graphene etching rate can be suppressed and change of the number of the graphene layers can be suppressed by heating inside the growth furnace to the epitaxial growth temperature TG in a high pressure atmosphere of argon (Ar).

Moreover, in the fabricating apparatus of the SiC epitaxial wafer according to the embodiments, by mixing the material gas with the hydrogen gas in advance and controlling the supply timing to perform simultaneously flowing, the time lag from the introduction of the hydrogen gas to the start of the epitaxial growth can be reduced to zero and graphene etching can be avoided.

(Structure of Wafer Boat and Arraying Method of SiC Substrate)

Figure 4A:
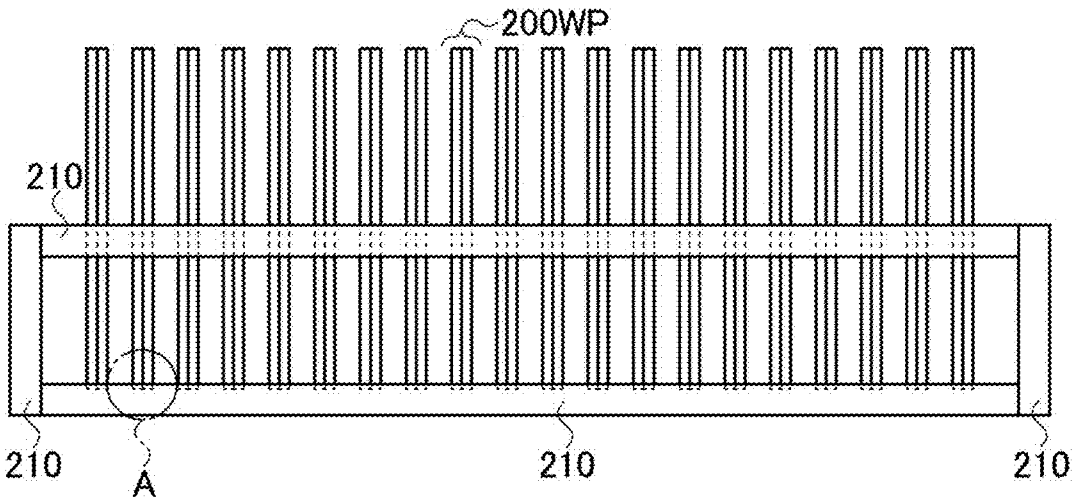
FIG. 4A illustrates a structure of a wafer boat applied to the fabricating apparatus of the SiC epitaxial wafer according to the embodiments, which illustrates a side view diagram in a first direction thereof.
Figure 4B:
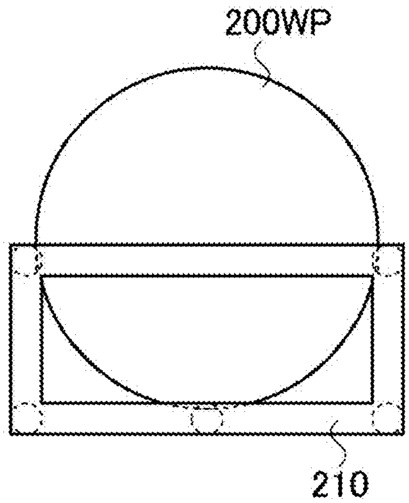
FIG. 4B illustrates the structure of the wafer boat applied to the fabricating apparatus of the SiC epitaxial wafer according to the embodiments, which illustrates a side view diagram in a second direction thereof.
Figure 4C:
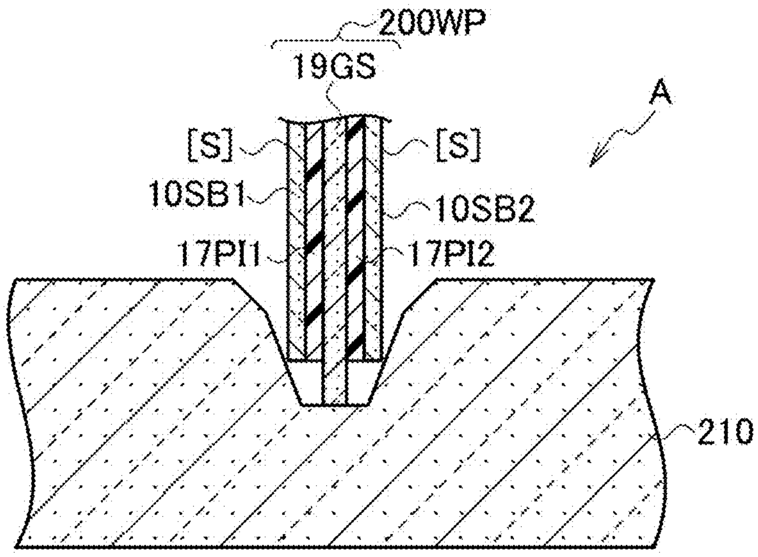
FIG. 4C illustrates the structure of the wafer boat applied to the fabricating apparatus of the SiC epitaxial wafer according to the embodiments, which illustrates an enlarged view of a groove portion A.

FIG. 4 illustrates a structure of a wafer boat 210 applied to the fabricating apparatus according to the embodiments. FIG. 4A illustrates a side view diagram in a first direction, FIG. 4B illustrates a side view diagram in a second direction, and FIG. 4C illustrates an enlarged view of the groove portion A.

As illustrated in FIG. 4A, a plurality of SiC wafer pairs 200WP arranged with a constant gap between each other. One pair (one SiC wafer pair 200WP) is constituted of two single crystal SiC wafers in contact with each other in a back-to-back manner.

As illustrated in FIGS. 4B and 4C, the plurality of SiC wafer pairs 200WP are respectively inserted into grooves of a support of the wafer boat 210, and are respectively supported at three points by edges of the SiC wafer pairs 200WP.

As illustrated in FIG. 4C, the SiC wafer pair 200WP includes a structure example of bonding the SiC single crystal substrates 10SB1 and 10SB2 respectively via bonding layers 17PI and 17P2 on a graphite substrate 19GS. The Si plane of each SiC single crystal substrates 10SB1 and 10SB2 is exposed to the gas atmosphere. The SiC wafer pair 200WP illustrated in FIG. 4C corresponds to an example of forming the graphene layer and forming the remote epitaxial growth layer in the same growth furnace 100A. When the graphite substrate 19GS having an outside size larger by one size than the SiC single crystal substrates 10SB1, 10SB2 is inserted into a wafer boat groove of a batch-type vertical CVD furnace to be aligned, there is an advantage that a trace of a wafer boat support is outside a substrate effective area.

(Another Fabricating Apparatus of SiC Epitaxial Wafer)

Figure 5:
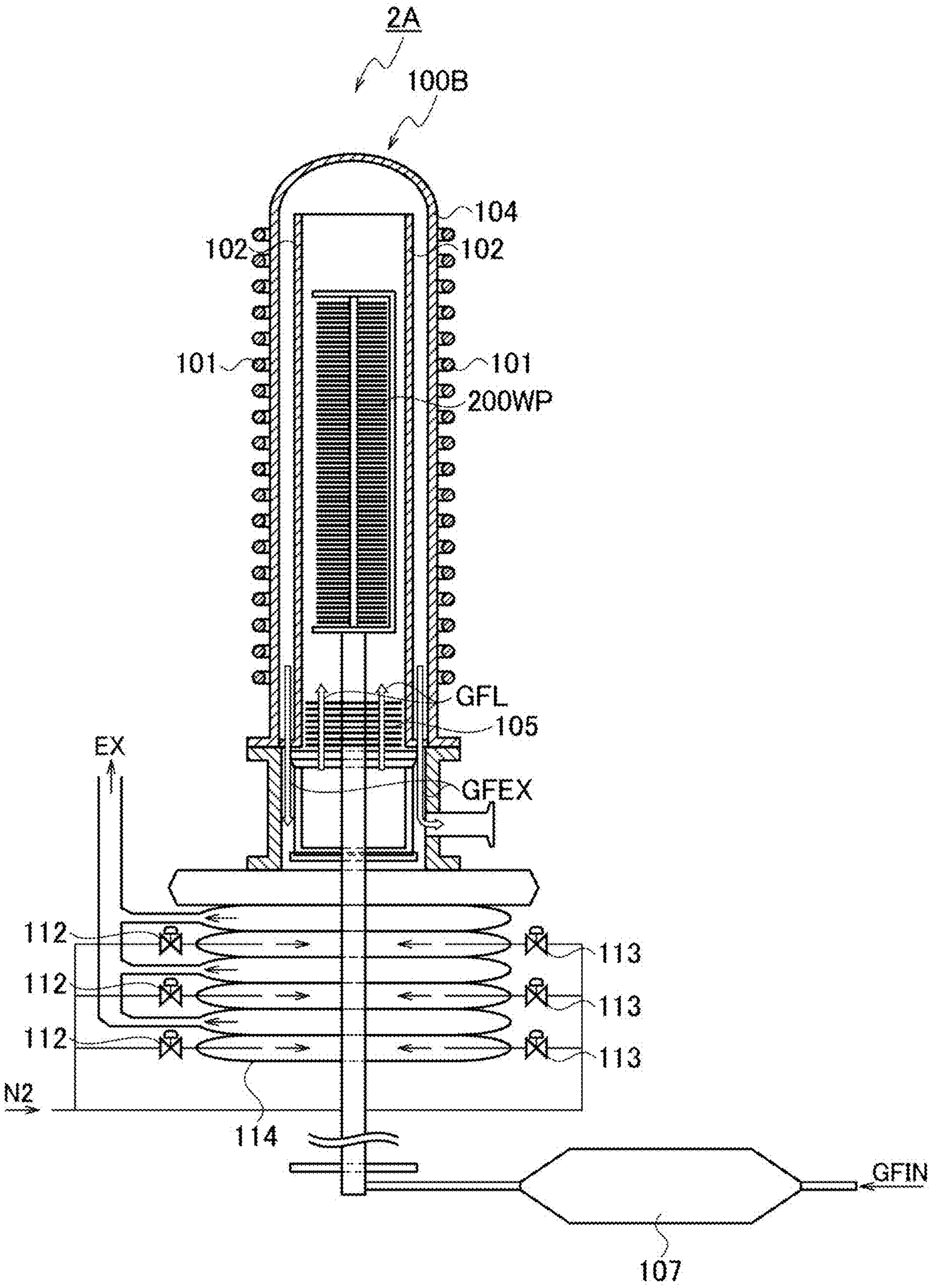
FIG. 5 illustrates a cross-sectional diagram of another fabricating apparatus of the SiC epitaxial wafer according to embodiments.

FIG. 5 illustrates a cross-sectional diagram of a fabricating apparatus 2A of the SiC epitaxial wafer according to the embodiments. In the SiC epitaxial wafer fabricating apparatus 2A, a plurality of SiC wafer pairs 200WP are disposed so that a gas flow and substrate surfaces are substantially perpendicular to each other.

As illustrated in FIG. 5, the fabricating apparatus 2A of the SiC epitaxial wafer according to the embodiments includes: a growth furnace 100B; a gas mixing preliminary chamber 107 disposed outside the growth furnace 100B and configured to mix carrier gas and/or material gas and to regulate a pressure thereof; a wafer boat 210 configured so that a plurality of SiC wafer pairs 200WP, in which two substrates each having an SiC single crystal in contact with each other in a back-to-back manner, are disposed at equal intervals with a gap therebetween; and a heating unit 101 configured to heat the wafer boat 210 disposed in the growth furnace 100B to an epitaxial growth temperature TG.

The carrier gas and/or the material gas is introduced into the gas mixing preliminary chamber 107 through a gas input GFIN. An exhaust cooling apparatus (cooling scavenger) 114 is disposed in the gas exhaust system, the $N_2$ gas is introduced through gas exhaust valves 112 and 113, and gas exhaust EX is made together with the $N_2$ gas. The rest of the configurations and the rest of the operational method are the same as those of the fabricating apparatus 2 of the SiC epitaxial wafer according to the embodiments illustrated in FIG. 3.

The carrier gas and/or the material gas are introduced from a lower portion of the growth furnace 100A. When a plurality of SiC wafer pairs 200WP are disposed in the heated wafer boat 210, the gas flows over the surface of the SiC wafer pairs 200WP and rises, reverses the flow direction at an upper portion of the growth furnace 100A and then falls, and then is evacuated from a lower portion of the growth furnace 100A.

Moreover, it is configured so that, when a plurality of SiC wafer pairs 200WP are disposed in the wafer boat 210, the flow of the carrier gas and/or the material gas is perpendicular to the substrate surface of the SiC wafer pairs 200WP.

When the plurality of substrates are arranged so as to be substantially perpendicular to the gas flow, the film formation rate tends to be smaller, but the number of substrates can be increased and throughput can also be increased, compared with the parallel arrangement.

Figure 6A:
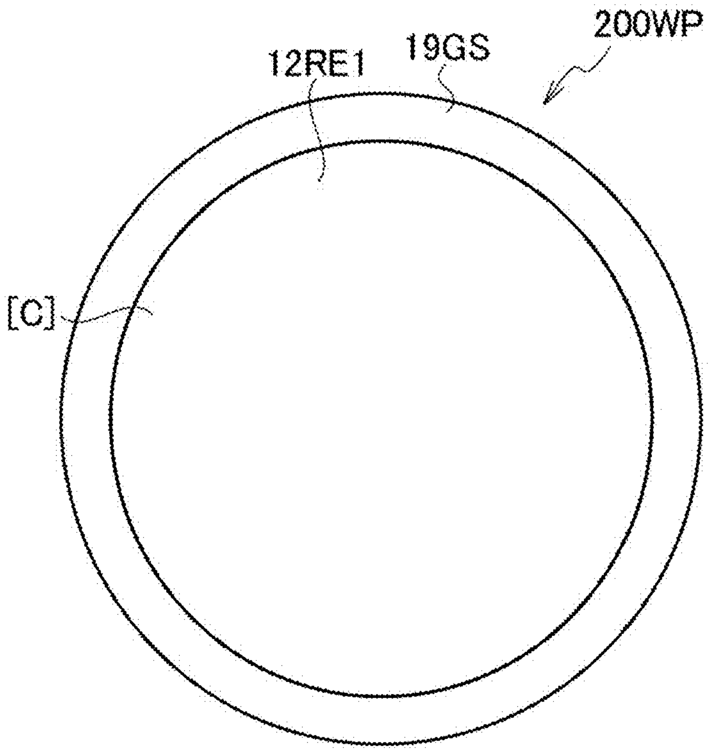
FIG. 6A illustrates a front view diagram in a state where SiC epitaxial layers are bonded and transferred to both surfaces of a graphite substrate.
Figure 6B:
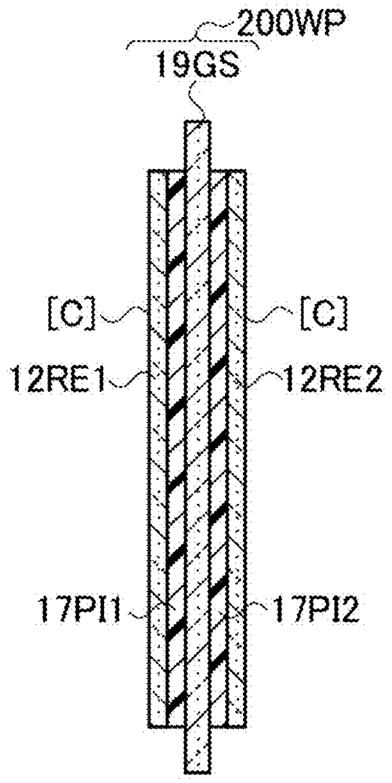
FIG. 6B illustrates a side view diagram in the state where the SiC epitaxial layers are bonded and transferred to both surfaces of the graphite substrate.

FIG. 6A illustrates a front view diagram in a state where the SiC epitaxial layers 12RE1 and 12RE2 are respectively bonded and transfer to the surface and the back surface of the graphite substrate 19GS. FIG. 6B illustrates a side view diagram in the state where the SiC epitaxial layers 12RE1 and 12RE2 are respectively bonded and transfer to the surface and the back surface of the graphite substrate 19GS. FIGS. 6A and 6B illustrate a practical example of disposing the SiC wafer pair 200WP when performing direct growth of the SiC polycrystalline growth layers 18PC1 and 18PC2 respectively on the epitaxial growth layers 12RE1 and 12RE2 by the CVD method. When the graphite substrate 19GS having an outside size larger by one size than the SiC epitaxial wafer on which the SiC epitaxial layers 12RE1 and 12RE2 are formed is inserted into a wafer boat groove of a batch-type vertical CVD furnace to be aligned, there is an advantage that a trace of a wafer boat support is outside a substrate effective area.

(Example of Process Sequence)

Figure 7:
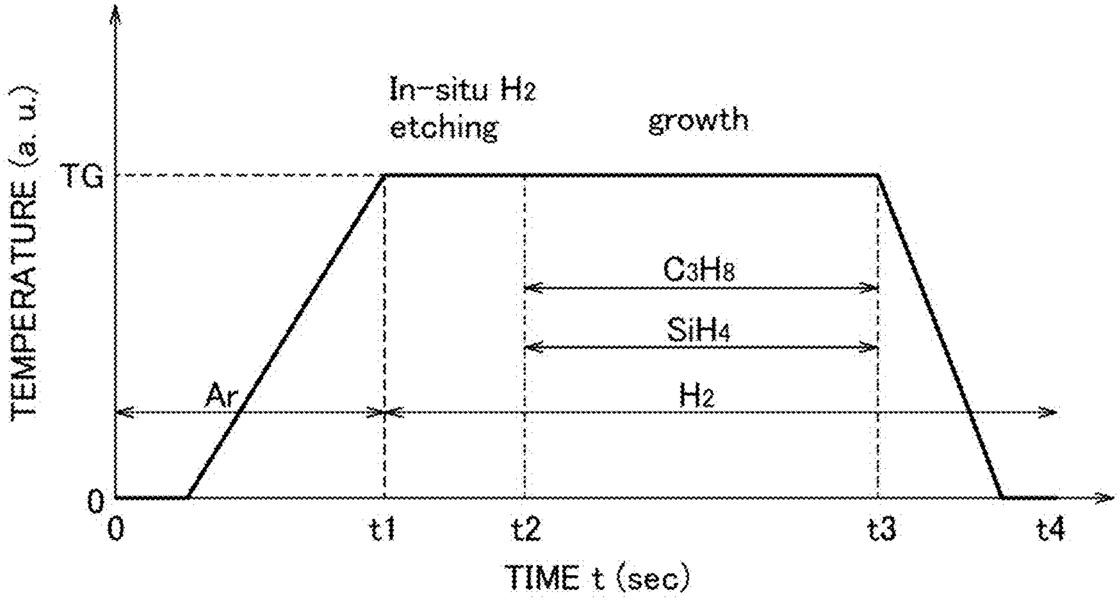
FIG. 7 illustrates a process sequence of graphene etching, graphene growth, and SiC epitaxial growth in the fabricating apparatus of the SiC epitaxial wafer according to the embodiments.

FIG. 7 illustrates a process sequence of graphene etching, graphene growth, and SiC epitaxial growth, in the fabricating apparatus according to the embodiments.

In a 4H-SiC slightly inclined substrate, polishing damage to a substrate surface is eliminated, before the epitaxial growth, by using etching through a reaction between high-temperature hydrogen and SiC. Conditions for the hydrogen etching are substrate temperature of 1600° C., growth pressure of 250 mbar, hydrogen flow rate of 40 slm, and hydrogen etching time of 3 minutes. The amount of etching in this case is of nanometer order. Subsequently, the epitaxial growth is performed by supplying $SiH_4$ and $C_3H_8$ which are material gas. Growth conditions are epitaxial growth temperature TG=1600° C., growth pressure of 250 mbar, and $SiH_4$ flow rate of 6.67 sccm.

(Conditions of Graphene Etching and Graphitization)

Control of the thickness of the graphene layer on the SiC single crystal substrate will now be described below, in remote epitaxial growth via the graphene layer.

The temperature at which graphitization occurs on an SiC substrate is equal to or higher than 1300° C. However, the temperature at which Si sublimates from the SiC substrate varies in accordance with pressure or surface states. Therefore, the graphitization temperature also varies in accordance with the pressure or surface state.

Figure 8:
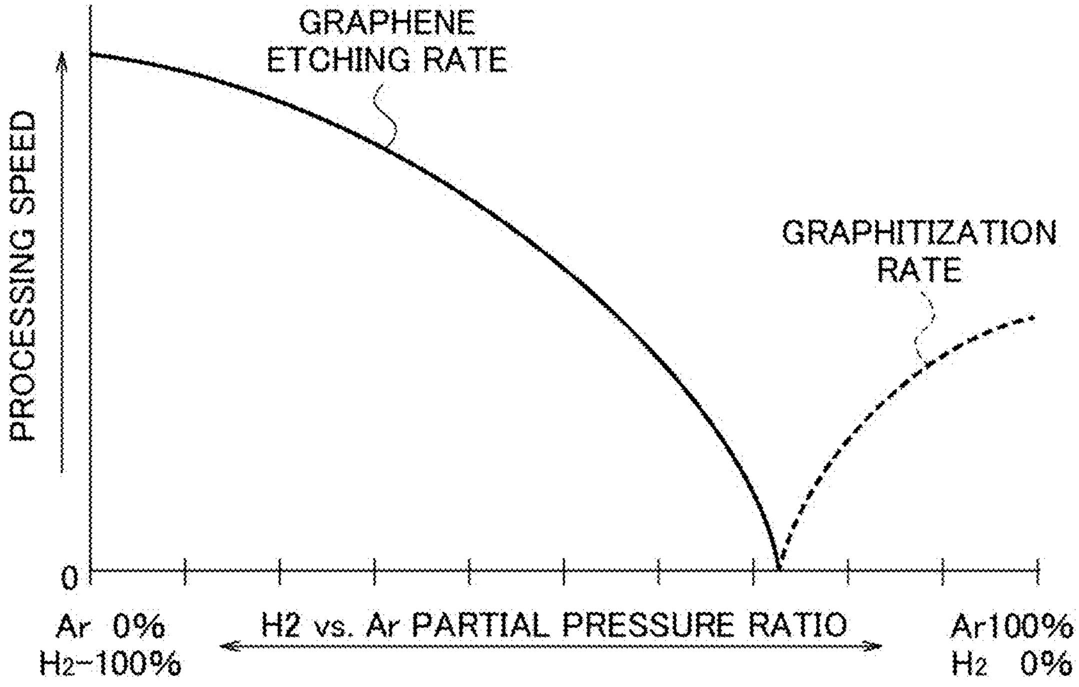
FIG. 8 is an explanatory diagram of graphene etching and graphene growth, which illustrates a relationship between a processing speed and a hydrogen/argon partial pressure ratio, in the fabricating apparatus of the SiC epitaxial wafer according to the embodiments.

FIG. 8 is an explanatory diagram of graphene etching and graphene growth, which illustrates a relationship between a processing speed and a hydrogen/argon partial pressure ratio, in the fabricating apparatus according to the embodiments.

Figures 9, 10:
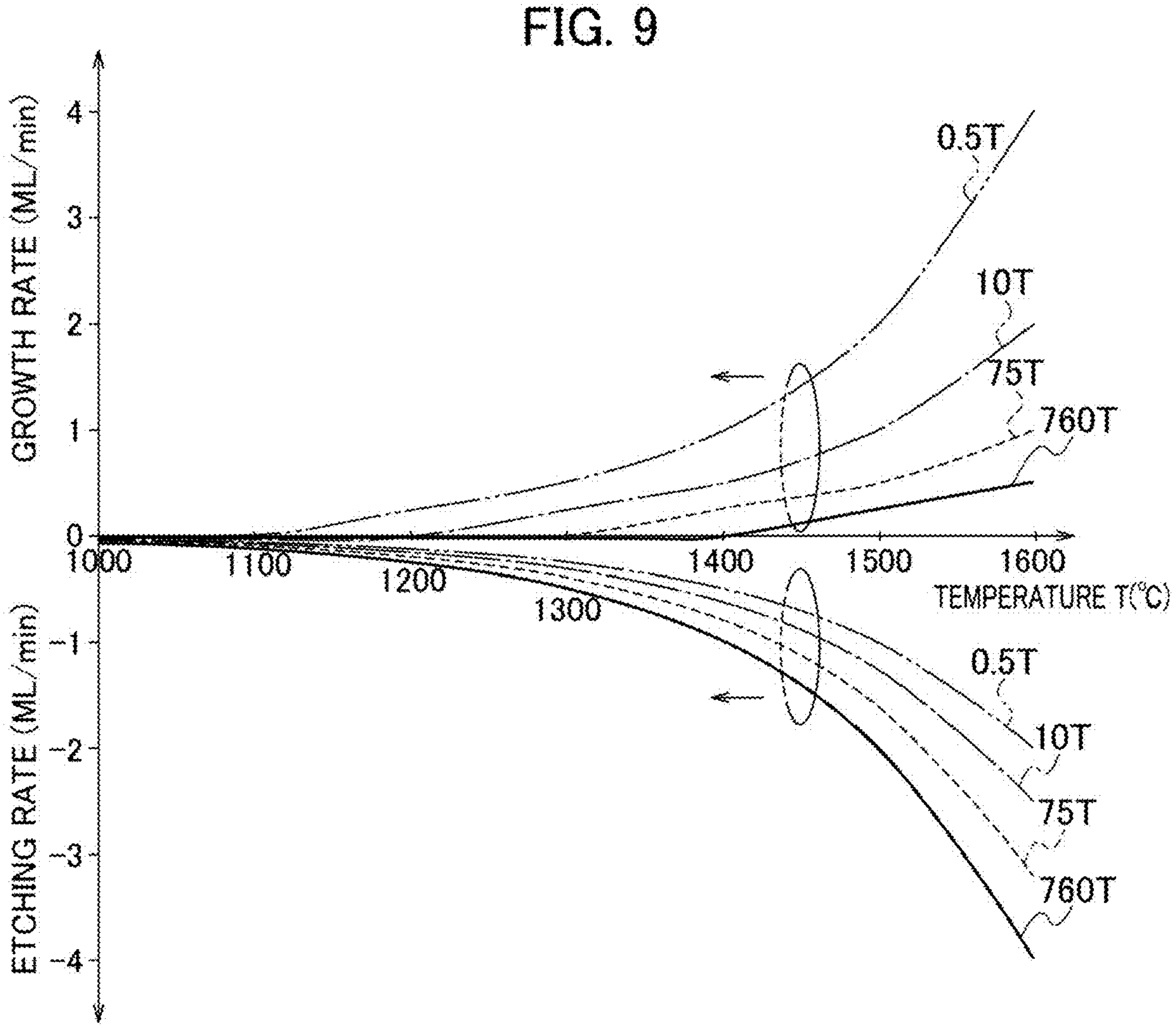
FIG. 9 is an explanatory diagram of graphene etching and graphene growth, which illustrates temperature dependency of a growth rate and an etching rate with a pressure a parameter, in the fabricating apparatus according to the embodiments.
FIG. 10 illustrates an explanatory diagram of a vapor phase of graphene etching, graphene growth, and SiC epitaxial at 1600° C., and an operation of hydrogen and argon on an SiC surface, in the fabricating apparatus according to the embodiments.

FIG. 9 is an explanatory diagram of graphene etching and graphene growth, which illustrates temperature dependency of a graphene growth rate and a graphene etching rate with a pressure a parameter, in the fabricating apparatus according to the embodiments. Supplying gas flow rate=$H_2$:Ar:$SiH_4$:$C_3H_8$=7:400:2:2.

The graphitization proceeds at 1600 to 1650° C. or higher under Ar flow of 1 atm, or at 1150 to 1400° C. or higher under a high vacuum. For example, the graphitization proceeds under 1500 to 1600° C./0.5 Torr vacuum. Immediately before the start of the remote epitaxial growth, the graphene etching proceeds with $H_2$ flow, and the graphitization proceeds with full Ar flow.

(Boundary between Graphene Etching and Graphitization)

There is an event boundary between the graphene etching and the graphitization. In SiC homoepitaxial growth, hydrogen etching is performed in situ immediately before the start of the epitaxial growth in many cases. In such a high temperature $H_2$ atmosphere, since both Si and C are etched, the etching predominantly proceeds rather than the graphitization. When Ar is flowed instead of $H_2$, the graphitization usually proceeds.

Immediately before the start of the remote epitaxial growth, the graphene etching proceeds in the case of $H_2$ flow, and the graphitization proceeds in the case of Ar flow. At 1500 to 1600° C., there is a boundary between these two events. Since the factors which influence two events are $H_2$ and Ar, there is a boundary somewhere in the partial pressure ratios of $H_2$ and Ar where the layer thickness of the graphene does not apparently vary.

(SiC Surface Reaction)

Figure 11:
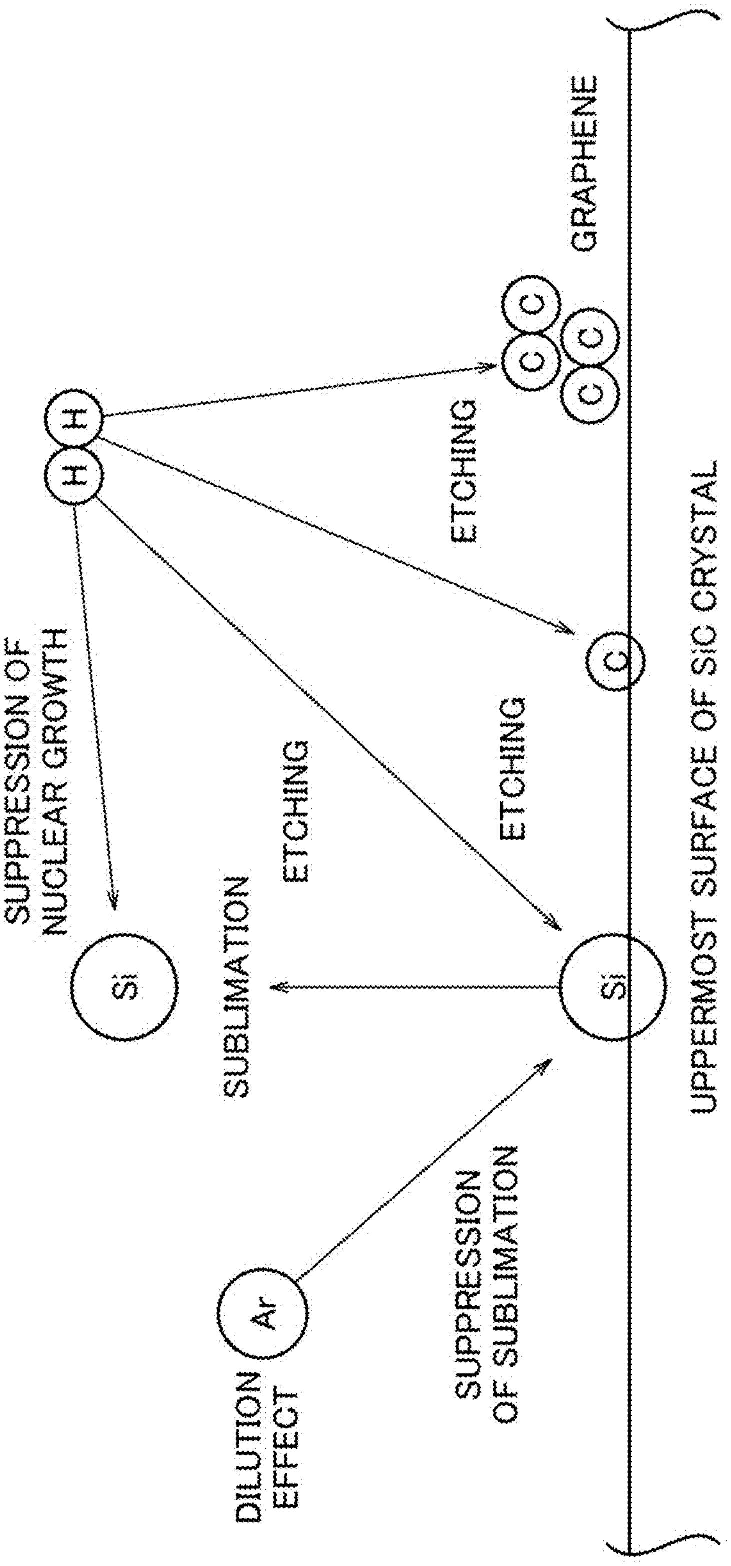
FIG. 11 illustrates a schematic explanatory diagram of the vapor phase of the graphene etching, the graphene growth, and the SiC epitaxial at 1600° C., and the operation of hydrogen and argon on the SiC surface, in the fabricating apparatus according to the embodiments.

FIG. 10 illustrates an explanatory diagram of a vapor phase of graphene etching, graphene growth, and SiC epitaxial at 1600° C., and an operation of hydrogen and argon on an SiC surface, in the fabricating apparatus according to the embodiments. FIG. 11 illustrates a schematic explanatory diagram of the vapor phase of the graphene etching, the graphene growth, and the SiC epitaxial at 1600° C., and the operation of hydrogen and argon on the SiC surface, in the fabricating apparatus according to the embodiments.

For a 4H-SiC (0001) substrate, the following three surface reactions are assumed at 1600° C. in a vacuum.

(a) $H_2$ Etching of SiC ($H_2$ Flow)

Si sublimates selectively from a step of the SiC surface. The sublimation rate differs depending on the $H_2$ partial pressure. The sublimated Si reacts with H/$H_2$ to form an SiH compound with a high vapor pressure.

Although concentration of carbon (C) on the SiC surface increases, adsorbed H/$H_2$ and C react on the surface to form a CH compound and desorb.

The above reaction is repeated and $H_2$ etching proceeds on the SiC surface. The surface structure is reconstructed due to adsorption induction of hydrogen onto SiC.

(b) $H_2$ Etching of Graphene ($H_2$ Flow)

Polycrystalline graphene adsorbs/reacts with H/$H_2$ at the grain boundary end portion to form a CH compound and desorbs.

The graphene buffer layer (GBL) becomes graphene when H/$H_2$ infiltrates from a grain boundary or a defective portion and bonding with the SiC substrate is cut by intercalation. The, reaction/desorption occurs in the same manner as described above.

All graphene is etched as described above and then the above (a) $H_2$ etching of SiC proceeds.

(c) Graphitization (Ar Flow)

Si selectively sublimates from the SiC surface. The sublimation rate differs depending on the Ar partial pressure.

The concentration of carbon (C) on the SiC surface increases. Since C does not sublimate at this temperature and does not react with Ar, it stays on the SiC surface.

C on the surface is epitaxially grown two-dimensionally to form graphene.

(SiC Surface Reaction Before and After Event Boundary)

—In the Case of Full $H_2$ or Full Ar—

It is assumed that when the total flow rate (partial pressure) of $H_2$ and Ar is constant, the Si sublimation rate of from SiC is also constant.

In a case of a bare-SiC substrate, hydrogen etching predominantly proceeds if it is 100% $H_2$. Graphitization predominantly proceeds if it is 100% Ar. For example, it grows up to about the buffer layer BL+graphene molecular layers G2 to G3.

When the graphene layer is formed on the SiC substrate, etching of the graphene layer predominantly proceeds if it is 100% $H_2$, and the graphitization predominantly proceeds if it is 100% Ar. For example, it grows up to about the buffer layer BL+graphene molecular layers G2 to G3.

—In the Case of $H_2$/Ar Mixture Ratio Before and After Event Boundary—

In the case of the bare-SiC substrate, graphitization does not proceed if it is X % $H_2$, where Si sublimation and residual C generation are in chemical equilibrium. In this case, the graphitization rate can be controlled in accordance with the hydrogen ratio. However, after the graphene layer is formed, graphene etching predominates unless the hydrogen is set to the following Y %. If the hydrogen ratio is X>Y, for example, if X=1.5Y, the difference of 0.5Y is the amount of $H_2$ that reacts with Si.

When the graphene layer is formed on the SiC substrate, if it is Y % $H_2$, where the graphene etching and the graphitization proceed at the same rate, nothing apparently happens (where Y is a known value). This condition is a condition which neither graphene etching nor graphitization nor Graphitization occurs.

In the remote epitaxial growth performed on the graphene layer, the number of graphene layers can be controlled by offsetting graphene etching with high-temperature hydrogen and graphene growth with argon atmosphere, immediately before the start of the epitaxial growth.

It is found that there is a boundary between both events, and that there are conditions under which the graphene etching rate and graphene growth rate are balanced by optimizing the mixture ratio of $H_2$ and Ar.

It is to be noted that factors except for the above-described factors, such as inhibition of graphene growth due to residual gas, Si nucleus growth, and the like, may also affect, it is necessary to also consider the factors in setting of apparatus environment and conditions.

The present embodiment uses the vertical-structured tube type CVD apparatus in which the plurality of SiC single crystal substrates 10SB are arranged in the chamber with a gap between each other, to perform the remote epitaxial growth of the single crystal SiC epitaxial growth layer 12RE on the graphene layer 11GR formed on the SiC single crystal substrate 10SB via the graphene layer 11GR.

The present embodiment uses the vertical-structured tube type CVD apparatus in which the plurality of substrates provided with SiC epitaxial growth layers 12E are arranged in the chamber with a gap between each other, to grown the SiC polycrystalline growth layer 18PC on the SiC epitaxial growth layer 12E. The following effects can be obtained.

(1) In the remote epitaxial growth for forming the single crystal SiC epitaxial growth layer 12RE on the graphene layer 11GR formed on the SiC single crystal substrate 10SB via the graphene layer 11GR at the substrate temperature from 1500° C. to 1650° C., it is possible to obtain the effect of suppressing the change in the graphene layer thickness from rising of substrate temperature until just before the start of the SiC remote epitaxial growth to be controlled to 1 to 3 molecular layers required for the SiC remote epitaxial growth, due to the graphene etching caused by activation of hydrogen compounds (including hydrogen molecules and atoms) and halogenated compounds (including simple halogen) produced by decomposition of the hydrogen gas and the material gas used for the carrier gas at high temperature of 1000° C. or higher, or due to the graphene epitaxial growth caused by the Si sublimation (SiC substrate surface is thermally decomposed) from the surface of the SiC single crystal substrate 10SB at 1300° C. or higher.

(2) In the direct growth of the SiC polycrystalline growth layer 18PC performed on the epitaxial growth layer 12E by the CVD method, it is possible to obtain the effect of reducing the fabricating cost by growing the SiC polycrystalline growth layer 18PC uniformly and with a predetermined thickness on the substrates provided with the plurality of SiC epitaxial growth layers 12E.

In accordance with the present embodiment, in the SiC epitaxial wafer including the SiC epitaxial growth layer formed on the SiC polycrystalline growth layer, there can be provided the fabricating apparatus of the SiC epitaxial wafer and the fabrication method of the SiC epitaxial wafer, having high quality equal to or higher than the SiC single crystal substrate grown by the sublimation method and capable of reducing costs.

First Embodiment (SiC Epitaxial Wafer)

Figure 13A:
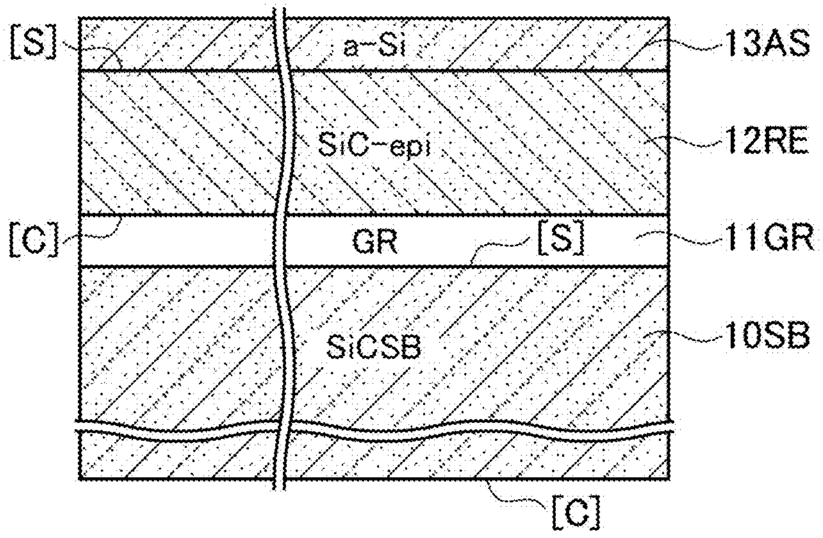
FIG. 13A illustrates the fabrication method of the SiC epitaxial wafer according to the first embodiment, which illustrates a cross-sectional diagram of a structure in which an amorphous Si layer is formed on the SiC epitaxial growth layer.
Figure 13B:
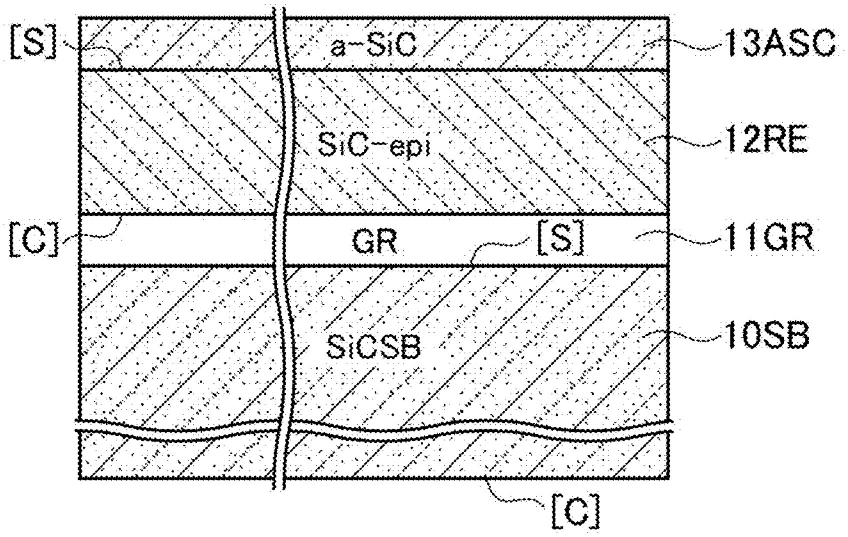
FIG. 13B illustrates the fabrication method of the SiC epitaxial wafer according to the first embodiment, which illustrates a cross-sectional diagram of a structure in which an amorphous SiC layer is formed on the SiC epitaxial growth layer.

As illustrated in FIG. 13A or 13B, an SiC epitaxial wafer 1 according to the first embodiment includes: an SiC single crystal substrate (SiCSB) 10SB; a graphene layer (GR)11GR disposed on an Si plane of the SiC single crystal substrate 10SB; an SiC epitaxial growth layer (SiC-epi) 12RE disposed above the SiC single crystal substrate 10SB via a graphene layer 11GR; and an amorphous layer disposed on the Si plane of the SiC epitaxial growth layer 12RE.

Here, the amorphous layer includes an amorphous Si layer (a-Si) 13AS or an amorphous SiC layer (a-SiC) 13ASC. Alternatively, it may include a microcrystalline layer of Si instead of the amorphous Si layer 13AS. The microcrystalline layer of Si can be obtained by, for example, applying low-temperature annealing treatment, e.g., approximately 550° C. to approximately 700° C., to the amorphous Si layer 13AS.

Figure 14A:
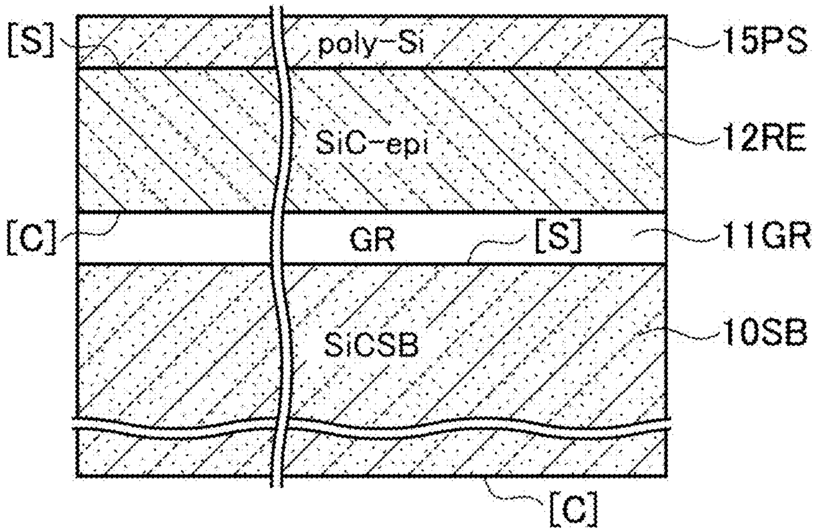
FIG. 14A illustrates the fabrication method of the SiC epitaxial wafer according to the first embodiment, which illustrates a cross-sectional diagram of a structure in which an amorphous Si layer is polycrystallized by annealing treatment and the polycrystalline Si layer is formed on the SiC epitaxial growth layer.
Figure 14B:
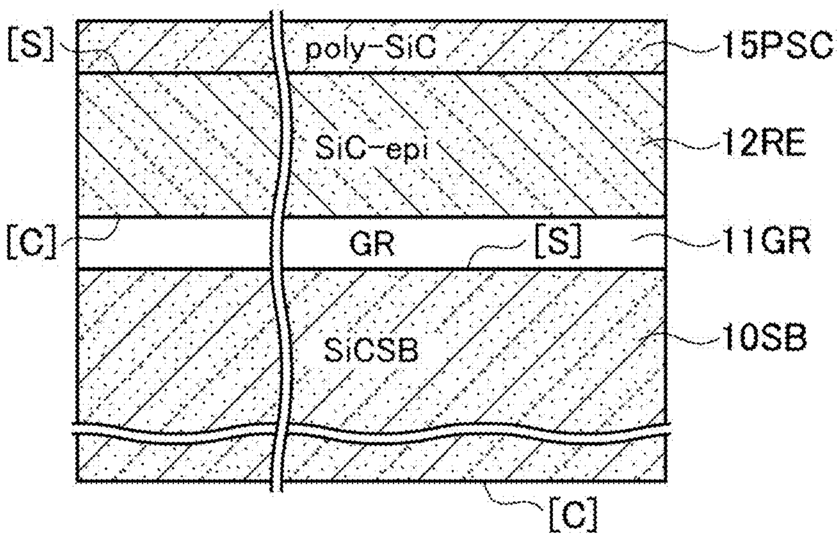
FIG. 14B illustrates the fabrication method of the SiC epitaxial wafer according to the first embodiment, which illustrates a cross-sectional diagram of a structure in which an amorphous SiC layer is polycrystallized by annealing treatment and the polycrystalline SiC layer is formed on the SiC epitaxial growth layer.

Alternatively, as illustrated in FIG. 14A or 14B, the SiC epitaxial wafer according to the first embodiment includes: an SiC single crystal substrate 10SB; a graphene layer 11GR disposed on an Si plane of the SiC single crystal substrate 10SB; an SiC epitaxial growth layer 12RE disposed above the SiC single crystal substrate 10SB via a graphene layer 11GR; and a polycrystalline layer disposed on an Si plane of the SiC epitaxial growth layer 12RE.

Here, the polycrystalline layer includes a polycrystalline Si layer (poly-Si) 15PS or a crystallize SiC layer (poly-SiC) 15PSC. The polycrystalline Si layer (poly-Si) 15PS by, for example, applying medium-temperature annealing treatment (approximately 700° C. to approximately 900° C.,) or applying high-temperature annealing treatment (approximately 900° C. to approximately 1100° C.,) to the amorphous Si layer 13AS.

Figure 15A:
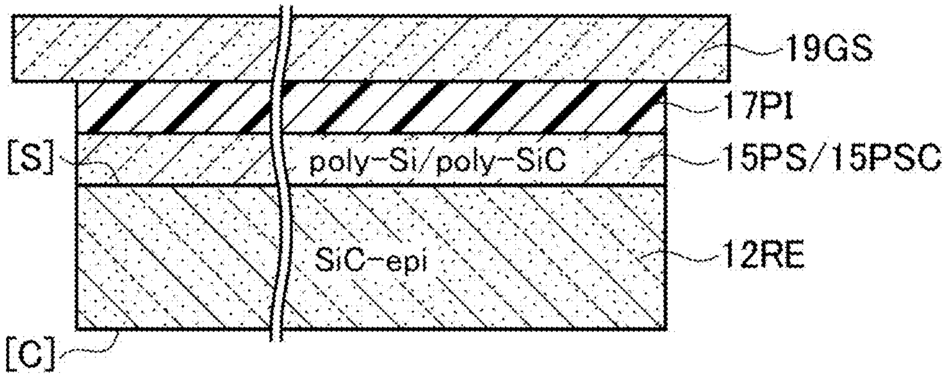
FIG. 15A illustrates the fabrication method of the SiC epitaxial wafer according to the first embodiment, which illustrates a cross-sectional diagram of the SiC epitaxial growth layer side of a structure in which a graphite substrate is bonded via a bonding layer on the polycrystalline Si layer/polycrystalline SiC layer, and the SiC single crystal substrate is removed at an interface between the SiC epitaxial growth layer and the graphene layer.

Alternatively, as illustrated in FIG. 15A, the SiC epitaxial wafer according to the first embodiment includes: an SiC epitaxial growth layer 12RE; a polycrystalline Si layer 15PS or a crystallize SiC layer (poly-SiC) 15PSC disposed on the SiC epitaxial growth layer 12RE; a graphite substrate 19GS disposed on the polycrystalline Si layer 15PS or the crystallize SiC layer (poly-SiC) 15PSC. Here, the graphite substrate 19GS is connected on the polycrystalline Si layer 15PS or the crystallize SiC layer (poly-SiC) 15PSC via a bonding layer 17PI. Alternatively, it may include a silicon substrate instead of the graphite substrate 19GS. In this case, an organic adhesive, such as a polyimide-based adhesive, for example, is used for the bonding layer 17PI.

Figure 16:
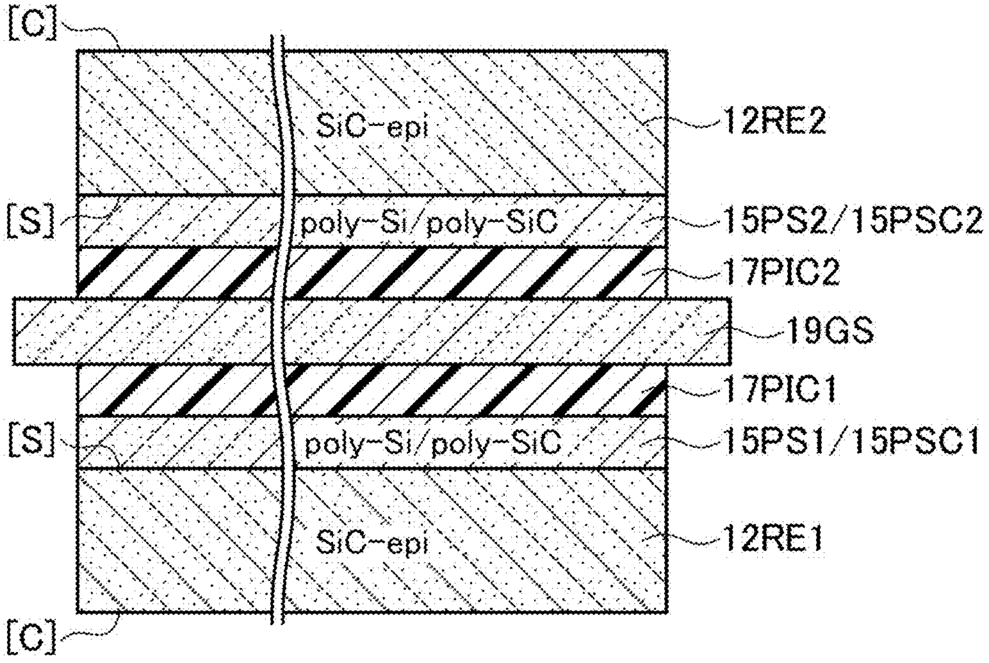
FIG. 16 illustrates the fabrication method of the SiC epitaxial wafer according to the first embodiment, which illustrates a cross-sectional diagram of a structure in which the removed structure illustrated in FIG. 15A is bonded on both surfaces of the graphite substrate and a bonding layer carbonized by annealing treatment is formed.

Moreover, as illustrated in FIG. 16, the SiC epitaxial wafer according to the first embodiment may include a configuration in which an SiC epitaxial wafer structure illustrated in FIG. 15A is disposed on both surfaces of the graphite substrate 19GS.

Figure 17:
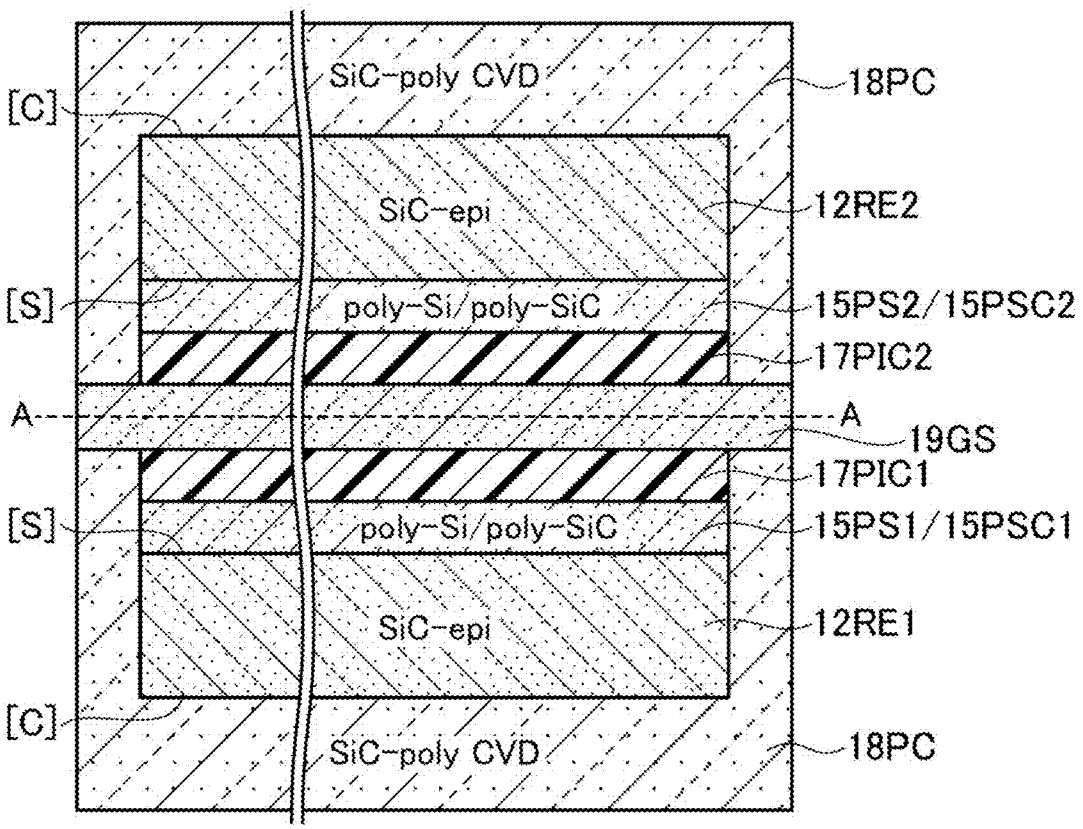
FIG. 17 illustrates the fabrication method of the SiC epitaxial wafer according to the first embodiment, which illustrates a cross-sectional diagram of a structure in which an SiC polycrystalline growth layer is formed by a CVD method and an outer periphery thereof is ground.
Figure 18:
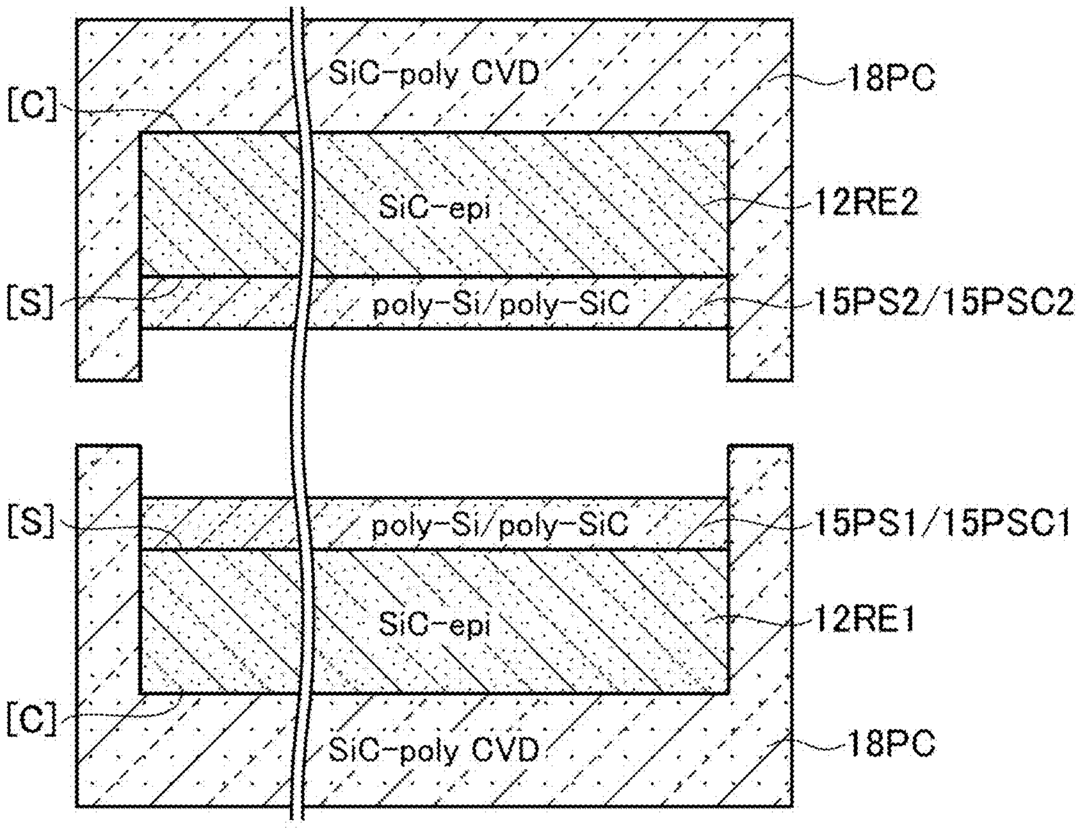
FIG. 18 illustrates the fabrication method of the SiC epitaxial wafer according to the first embodiment, which illustrates a cross-sectional diagram of a structure in which the graphite substrate and the carbonized bonding layer are sublimated by annealing treatment.
Figure 19:
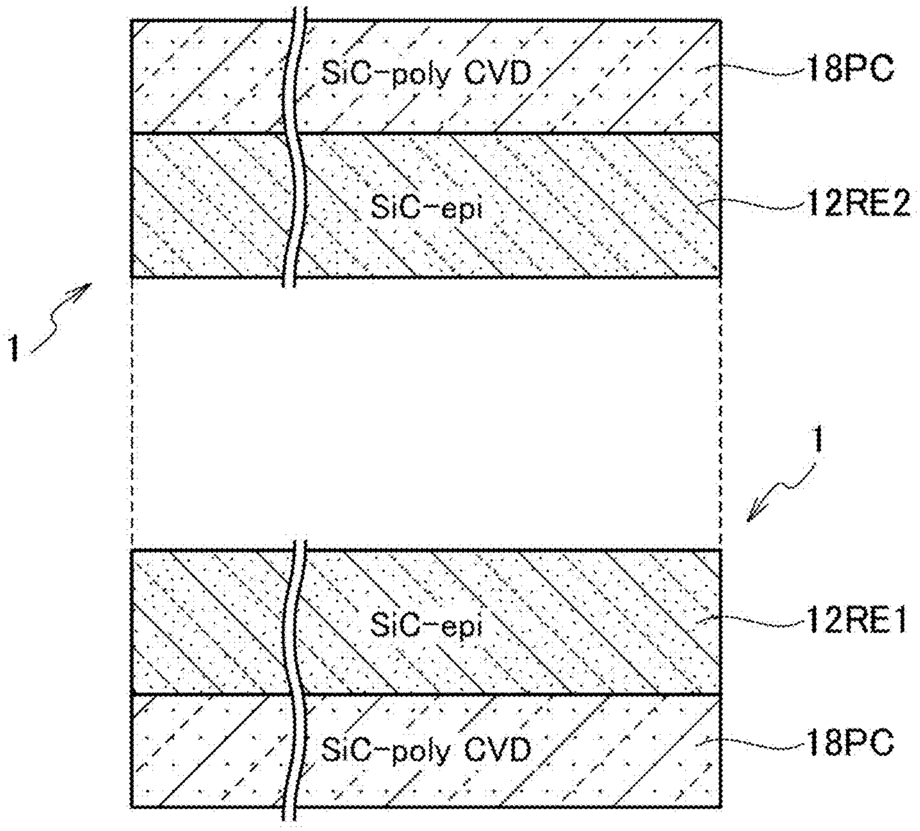
FIG. 19 illustrates the fabrication method of the SiC epitaxial wafer according to the first embodiment, which illustrates a cross-sectional diagram of a structure in which the SiC polycrystalline growth layer and the polycrystalline Si layer/polycrystalline SiC layer are eliminated and the SiC epitaxial growth layer is provided on the SiC polycrystalline growth layer.

Alternatively, as illustrated in FIGS. 17 to 19, the SiC epitaxial wafer according to the first embodiment may includes an SiC polycrystalline growth layer 18PC disposed on C planes of the SiC epitaxial growth layers 12RE1 and 12RE2. In this case, the SiC epitaxial growth layers 12RE1 and 12RE2 are transferred to the SiC polycrystalline growth layer 18PC.

Figure 20:
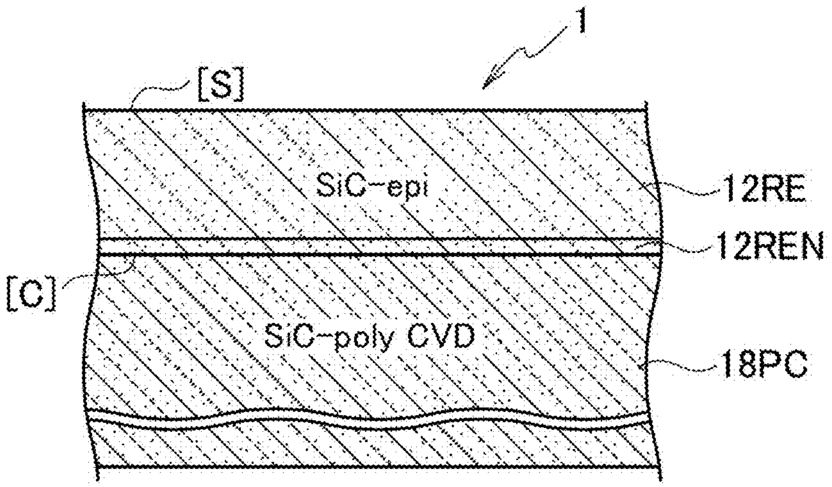
FIG. 20 illustrates the fabrication method of the SiC epitaxial wafer according to the first embodiment, which illustrates a cross-sectional diagram of a structure in which a highly doped layer is provided at an interface between the SiC polycrystalline growth layer and the SiC epitaxial growth layer.

Alternatively, as illustrated in FIG. 20, the SiC epitaxial wafer 1 according to the first embodiment may include a highly doped layer 12REN having higher impurity concentration than that of the SiC epitaxial growth layer 12RE at an interface between the SiC polycrystalline growth layer 18PC and the SiC epitaxial growth layer 12RE.

Alternatively, the graphene layer 11GR may includes a single-layer structure or multi-layer laminated structure of graphene.

The SiC epitaxial growth layer 12RE is formed above the SiC single crystal substrate 10SB via the graphene layer 11GR by remote epitaxial growth. The SiC single crystal substrate 10SB can be reused by being removed from the epitaxial growth layer 12RE.

(Fabrication Method)

In a fabrication method of the SiC epitaxial wafer according to the first embodiment, FIG. 12A illustrates a cross-sectional diagram of the SiC single crystal substrate 10SB, FIG. 12B illustrates a cross-sectional diagram of a structure in which the graphene layer 11GR is formed on the SiC single crystal substrate 10SB, and FIG. 12C illustrates a cross-sectional diagram of a structure in which the SiC epitaxial growth layer 12RE is formed on the graphene layer 11GR.

In the fabrication method of the SiC epitaxial wafer according to the first embodiment, FIG. 13A/FIG. 13B illustrates a cross-sectional diagram of a structure in which the amorphous Si layer 13AS/the amorphous SiC layer 13ASC is formed on the SiC epitaxial growth layer 12RE.

In the fabrication method of the SiC epitaxial wafer according to the first embodiment, FIG. 14A/FIG. 14B illustrated a cross-sectional diagram of a structure in which the amorphous Si layer 13AS/the amorphous SiC layer 13ASC is polycrystallized and the polycrystalline Si layer 15PS/the polycrystal SiC layer 15PSC is formed on the SiC epitaxial growth layer 12RE by annealing treatment.

Figure 15B:
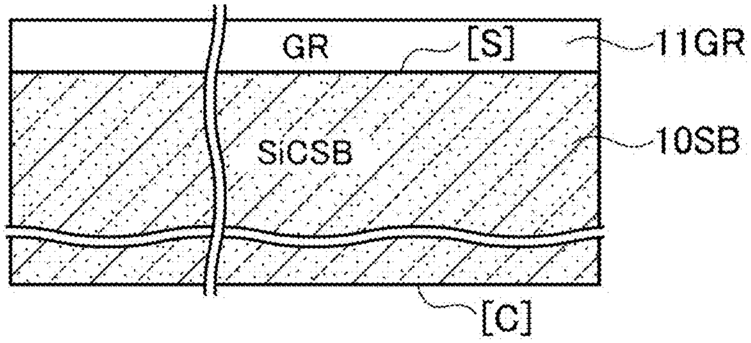
FIG. 15B illustrates the fabrication method of the SiC epitaxial wafer according to the first embodiment, which illustrates a cross-sectional diagram of the SiC single crystal substrate side of a structure in which a graphite substrate is bonded via a bonding layer on the polycrystalline Si layer/polycrystalline SiC layer, and the SiC single crystal substrate is removed at an interface between the SiC epitaxial growth layer and the graphene layer.

In the fabrication method of the SiC epitaxial wafer according to the first embodiment, FIG. 15A illustrates a cross-sectional diagram of the SiC epitaxial growth layer 12RE side of a structure in which a graphite substrate 19GS is bonded via a bonding layer 17PI on the polycrystalline Si layer 15PS/the polycrystalline SiC layer 15PSC and the SiC single crystal substrate is removed at an interface between the SiC epitaxial growth layer 12RE and the graphene layer 11GR. FIG. 15B illustrates a cross-sectional diagram of the SiC single crystal substrate 10SB side.

In the fabrication method of the SiC epitaxial wafer according to the first embodiment, FIG. 16 illustrates a cross-sectional diagram of a structure in which the removed structure illustrated in FIG. 15A is bonded on both surfaces of the graphite substrate 19GS and bonding layers 17PIC1 and 17PIC2 carbonized by annealing treatment are formed.

In the fabrication method of the SiC epitaxial wafer according to the first embodiment, FIG. 17 illustrates a cross-sectional diagram of a structure in which an SiC polycrystalline growth layer 18PC is formed by a CVD method and an outer periphery thereof is ground.

In the fabrication method of the SiC epitaxial wafer according to the first embodiment, FIG. 18 illustrates a cross-sectional diagram of a structure in which the graphite substrate 19GS and the carbonized bonding layers 17PIC1 and 17PIC2 are sublimated by annealing treatment.

In the fabrication method of the SiC epitaxial wafer according to the first embodiment, FIG. 19 illustrates a cross-sectional diagram of a structure in which the SiC polycrystalline growth layer 18PC, the polycrystalline Si layers 15PS1/the polycrystal SiC layer 15PSC1, and the polycrystalline Si layer 15PS2/the polycrystal SiC layer 15PSC2 are eliminated, and the SiC epitaxial growth layers 12RE1 and 12RE2 are provided on the SiC polycrystalline growth layer 18PC.

In the fabrication method of the SiC epitaxial wafer according to the first embodiment, FIG. 20 illustrates a cross-sectional diagram of a structure of including a highly doped layer 12REN having higher impurity concentration than that of the SiC epitaxial growth layer 12RE at an interface between the SiC polycrystalline growth layer 18PC and the SiC epitaxial growth layer 12RE.

The fabrication method of the SiC epitaxial wafer 1 according to the first embodiment includes the following steps. More specifically, the fabrication method includes: forming a graphene layer 11GR on an Si plane of a SiC single crystal substrate 10SB; forming an SiC epitaxial growth layer 12RE on the graphene layer 11GR; forming an amorphous Si layer 13AS/an amorphous SiC layer 13ASC on the SiC epitaxial growth layer 12RE; applying annealing treatment to the amorphous Si layer 13AS/the amorphous SiC layer 13ASC so as to be polycrystallized and forming a polycrystalline Si layer 15PS/a polycrystalline SiC layer 15PSC on the SiC epitaxial growth layer 12RE; bonding a provisional substrate on the polycrystalline Si layer 15PS/the polycrystal SiC layer 15PSC; removing the SiC single crystal substrate 10SB from the graphene layer 11GR; forming an SiC polycrystalline growth layer 18PC on a C plane of the SiC epitaxial growth layer 12RE; exposing the provisional substrate, applying annealing treatment to the provisional substrate so as to be sublimated; and eliminating the polycrystalline Si layer 15PS/the polycrystal SiC layer 15PSC.

Hereinafter, the fabrication method of the SiC epitaxial wafer according to the first embodiment will be described in detail with reference to drawings.

(A) First, as illustrated in FIGS. 12A and 12B, a graphene layer 11GR up to several molecular layers is formed on a (0001) Si plane of a hexagonal SiC single crystal substrate 10SB serving as a seed substrate.

(B) Next, as illustrated in FIG. 12C, an SiC epitaxial growth layer 12RE is formed by a remote epitaxial growth method on the graphene layer 11GR formed on the SiC single crystal substrate 10SB. The SiC epitaxial growth layer 12RE is a single crystal SiC thin film. In this case, the SiC epitaxial growth layer 12RE is formed on the Si plane of the SiC single crystal substrate 10SB via the graphene layer 11GR by using remote epitaxial growth technology. Through the remote epitaxial growth technology, a plane of the SiC epitaxial growth layer 12RE in contact with the first graphene layer 11GR is the C plane, and a front side surface of the SiC epitaxial growth layer 12RE is the Si plane. Moreover, the graphene layer 11GR1 may be formed of one layer, or may be formed by laminating several layers, such as two or three layers. The first graphene layer 11GR can be formed, by thermal decomposition, on the Si plane of the SiC single crystal substrate 10SB by annealing the SiC single crystal substrate 10SB at approximately 1700° C., for example, in an atmospheric pressure gaseous argon atmosphere. Alternatively, the graphene layer 11GR may be formed by being laminated by CVD on the SiC single crystal substrate 10SB. The SiC single crystal substrate 10SB is, for example, a 4H-SiC substrate, and the thickness thereof is, for example, approximately 350 μm. It is to be noted that the step of forming the graphene layer 11GR and the step of forming the SiC epitaxial growth layer 12RE by the remote epitaxial growth via graphene layer 11GR can be performed by using the same CVD apparatus and continuously moving a substrate as it is. Here, the fabricating apparatus of the SiC epitaxial wafer according to the embodiments can be applied to the CVD apparatus to be used.

(C1) Next, as illustrated in FIG. 13A/FIG. 13B, an amorphous Si layer 13AS/an amorphous SiC layer 13ASC is formed on the single crystal SiC epitaxial growth layer 12RE.

(C2) Next, as illustrated in FIG. 14A/FIG. 14B, a polycrystalline Si layer 15PS/a polycrystal SiC layer 15PSC is formed by thermal annealing. Here, the amorphous Si layer 13AS/the amorphous SiC layer 13ASC is grown solid-phase recrystallized by thermal annealing to form a thin film of the polycrystalline Si layer 15PS/the polycrystal SiC layer 15PSC is formed. Alternatively, a microcrystalline layer of Si/SiC is formed, the microcrystalline layer may be grown solid-phase recrystallized by thermal annealing to form the polycrystalline Si layer 15PS the/polycrystal SiC layer 15PSC.

(D) Next, a bonding layer 17PI is coated on the whole surface of the polycrystalline Si layer 15PS/the polycrystalline SiC layer 15PSC, and A coated surface of the bonding layer 17PI is overlapped and bonded on one surface or both surfaces of a provisional substrate (graphite substrate 19GS) having a size larger by one size than the SiC single crystal substrate 10SB to form a first composite (19GS, 17PI, 15PS/15PSC, 12RE, 11GR, and 10SB). In this case, an organic adhesive, such as a polyimide-based adhesive, for example, is used for the bonding layer 17PI. Organic adhesives, such as epoxy-based adhesive or acrylic adhesive, may be used as other adhesives. Alternatively, a silicon substrate, such as a sintered silicon substrate, or a sintered SiC substrate, may be used instead of the graphite substrate 19GS.

(E1) The first composite is heated in a vacuum annealing furnace or the like, to dry cure the bonding layer 17PI.

(E2) Next, as illustrated in FIG. 15A/FIG. 15B, on one surface or both surfaces of the first composite after curing, using an adhesive removing tape, a debonder device, or the like, the SiC single crystal substrate 10SB is physically removed to be separated from the graphene layer 11GR interface, and a second composite (19GS, 17PI, 15PS/15PSC, and 12RE) including the single crystal SiC epitaxial growth layer 12RE is formed on one surface or both surfaces of the graphite substrate 19GS. The single crystal SiC epitaxial growth layer 12RE is bonded to the SiC single crystal substrate 10SB via the graphene layer 11GR, and therefore can be easily removed therefrom. Since the graphene layer 11GR is bonded to the front side surface of the single crystal SiC epitaxial growth layer 12RE by Van der Waals force, the second graphene layer 11GR can be easily removed therefrom by applying a force in the shearing direction.

(E3) On the other hand, the graphene layer 11GR on the SiC single crystal substrate 10SB is eliminated by etching or polishing. To an etching process of the graphene layer 11GR, for example, a plasma asher using oxygen plasma can be applied. Since a surface of the Si plane of the SiC single crystal substrate 10SB where the graphene layer 11GR is etched by oxygen plasma is oxidized and roughness is formed, wet etching with a hydrogen fluoride (HF) is performed. Moreover, in the polishing process of the graphene layer 11GR, the graphene layer is eliminated, for example by a Chemical Mechanical Polishing (CMP) method. In this case, the Si plane of the SiC single crystal substrate 10SB has an average surface roughness Ra of, for example, equal to or less than approximately 1 nm after performing the above-mentioned wet etching process. Consequently, the SiC single crystal substrate 10SB can be reused.

(E4) In addition, as illustrated in FIG. 20, a highly doped layer 12REN may be formed on the C plane of the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed by the CVD method on the C plane of the SiC epitaxial growth layer 12RE.

The highly doped layer 12REN can be formed, using, for example a high-dosage ion implantation technique. For example, in a case of an n type semiconductor, the highly doped layer 12REN is formed by ion implantation of phosphorus (P) with high dosage amount. In the case of forming the highly doped layer by phosphorus ion implantation, there is an effect on the crystallinity on the C plane of the SiC epitaxial growth layer 12RE subjected to the phosphorus ion implantation, but the Si plane to be a device surface has already been formed and therefore the crystallinity of the Si plane is preserved.

(E5) Alternatively, the highly doped layer 12REN may be formed by forming the highly nitrogen (N)-doped epitaxial growth layer in an initial stage during the formation of the SiC epitaxial growth layer (SiC-epi) 12RE illustrated in FIG. 12C. In the highly nitrogen (N)-doped epitaxial growth layer, there is an effect on crystallinity due to mismatching of lattice constant, but the process is easy since it is formed by autodoping in the initial stage of the epitaxial growth.

(F) Next, as illustrated in FIG. 16, the second composite (19GS, 17P11, 17P12, 15PS1/15PSC1, 15PS2/15PSC2, 12RE1, and 12RE2) is heated in a vacuum thermal annealing furnace, and the carbonized bonding layers 17PIC1 and 17PIC2 are formed. FIG. 16 illustrates an example of forming the single crystal SiC epitaxial growth layers 12RE1 and 12RE2 respectively on both surfaces of the graphite substrate 19GS.

(G) Next, as illustrated in FIG. 17, an SiC polycrystalline growth layer 18PC is formed on a (000-1) C surface of the single crystal SiC epitaxial growth layers 12RE1 and 12RE2 provided on one surface or both surfaces of the second composite. The SiC polycrystalline growth layer 18PC can be formed by, for example, CVD technique. The SiC polycrystalline growth layer 18PC has a 3C (cubic) structure. In the embodiment, the thickness of the SiC polycrystalline growth layer 18PC is, for example, approximately 100 μm to approximately 600 μm, and the thickness of the SiC epitaxial growth layer 12RE is, for example, approximately 4 μm to approximately 100 μm. A substrate layer of device wafer structure is formed by forming the SiC polycrystalline growth layer 18PC on the C plane of the SiC epitaxial growth layer 12RE. Since the C plane of the SiC epitaxial growth layer 12RE is a back surface of the device wafer structure, surface flatness thereof is not much required. Therefore, the SiC polycrystalline growth layer 18PC can be formed by a simple polishing process.

The SiC polycrystalline growth layer 18PC is deposited up to a thickness from which a mechanical strength required as a substrate of the SiC based semiconductor device can be obtained, to form a third composite (19GS, 17PIC1, 17PIC2, 15PS1/15PSC1, 15PS2/15PSC2, 12RE1, 12RE2, and 18PC). A film thickness of the SiC polycrystalline growth layer 18PC is preferably within a range from approximately 150 μm to approximately 500 μm, and is adjusted so that a substrate thickness of the completed composite substrate (SiC polycrystalline growth layer 18PC and the single crystal SiC epitaxial growth layer 12RE) is within a range from approximately 150 μm to approximately 500 μm as required. Moreover, the deposition temperature of the SiC polycrystalline growth layer 18PC is set to be below the melting point of silicon, i.e., the temperature at which the polycrystallized Si thin film, i.e., polycrystalline Si layers 15PS1 and 15PS2, do not melt. The melting point of silicon is approximately 1414° C. The deposition temperature of SiC polycrystalline growth layer 18PC is preferably within a range from approximately 1000° C. to the melting point, in consideration of film quality. When the provisional substrate (graphite substrate 19GS) having an outside size larger by one size than the SiC single crystal substrate 10SB is inserted into a wafer boat groove of a batch-type vertical CVD furnace to be aligned, there is a advantage that a trace of a wafer boat support is outside a substrate effective area. The deposition temperature of the polycrystal SiC is the temperature at which the silicon material does not melt if the provisional substrate is a silicon material, i.e., lower than the melting point thereof, and if the provisional substrate is a carbon material, the temperature equal to or higher than 1414° C.

(H) Next, the unnecessary SiC polycrystalline growth layer 18PC deposited on the outer periphery of the third composite is eliminated by grinding to expose the provisional substrate (graphite substrate 19GS) and the carbonized bonding layers 17PIC1 and 17PIC2. Instead of grinding to eliminate the unnecessary SiC polycrystalline growth layer 18PC deposited on the outer periphery of the third composite, the provisional substrate (graphite substrate 19GS) may be cut along a plane illustrated along the line A-A of FIG. 17 parallel to the substrate surface to vertically separate the third composite. As a separation technique, for example, a wire saw or a diamond wire saw can be used.

(I) Next, as illustrated in FIG. 18, the third composite in which the outer periphery is ground is placed in an thermal annealing furnace with air or oxygen atmosphere and the graphite substrate 19GS inside the third composite and the carbonized bonding layer 17PIC1 and 17PIC2 is sublimated and eliminated by combustion, and is extracted as a fourth composite (15PS1/15PSC1, 15PS2/15PSC2, 12RE1, 12RE2, and 18PC) including the SiC epitaxial growth layer 12RE on the SiC polycrystalline growth layer 18PC.

(J) Next, as illustrated in FIG. 19, the polycrystalline Si layers 15PS1/the polycrystalline SiC layers 15PSC1 and the polycrystalline Si layers 15PS2/the polycrystalline SiC layers 15PSC2 are eliminated by grinding or polishing an outer periphery and both surfaces of the fourth composite, as well as processed to a size and a surface state required as a substrate.

It is to be noted that the CVD apparatus for forming the SiC epitaxial growth layer 12RE continuously by the remote epitaxial growth via the graphene layer 11GR after forming the graphene layer 11GR may be the same CVD apparatus for forming the SiC polycrystalline growth layer 18PC on the C plane of the SiC epitaxial growth layer 12RE, or may be configured as a separate dedicated apparatus. Here, the fabricating apparatus of the SiC epitaxial wafer according to the embodiments can be applied to the CVD apparatus to be used.

In accordance with the above-mentioned processes, the SiC epitaxial wafer 1 according to the first embodiment can be formed.

In accordance with the fabrication method of the SiC epitaxial wafer according to the first embodiment, before forming the SiC polycrystalline growth layer by the CVD method, the SiC single crystal substrate is separated and is replace by the high heat-resistant provisional substrate, and thereby it is possible to prevent unnecessary adhesion of the SiC polycrystal to the SiC single crystal substrate, to improve the reusability of the SiC single crystal substrate, and to reduce the cost.

In accordance with the fabrication method of the SiC epitaxial wafer according to the first embodiment, the film internal stress generated when the amorphous Si layer or the microcrystalline layer of Si is polycrystallized by the solid-phase recrystallization growth is utilized to make it easier to remove the SiC epitaxial growth layer from the graphene layer, and thereby it is possible to avoid the metallic contamination which becomes a problem when the metal stressor film is used.

In accordance with the fabrication method of the SiC epitaxial wafer according to the first embodiment, the high heat-resistant provisional substrate having a size larger by one size than the SiC single crystal substrate is used, and thereby it is possible to realize the single or double-sided epitaxial growth using the epitaxial growth apparatus, such as the batch-type vertical tubular furnace, and to realize high throughput and low cost production without increasing the growth rate.

In accordance with the fabrication method of the SiC epitaxial wafer according to the first embodiment, the high heat-resistant substrates, such as a graphite substrate, and the bonding layer are carbonized, and thereby it can be separated in affordable price merely by firing the semiconductor substrate structure formed in both surfaces of the graphite substrate in the oxidation furnace.

In accordance with the fabrication method of the SiC epitaxial wafer according to the first embodiment, the remote epitaxial growth of SiC is performed via the graphene formed to the SiC single crystal substrate and the SiC polycrystalline growth layer is directly formed thereon by the CVD method, substrate bonding is no linger necessary, and defects caused by the substrate bonding can be eliminated. Moreover, since the epitaxial growth layer is formed via the graphene, separation between the SiC single crystal substrate and the epitaxial growth layer becomes easier, thereby simplifying the processing processes, and eliminating the need for expensive process such as ion implantation removing method or the like.

In accordance with the fabrication method of the SiC epitaxial wafer according to the first embodiment, after the SiC single crystal substrate is eliminated, the whole high heat-resistant handle substrate is inserted into the high-temperature LP-CVD apparatus to grow up the SiC polycrystalline growth layer directly on the epitaxial growth layer, and thereby it is possible to eliminate the process of transporting the epitaxial growth layer of several μm thickness from the handle substrate to the support substrate and the process of being bonded to the support substrate an of several μm film thickness, and to avoid failures, such as wrinkles, crystal transitions, and voids, caused by the thin film transportation and bonding.

In accordance with the fabrication method of the SiC epitaxial wafer according to the first embodiment, the graphene layer formed on the SiC single crystal substrate is not transferred, and the epitaxial growth is performed thereon as it is. Consequently, it is possible to avoid failures, such as wrinkles and cracks, caused by the transfer of the graphene.

In accordance with the fabrication method of the SiC epitaxial wafer according to the first embodiment, since the SiC substrate is used as a base, the hexagonal SiC with less crystallinity degradation can be obtained. Although the SiC substrate is expensive and difficult to be eliminated by polishing or etching, it is easy to separate the obtained high-performance single crystal layer by using the remote epitaxial growth via the graphene, and thereby eliminating the need for elimination by polishing or etching. Since such an expensive single crystal SiC seed substrate can be reused after the separating, a significant cost advantage can be provided.

Second Embodiment (SiC Epitaxial Wafer)

Figure 25:
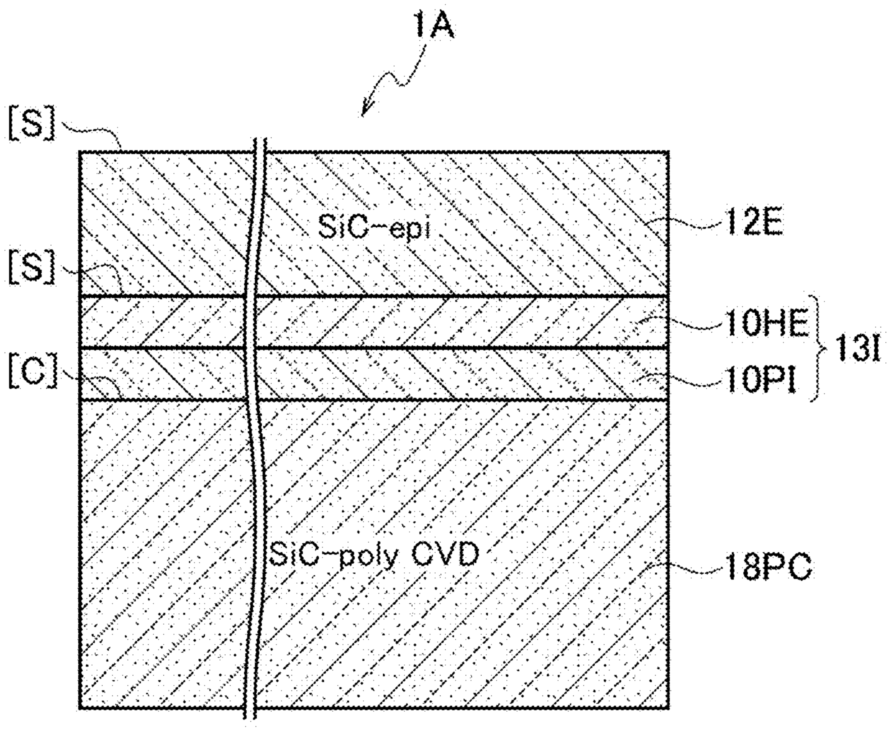
FIG. 25 illustrates the first fabrication method of the SiC epitaxial wafer according to the second embodiment, which illustrates a cross-sectional diagram of a structure in which an SiC epitaxial growth layer is formed on the SiC thin layer.

As illustrated in FIG. 25, the SiC epitaxial wafer 1A according to the second embodiment includes: a hexagonal SiC single crystal layer 131; an SiC epitaxial growth layer (SiC-epi) 12E disposed on an Si plane of the SiC single crystal layer 131; and an SiC polycrystalline growth layer (SiC-poly CVD) 18PC disposed on a C plane opposite to the Si plane of the SiC single crystal layer 131.

The SiC single crystal layer 131 includes a single crystal SiC thin layer 10HE, as illustrated in FIG. 25.

The single crystal SiC thin layer 10HE includes a first ion implantation layer.

The first ion implantation layer includes a hydrogen ion implantation layer 10HI, as illustrated in FIG. 25.

The single crystal SiC thin layer 10HE includes an weakened layer of the hydrogen ion implantation layer 10HI.

The SiC single crystal layer 131 may includes a second ion implantation layer.

Here, the second ion implantation layer is disposed between the single crystal SiC thin layer 10HE and the SiC polycrystalline growth layer 18PC, as illustrated in FIG. 25.

The second ion implantation layer may include a phosphorus ion implantation layer 10PI, as illustrated in FIG. 25.

Here, the Si plane of the SiC single crystal layer 131 is, for example, a [0001] oriented plane of 4H-SiC, and the C plane of the SiC single crystal layer 131 is a [000-1] oriented plane of 4H-SiC.

Moreover, the SiC single crystal substrate 10SB can be reused by being removed from the SiC epitaxial growth layer 12RE.

(First Fabrication Method)

Figure 21:
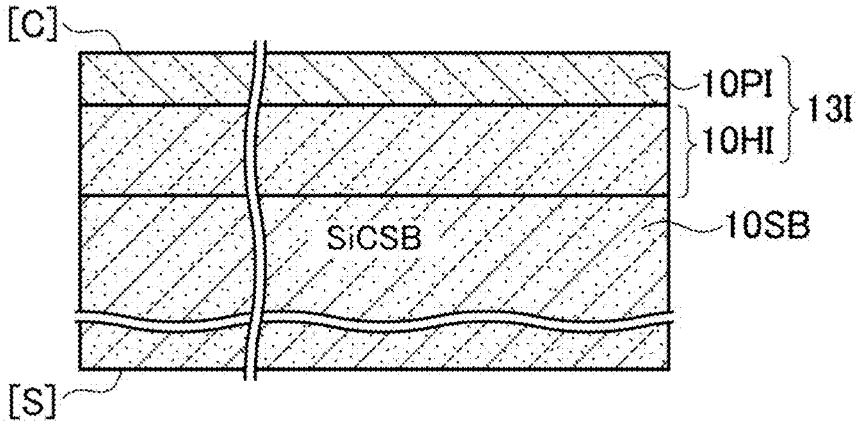
FIG. 21 illustrates a first fabrication method of an SiC epitaxial wafer according to a second embodiment, which illustrates a cross-sectional diagram of a structure in which a hydrogen ion implantation layer and a phosphorus ion implantation layer are formed on a C plane of an SiC single crystal substrate.

FIG. 21 illustrates a first fabrication method of the SiC epitaxial wafer according to the second embodiment, which illustrates a cross-sectional diagram of a structure in which a hydrogen ion implantation layer 10HI and a phosphorus ion implantation layer 10PI are sequentially formed on a C plane of an SiC single crystal substrate (SiCSB) 10SB.

Figure 22:
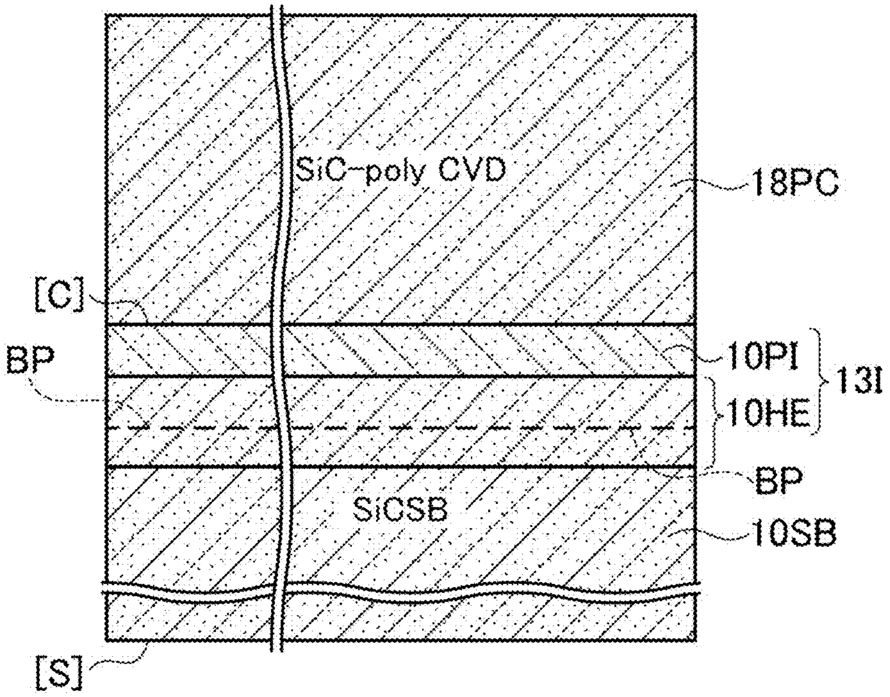
FIG. 22 illustrates the first fabrication method of the SiC epitaxial wafer according to the second embodiment, which illustrates a cross-sectional diagram of a structure in which an SiC polycrystalline growth layer is formed by a CVD method on a C plane of the phosphorus ion implantation layer.

FIG. 22 illustrates the first fabrication method of the SiC epitaxial wafer according to the second embodiment, which illustrates a cross-sectional diagram of a structure in which an SiC polycrystalline growth layer (SiC-poly CVD) 18PC is formed on a C plane of the phosphorus ion implantation layer 10PI by the CVD method.

Figure 23A:
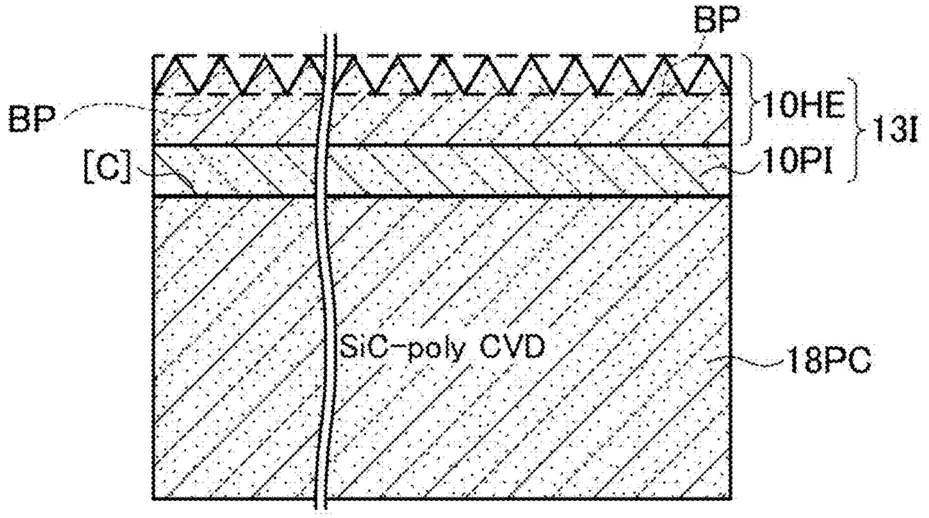
FIG. 23A illustrates the first fabrication method of the SiC epitaxial wafer according to the second embodiment, and which illustrates a cross-sectional diagram of a structure in which the SiC polycrystalline growth layer and an SiC single crystal layer on the SiC polycrystalline growth layer are formed after being separated from the SiC single crystal substrate via a removed surface in the single crystal SiC thin layer.

FIG. 23A illustrates the first fabrication method of the SiC epitaxial wafer according to the second embodiment, which illustrates a cross-sectional diagram of a structure in which the SiC single crystal substrate 10SB is separated therefrom via a removed surface BP in the single crystal SiC thin layer 10HE, and the SiC polycrystalline growth layer 18PC and the SiC single crystal layer 131 on the SiC polycrystalline growth layer 18PC are formed.

Figure 23B:
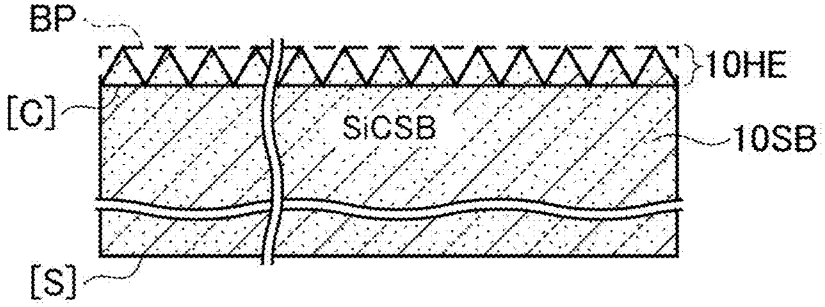
FIG. 23B illustrates a cross-sectional diagram of a structure of the removed and separated SiC single crystal substrate.

On the other hand, FIG. 23B illustrates a cross-sectional diagram of a structure in which the SiC single crystal substrate 10SB which is removed and separated.

Figure 24:
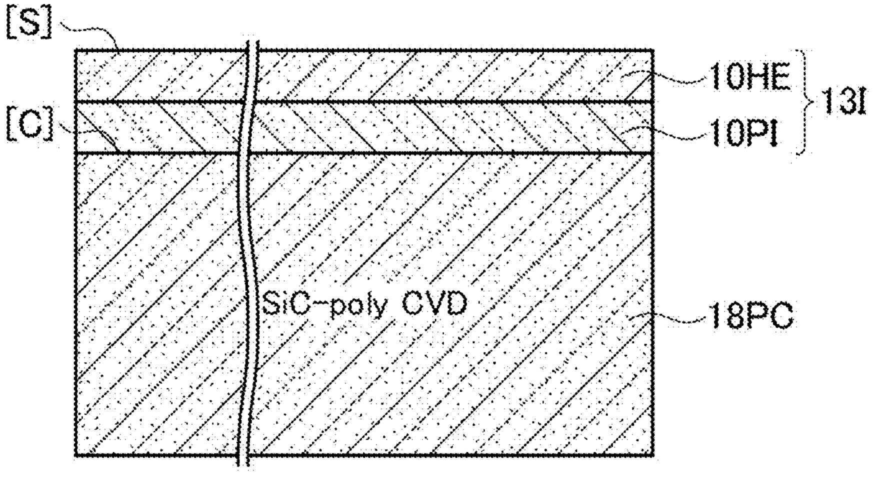
FIG. 24 illustrates the first fabrication method of the SiC epitaxial wafer according to the second embodiment, which illustrates a cross-sectional diagram of a structure in which an Si plane of the SiC single crystal layer is polished.

FIG. 24 illustrates the first fabrication method of the SiC epitaxial wafer according to the second embodiment, which illustrates a cross-sectional diagram of a structure in which an Si plane of the SiC single crystal layer 131 is polished.

FIG. 25 illustrates the first fabrication method of the SiC epitaxial wafer according to the second embodiment, which illustrates a cross-sectional diagram of a structure in which an SiC epitaxial growth layer 12E is formed on the Si plane of SiC single crystal layer 131.

(Ion Implantation Removing Method)

An ion implantation removing method is applied to the first fabrication method of the SiC epitaxial wafer according to the second embodiment. By performing the ion implantation removing method, the single crystal SiC thin layer 10HE can be formed on the surface of the SiC single crystal substrate 10SB. The ion implantation removing method has the following processes.

(a) First, ion implantation of hydrogen is performed on the Si plane of the hexagonal SiC single crystal substrate 10SB, and the hydrogen ion implantation layer 10HI is formed at a predetermined depth.

(b) Next, annealing treatment is performed to weaken the hydrogen ion implantation layer 10HI, and the single crystal SiC thin layer 10HE is formed. The weakened hydrogen ion implantation layer 10HI becomes the single crystal SiC thin layer 10HE. In this case, the annealing treatment is a weakening thermal annealing process. This process is a process for generating hydrogen microbubbles after the ion implantation of hydrogen to facilitate breaking of the single crystal SiC thin layer 10HE. In the single crystal SiC thin layer 10HE, a removed surface BP is formed when applying a stress, such as a shear stress.

The first fabrication method of the SiC epitaxial wafer according to the second embodiment is a fabrication method of an SiC epitaxial wafer 1 including a single crystal SiC thin layer 10HE and an SiC epitaxial growth layer 12E on an SiC polycrystalline growth layer 18PC. The first fabrication method includes: thinning a surface of a hexagonal SiC single crystal substrate 10SB by an ion implantation removing method; epitaxially growing a single crystal SiC on a first plane of the thinned SiC single crystal layer 131; and directly growing an SiC polycrystalline growth layer 18PC by a CVD method on a second plane of the thinned SiC single crystal layer 131. Here, an interface bonding of a first plane and an interface bonding of a second plane both use no substrate bonding method.

Moreover, the first fabrication method of the SiC epitaxial wafer according to the second embodiment includes thinning a (000-1) C surface of the hexagonal SiC single crystal substrate 10SB by an ion implantation removing method.

The first fabrication method of the SiC epitaxial wafer according to the second embodiment includes the following steps. More specifically, the first fabrication method includes: forming a hydrogen ion implantation layer 10HI on a C plane of an SiC single crystal substrate 10SB; forming an SiC polycrystalline growth layer 18PC on a C plane of the SiC single crystal substrate 10SB; forming a single crystal SiC thin layer 10HE by weakening the hydrogen ion implantation layer 10HI upon forming the SiC polycrystalline growth layer 18PC; removing a first stacked structure including the single crystal SiC thin layer 10HE and the SiC polycrystalline growth layer 18PC from the SiC single crystal substrate 10SB; smoothing a surface of the removed single crystal SiC thin layer 10HE; and forming an SiC epitaxial growth layer 12E on the smoothed surface of the single crystal SiC thin layer 10HE.

Hereinafter, the first fabrication method of the SiC epitaxial wafer according to the second embodiment will be described in detail with reference to drawings.

(A) First, as illustrated in FIG. 21, hydrogen ions are implanted into the C plane of the hexagonal SiC single crystal substrate (SiCSB) 10SB. When the hydrogen ions are implanted into the C plane of the SiC single crystal substrate 10SB, the hydrogen ions reach a depth corresponding to the incident energy and are distributed over at a high concentration. Consequently, as illustrated in FIG. 21, the hydrogen ion implantation layer 10HI is formed at the predetermined depth from the surface.

The hydrogen ion implantation layer 10HI having the specified depth (approximately 0.5 μm to approximately 1 μm) is formed by the hydrogen ion implantation with the ion implantation removing method. In this case, as ion implantation conditions, an accelerating energy is, for example, approximately 100 keV, and a dosage is, for example, approximately $2.0\times10^{17}/cm^2$.

(B) Next, as illustrated in FIG. 21, another ion (P or the like) for lowering an electric resistance value of a stacking contact interface may be implanted into the C plane of the SiC single crystal substrate 10SB. In this case, a depth of the phosphorus ion implantation layer 10PI is, for example, approximately 0.1 μm to approximately 0.5 μm. In this case, as ion implantation conditions, an accelerating energy is, for example, approximately 10 keV to approximately 180 keV, and a dosage is, for example, approximately $4\times10^{15}/cm^2$ to approximately $6\times10^{16}/cm^2$.

(C) Next, as illustrated in FIG. 22, the SiC polycrystalline growth layer 18PC is formed on the C plane of the SiC single crystal substrate 10SB. Here, the SiC polycrystalline growth layer 18PC can be deposited on the C plane of the SiC single crystal substrate 10SB by, for example, the CVD method. A thickness of the SiC polycrystalline growth layer 18PC is preferably, for example, approximately 150 μm to approximately 500 μm. The thickness of the SiC epitaxial wafer 1 (refer to FIG. 25) is adjusted to approximately 150 μm to approximately 500 μm as required. In this case, the thickness of the SiC epitaxial wafer 1 is the sum of the thickness of the SiC polycrystalline growth layer 18PC, the thickness of the SiC single crystal layer 131, and the thickness of the SiC epitaxial growth layer 12RE, as illustrated in FIG. 25.

The hydrogen ion implantation layer 10HI can be weakened simultaneously with a high temperature process performed during the deposition of the SiC polycrystalline growth layer 18PC. Further, at the same time, activation annealing for hydrogen ions, phosphorus ions, and the like is performed. The hydrogen ion implantation layer 10HI is weakened simultaneously with the annealing process during the formation of the SiC polycrystalline growth layer 18PC, and the single crystal SiC thin layer 10HE is formed.

Of the two ion implantations int the C plane of the SiC single crystal substrate 10SB, the first is the hydrogen ion implantation for the ion implantation removing method. After implanting the hydrogen ions, hydrogen microbubbles are generated to weaken the hydrogen ion implantation layer 10HI. As a result, the single crystal SiC thin layer 10HE is formed. As illustrated in FIG. 22, weakening thermal annealing is required in order so that the single crystal SiC thin layer 10HE is made easier to break at the broken plane BP.

The second ion implantation is the phosphorus ion implantation for reduction of an ohmic contact resistance in the contact interface between the SiC single crystal substrate 10SB and the SiC polycrystalline growth layer 18PC, and after performing the implanting, the activation thermal annealing is required to activate the phosphorus ions and improve the donor concentration.

Both such annealing are simultaneously realized by heating the substrate during the deposition of the SiC polycrystalline growth layer 18PC by the CVD method.

(D1) Next, as illustrated in FIG. 23A, the stacked structure (18PC, 10PI, 10HE) including the single crystal SiC thin layer 10HE, the phosphorus ion implantation layer 10PI, and the SiC polycrystalline growth layer 18PC is removed from the SiC single crystal substrate 10SB. In this case, the removing process is performed at the removed surface BP of the single crystal SiC thin layer 10HE subjected to the weakening process.

(D2) On the other hand, on the Si plane of the removed SiC single crystal substrate 10SB, a concavity and convexity structure of the single crystal SiC thin layer 10HE is exposed. A mechanical polishing method and a mechanical-chemical polishing method are sequentially used for the concavity and convexity structure of this single crystal SiC thin layer 10HE to smooth the Si plane of the SiC single crystal substrate 10SB. The Si plane of the SiC single crystal substrate 10SB has an average surface roughness Ra of, for example, equal to or less than approximately 1 nm after performing the above-mentioned process. Consequently, the SiC single crystal substrate 10SB can be reused. The SiC single crystal substrate 10SB can be reused.

(E) Next, as illustrated in FIG. 24, the mechanical polishing method and the mechanical-chemical polishing method are sequentially used for the surface of the removed SiC single crystal thin layer 10HE to smooth the surface thereof. The Si plane of the SiC single crystal thin layer 10HE has an average surface roughness Ra of, for example, equal to or less than approximately 1 nm after performing the above-mentioned process.

(F) Next, as illustrated in FIG. 25, the homoepitaxial crystal layer is grown by the CVD method on the smoothed surface to form the SiC epitaxial growth layer 12E having excellent crystallinity. It is to be noted that the CVD apparatus for forming the SiC epitaxial growth layer 12E by the homoepitaxial growth may be the same CVD apparatus for forming the SiC polycrystalline growth layer 18PC on the C plane of the SiC single crystal substrate 10SB, or may be configured as a separate dedicated apparatus. Here, the fabricating apparatus of the SiC epitaxial wafer according to the embodiments can be applied to the CVD apparatus to be used.

In accordance with the above-mentioned processes, the SiC epitaxial wafer according to the second embodiment can be formed.

In accordance with the first fabrication method of the SiC epitaxial wafer according to the second embodiment, The SiC single crystal thin layer is formed by the ion implantation removing method into the C plane of the hexagonal SiC single crystal substrate, and also the direct growth of the SiC polycrystalline layer on the C plane of the SiC single crystal thin layer is combined therewith, and thereby it is possible to provide the SiC epitaxial wafer and the fabrication method thereof using no substrate bonding method between the single crystal SiC epitaxial growth layer and the SiC polycrystalline layer.

In accordance with the first fabrication method of the SiC epitaxial wafer according to the second embodiment, the SiC single crystal thin layer is formed on the C plane of the SiC single crystal substrate by the ion implantation removing method and the SiC polycrystalline layer is directly deposited on the SiC single crystal thin layer by the CVD method, and thereby it is possible to provide the SiC epitaxial wafer and fabrication method thereof in which the bonding step between the single crystal SiC epitaxial growth layer and the SiC polycrystalline growth layer can be eliminated and the fabricating cost can be reduced by simplifying the fabricating process.

In accordance with the first fabrication method of the SiC epitaxial wafer according to the second embodiment, it is possible to fabricate the composite substrate having the stacked structure including the single crystal SiC epitaxial growth layer and the SiC polycrystalline growth layer by the combination technique between the ion implantation removing method and the CVD direct deposition technique, without bonding the substrate.

In accordance with the first fabrication method of the SiC epitaxial wafer according to the second embodiment, since the hexagonal SiC single crystal substrate is to be thin-layered and the epitaxial growth layer 12E is formed by performing the homoepitaxial growth on the SiC single crystal thin layer 10HE, the Si plane of the hexagonal SiC epitaxial growth layer 12E can be obtained on the fabrication plane of the device. In addition, although the SiC single crystal substrate 10SB, which is more expensive than the Si substrate, is used as a seed substrate, the cost is not much different from that of using the Si substrate since the seed substrate can be reused more than several dozen times.

The first fabrication method of the SiC epitaxial wafer according to the second embodiment corresponds to the fabrication method of the SiC composite substrate including the single crystal SiC epitaxial growth layer on the SiC polycrystalline substrate, and on the (000-1) C surface of the hexagonal single crystal SiC substrate, the SiC polycrystalline growth layer is directly deposited by the thermal CVD method on the SiC single crystal thin layer on which the surface of the SiC single crystal substrate is thinned using the ion implantation removing method, and thereby it is possible to eliminate the substrate bonding between the single crystal SiC epitaxial growth layer and the SiC polycrystalline growth layer and to reduce the fabricating cost by simplifying the fabricating process.

The first fabrication method of the SiC epitaxial wafer according to the second embodiment can provide the following effects (1) to (6).

(1) Since substrate bonding required for fabrication of composite substrates using a conventional ion implantation removing method is not used, it is possible to eliminate the yield deterioration due to bonding defects and voids caused by bonding. Moreover, man-hours are reduced, fixed and variable cost losses due to defects are reduced, and productivity and quality are improved.

(2) Precise polishing process for ensuring bondability is no longer required, and the high cost due to defective losses and increased processing costs incurred in these processes is eliminated, thereby enabling the provision of the inexpensive SiC composite substrate.

(3) Since the interface contact resistance value can be reduced by performing ion implantation in advance into one side of the contact surface between the SiC polycrystalline growth layer and the single crystal SiC epitaxial growth layer, and by performing high-concentration doping control to another side during the film formation, the driving voltage peculiar to the composite substrate can be reduced.

(4) Since high-concentration autodoping can be performed for the thermal CVD method during deposition of the polycrystal SiC supporting layer, the electric resistance value of bulk can be reduced a resistance value equivalent to a single crystal substrate fabricated by the sublimation method.

(5) Of two ion implantations into the C plane of the SiC single crystal substrate, the first ion implantation is the hydrogen ion implantation for the ion implantation removing method, and after performing the ion implantation, the weakening thermal annealing is required to generate the hydrogen microbubbles to facilitate breaking the thinned layer. The second ion implantation is the phosphorus ion implantation for reduction of the contact interface resistance (ohmic contact) between the single crystal SiC and the polycrystal SiC, and after performing the implanting, the activation thermal annealing is required to activate the phosphorus ions and improve the donor concentration. Since both annealing processes are simultaneously realized by heating the substrate during the deposition of the polycrystal SiC supporting layer by the CVD, there is no need to perform these annealing processes separately, thereby reducing the fabricating cost.

(6) Since the removal phenomenon due to the weakening annealing effect is generated before the deposition of the polycrystalline SiC thick film by the CVD, the coefficient of thermal expansion mismatch between the SiC single crystal and the SiC polycrystalline can be mitigated, thereby suppressing warpage.

(Second Fabrication Method)

Figure 26:
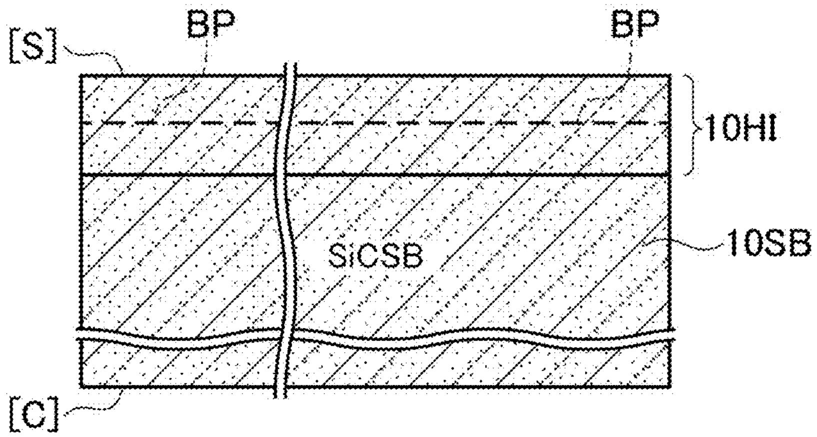
FIG. 26 illustrates a second fabrication method of the SiC epitaxial wafer according to the second embodiment, which illustrates a cross-sectional diagram of a structure in which a hydrogen ion implantation layer is formed on an Si plane of the SiC single crystal substrate.

FIG. 26 illustrates a second fabrication method of the SiC epitaxial wafer according to the second embodiment, which illustrates a cross-sectional diagram of a structure in which a hydrogen ion implantation layer 10HI is formed on an Si plane of the SiC single crystal substrate 10SB.

Figure 27:
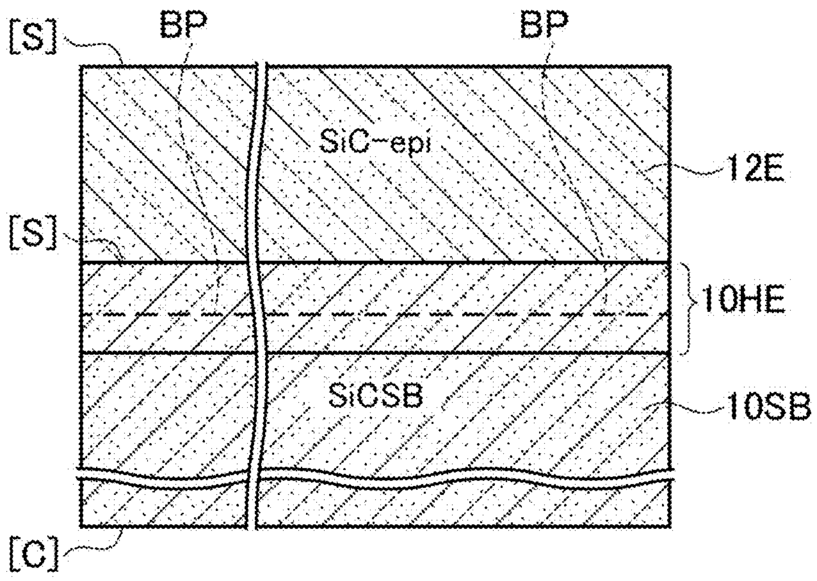
FIG. 27 illustrates the second fabrication method of the SiC epitaxial wafer according to the second embodiment, which illustrates a cross-sectional diagram of a structure in which after weakening the hydrogen ion implantation layer and forming a single crystal SiC thin layer by annealing treatment of the hydrogen ion implantation layer, an SiC epitaxial growth layer is formed on an Si plane of the single crystal SiC thin layer.

FIG. 27 illustrates the second fabrication method of the SiC epitaxial wafer according to the second embodiment, which illustrates a cross-sectional diagram of a structure in which after weakening the hydrogen ion implantation layer 10HI and forming a single crystal SiC thin layer 10HE by annealing treatment of the hydrogen ion implantation layer 10HI, an SiC epitaxial growth layer 12E is formed on an Si plane of the single crystal SiC thin layer 10HE.

Figure 28:
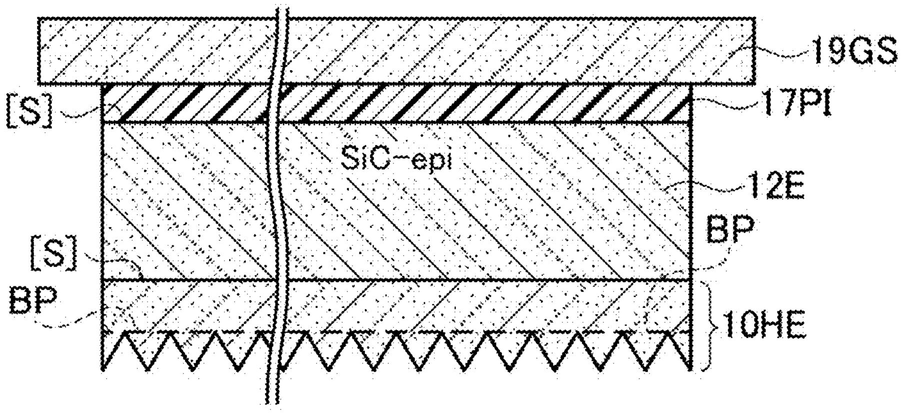
FIG. 28 illustrates the second fabrication method of the SiC epitaxial wafer according to the second embodiment, which illustrates a cross-sectional diagram of a structure in which after coating a bonding layer in an Si plane of the SiC epitaxial growth layer and bonding a graphite substrate thereto, an SiC single crystal substrate is removed and separated therefrom via a single crystal SiC thin layer which is weakened.

FIG. 28 illustrates the second fabrication method of the SiC epitaxial wafer according to the second embodiment, which illustrates a cross-sectional diagram of a structure in which after coating a bonding layer 17PI in an Si plane of the SiC epitaxial growth layer 12E and bonding a graphite substrate 19GS thereto, an SiC single crystal substrate 10SB is removed and separated therefrom via the weakened single crystal SiC thin layer 10HE.

Figure 29:
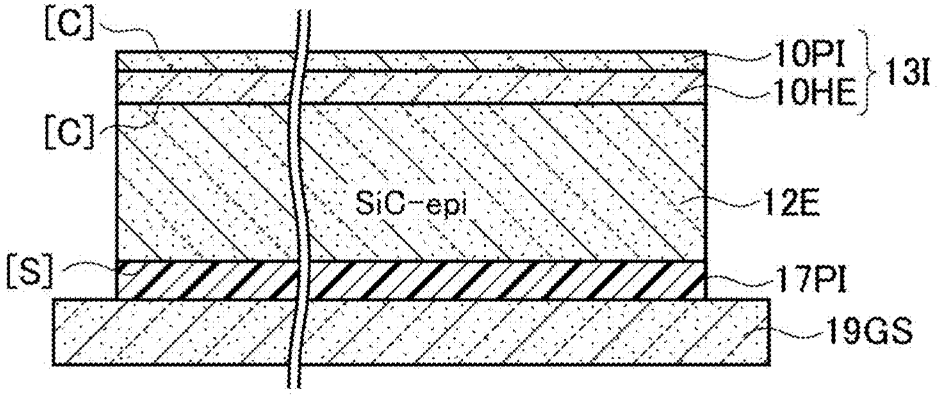
FIG. 29 illustrates the second fabrication method of the SiC epitaxial wafer according to the second embodiment, which illustrates a cross-sectional diagram of a structure in which after smoothing a removed surface of the single crystal SiC thin layer, phosphorus ion implantation is performed in a C plane of the single crystal SiC thin layer to form a phosphorus ion implantation layer.

FIG. 29 illustrates the second fabrication method of the SiC epitaxial wafer according to the second embodiment, which illustrates a cross-sectional diagram of a structure in which after smoothing a removed surface of the single crystal SiC thin layer 10HE, phosphorus ion implantation is performed in a C plane of the single crystal SiC thin layer 10HE to form a phosphorus ion implantation layer 10PI.

Figure 30:
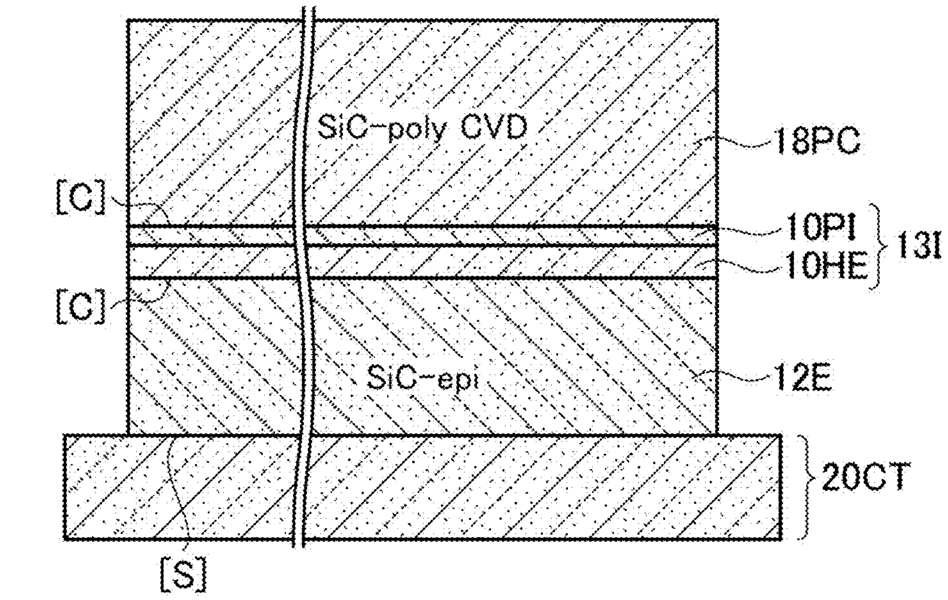
FIG. 30 illustrates the second fabrication method of an SiC epitaxial wafer according to the second embodiment, which illustrates a cross-sectional diagram in which the adhesive is eliminated, the graphite substrate is separated from a stacked structure including the single crystal SiC thin layer and the SiC epitaxial growth layer, and the separated stacked structure including the single crystal SiC thin layer and the SiC epitaxial growth layer is mounted so that an Si plane thereof is in contact with a carbon tray, and a C plane thereof is exposed facing up and an SiC polycrystalline growth layer is formed on the C plane by the CVD method.

FIG. 30 illustrates the second fabrication method of the SiC epitaxial wafer according to the second embodiment, which illustrates a cross-sectional diagram in which the bonding layer 17PI is eliminated, the graphite substrate 19GS is separated from a stacked structure including the single crystal SiC thin layer 10HE and the SiC epitaxial growth layer 12E, and the separated stacked structure including the single crystal SiC thin layer 10HE and the SiC epitaxial growth layer 12E is mounted so that an Si plane thereof is in contact with a carbon tray 20CT, and a C plane thereof is exposed facing up and an SiC polycrystalline growth layer 18PC is formed on the C plane by the CVD method.

Figure 31:
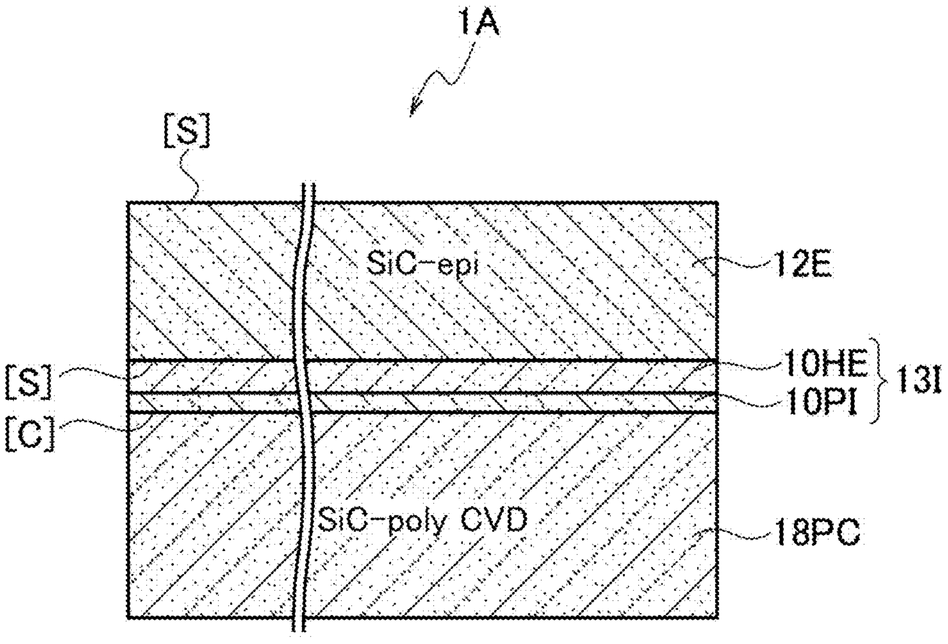
FIG. 31 illustrates the fabrication method of the SiC epitaxial wafer according to a second embodiment, which illustrates a cross-sectional diagram of a structure from which the carbon tray is eliminated.

FIG. 31 illustrates the second fabrication method of the SiC epitaxial wafer according to the second embodiment, which illustrates a cross-sectional diagram of a structure from which the carbon tray 20CT is eliminated.

(Ion Implantation Removing Method)

An ion implantation removing method is applied to the second fabrication method of the SiC epitaxial wafer according to the second embodiment. By performing the ion implantation removing method, the single crystal SiC thin layer 10HE is formed from the SiC single crystal substrate 10SB. The ion implantation removing method has the following processes.

(a) First, ion implantation of hydrogen is performed on the C plane of the hexagonal SiC single crystal substrate 10SB, and the hydrogen ion implantation layer 10HI is formed at a predetermined depth.

(b) Next, when annealing treatment is performed, the hydrogen ion implantation layer 10HI is weakened, and the single crystal SiC thin layer 10HE is formed. The weakened hydrogen ion implantation layer 10HI becomes the single crystal SiC thin layer 10HE. The weakening thermal annealing is required for generating hydrogen microbubbles after the ion implantation of hydrogen to facilitate breaking of the single crystal SiC thin layer 10HE. In the single crystal SiC thin layer 10HE, a removed surface BP is formed when applying a stress.

The fabrication method according to the second embodiment is a fabrication method of an SiC epitaxial wafer 1 including a single crystal SiC thin layer 10HE and an SiC epitaxial growth layer 12E on an SiC polycrystalline growth layer 18PC. The fabrication method includes: thinning a surface of a hexagonal SiC single crystal substrate 10SB by an ion implantation removing method; epitaxially growing a single crystal SiC on a first plane of the thinned SiC single crystal layer 131; and directly growing an SiC polycrystalline growth layer 18PC by a CVD method on a second plane of the thinned SiC single crystal layer 131. Here, an interface bonding of a first plane and an interface bonding of a second plane both use no substrate bonding method.

Moreover, the second fabrication method of the SiC epitaxial wafer according to the second embodiment includes thinning a (0001) Si surface of the hexagonal SiC single crystal substrate 10SB by an ion implantation removing method.

In accordance with the second embodiment, it is possible to provide the fabrication method of the SiC epitaxial wafer having the stacked structure including the SiC single crystal substrate 10SB and the SiC polycrystalline growth layer 18PC by the combination technique of the ion implantation removing method and the CVD direct deposition technique, without bonding the substrate.

The second fabrication method of the SiC epitaxial wafer according to the second embodiment includes the following steps. More specifically, the second fabrication method includes: forming a hydrogen ion implantation layer 10HI on an Si plane of an SiC single crystal substrate 10SB; forming an SiC epitaxial growth layer 12E on an Si plane of the SiC single crystal substrate 10SB, and weakening the hydrogen ion implantation layer 10HI to form a single crystal SiC thin layer 10HE; bonding a provisional substrate on an Si plane of the SiC epitaxial growth layer 12E; removing the stacked structure including the single crystal SiC thin layer 10HE and the SiC epitaxial growth layer 12E from the SiC single crystal substrate 10SB; smoothing a surface of the removed single crystal SiC thin layer 10HE; and forming an SiC polycrystalline growth layer 18PC on the smoothed surface of the single crystal SiC thin layer 10HE.

Hereinafter, the second fabrication method of the SiC epitaxial wafer according to the second embodiment will be described in detail with reference to drawings.

(G1) First, as illustrated in FIG. 26, hydrogen ions for an ion implantation removing method are implanted into the Si plane of the hexagonal SiC single crystal substrate 10SB to form the hydrogen ion implantation layer 10HI having a specified depth (approximately 1 μm). In this case, as ion implantation conditions, an accelerating energy is, for example, approximately 100 keV, and a dosage is, for example, approximately $2.0\times10^{17}/cm^2$.

(G2) Next, the hydrogen ion implantation layer 10HI is subjected to a high temperature process to weaken the hydrogen ion implantation layer 10HI. The weakening thermal annealing is required for generating hydrogen microbubbles after the ion implantation of hydrogen to facilitate breaking of the single crystal SiC thin layer 10HE.

(H) Next, as illustrated in FIG. 27, the single crystal SiC epitaxial growth layer 12E is formed by growing the homoepitaxial crystal layer on the Si plane of the single crystal SiC thin layer 10HE by the CVD method.

(I) Next, as illustrated in FIG. 28, the substrate structure illustrated in FIG. 27 is extracted from the CVD homoepitaxial growth furnace, the provisional substrate is bonded on an Si plane of the single crystal SiC epitaxial growth layer 12E with the bonding layer 17PI, in the stacked structure including the SiC single crystal substrate 10SB, the single crystal SiC thin layer 10HE, and the single crystal SiC epitaxial growth layer 12E. For example, the graphite substrate 19GS or a silicon substrate such as a sintered silicon substrate can be applied to the provisional substrate. An organic adhesive, such as a polyimide-based adhesive, for example, is used for the bonding layer 17PI. Organic adhesives, such as epoxy-based adhesive or acrylic adhesive, may be used as other adhesives. When the provisional substrate (graphite substrate 19GS) having an outside size larger by one size than the SiC single crystal substrate 10SB is inserted into a wafer boat groove of a batch-type vertical CVD furnace to be aligned, there is an advantage that a trace of a wafer boat support is outside a substrate effective area.

(J) Next, as illustrated in FIG. 28, the single crystal SiC thin layer 10HE and the single crystal SiC epitaxial growth layer 12E bonded to the graphite substrate 19GS are removed and separated from the SiC single crystal substrate 10SB.

(K) Next, as illustrated in FIG. 29, The removed surface of the stacked structure including the single crystal SiC thin layer 10HE and the single crystal SiC epitaxial growth layer 12E bonded to the graphite substrate 19GS is sequentially smoothed by mechanical polishing and mechanochemistry polishing method.

(L) Next, as illustrated in FIG. 29, P (phosphorus) ions for reducing the electric resistance value of the stacking contact interface are implanted into the smoothed plane to form the phosphorus ion implantation layer 10PI. In this case, a depth of the phosphorus ion implantation layer 10PI is, for example, approximately 0.1 μm to approximately 0.5 μm. In this case, as ion implantation conditions, an accelerating energy is, for example, approximately 10 keV to approximately 180 keV, and a dosage is, for example, approximately $4\times10^{15}/cm^2$ to approximately $6\times10^{16}/cm^2$.

(M) Next, although illustration is omitted, the bonding layer 17PI is eliminated by wet etching, an organic solvent, or the like, and the stacked structure including the single crystal SiC thin layer 10HE and the single crystal SiC epitaxial growth layer 12E and the graphite substrate 19GS are separated from each other.

(N) Next, as illustrated in FIG. 30, the separated stacked structure including the single crystal SiC thin layer 10HE and the single crystal SiC epitaxial growth layer 12E is mounted so that the Si plane thereof is in contact with the carbon tray 20CT, and the C plane thereof is exposed facing up and the SiC polycrystalline growth layer 18PC is deposited on the C plane by the CVD method, and at the same time, activation and crystal damage recovery annealing is performed.

(O) Next, as illustrated in FIG. 31, the stacked structure including the single crystal SiC thin layer 10HE, the single crystal SiC epitaxial growth layer 12E, and the SiC polycrystalline growth layer 18PC, and the carbon tray 20CT are separated from each other, and the outer peripheral portion and substrate both surfaces are processed into a predetermined shape and surface state. In addition, the CVD apparatus for forming the SiC epitaxial growth layer 12E by homoepitaxially growing on the Si plane of the single crystal SiC thin layer 10HE by the CVD method may be the same CVD apparatus for forming the SiC polycrystalline growth layer 18PC on the C plane of the single crystal SiC thin layer 10HE by the CVD method, or may be configured as a separate dedicated apparatus. Here, the fabricating apparatus of the SiC epitaxial wafer according to the embodiments can be applied to the CVD apparatus to be used.

In accordance with the above-mentioned processes, the SiC epitaxial wafer 1 according to the second embodiment can be formed.

The second fabrication method of the SiC epitaxial wafer according to the second embodiment can provide the fabrication method of the composite substrate using no substrate bonding method by combining the direct growth of the polycrystal SiC layer by the CVD with the thinning of the SiC single crystal substrate by the ion implantation removing method into the Si plane of the hexagonal SiC single crystal substrate.

In the second fabrication method of the SiC epitaxial wafer according to the second embodiment, the polycrystal SiC supporting layer is directly deposited by the CVD method on the single crystal SiC layer thinned to the single crystal layer by using the ion implantation removing method performed on the Si plane of the SiC single crystal substrate, and thereby the bonding process between the single crystal SiC layer and the polycrystal SiC substrate is eliminated, and the fabricating cost is reduced by simplifying the fabricating process.

The second fabrication method of the SiC epitaxial wafer according to the second embodiment corresponds to the fabrication method of the SiC composite substrate including the single crystal SiC epitaxial growth layer on the polycrystalline SiC substrate, and on the (000-1) C surface of the hexagonal system SiC single crystal substrate, the polycrystal SiC supporting layer is directly deposited by the thermal CVD method on the SiC single crystal layer on which the surface of the single crystal SiC substrate is thinned using the ion implantation removing method, and thereby the substrate bonding between the single crystal SiC layer and the polycrystal SiC substrate is eliminated, and the fabricating cost can be reduced by simplifying the fabricating process.

The second fabrication method of the SiC epitaxial wafer according to the second embodiment can provide the following effects (1) to (6).

(1) Since substrate bonding required for fabrication of composite substrates using a conventional ion implantation removing method is not used, it is possible to eliminate the yield deterioration due to bonding defects and voids caused by bonding. Moreover, man-hours are reduced, fixed and variable cost losses due to defects are reduced, and productivity and quality are improved.

(2) Precise polishing process for ensuring bondability is no longer required, and the high cost due to defective losses and increased processing costs incurred in these processes is eliminated, thereby enabling the provision of the inexpensive SiC composite substrate.

(3) Since the interface contact resistance value can be reduced by performing ion implantation in advance into one side of the contact surface between the polycrystalline SiC layer and the single crystal SiC epitaxial growth layer, and by performing high-concentration doping control to another side during the film formation, the driving voltage peculiar to the composite substrate can be reduced.

(4) Since high-concentration autodoping can be performed for the thermal CVD method during deposition of the polycrystal SiC supporting layer, the electric resistance value of bulk can be reduced a resistance value equivalent to a single crystal substrate fabricated by the sublimation method.

(5) Of two ion implantations into the C plane of the SiC single crystal substrate 10SB, the first ion implantation is the hydrogen ion implantation for the ion implantation removing method, and after performing the ion implantation, the weakening thermal annealing is required to generate the hydrogen microbubbles to facilitate breaking the thinned layer. The second ion implantation is the phosphorus ion implantation for reduction of the contact interface resistance (ohmic contact) between the single crystal SiC and the polycrystal SiC, and after performing the implanting, the activation thermal annealing is required to activate the phosphorus ions and improve the donor concentration. Since both annealing processes are simultaneously realized by heating the substrate during the deposition of the polycrystal SiC supporting layer by the CVD, there is no need to perform these annealing processes separately, thereby reducing the fabricating cost.

(6) In the second embodiment in which the Si plane is thinned by the ion implantation removing method, since the SiC single crystal substrate 10SB itself is not necessary to insert into the CVD reaction chamber during the deposition of the SiC polycrystalline growth layer 18PC, the reuse times of the SiC single crystal substrate 10SB are increased, and thereby the cost can further be reduced.

(Fabricating Apparatus for SiC Sintered Body)

In the fabrication method of the SiC epitaxial wafer according to the embodiments, the SiC polycrystalline substrate 16P can be formed of a sintered SiC substrate.

Figure 32:
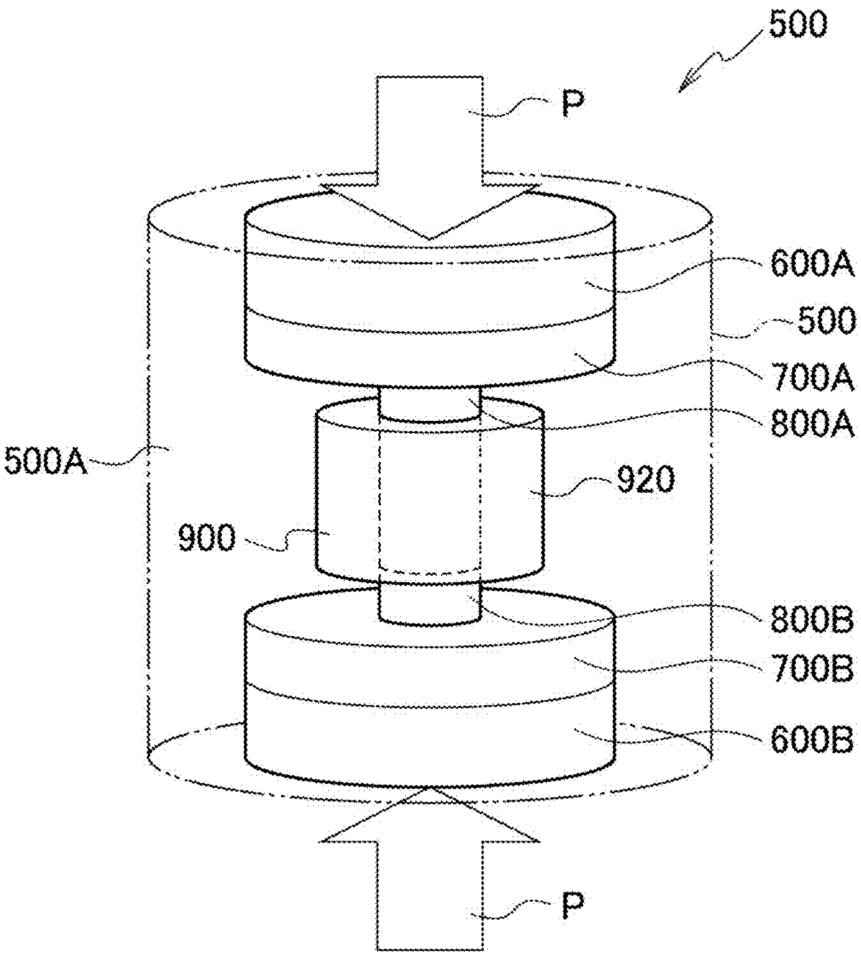
FIG. 32 illustrates a schematic diagram of a fabricating apparatus of a sintered SiC substrate applicable to the fabrication method of the SiC epitaxial wafer according to the embodiments.

FIG. 32 schematically illustrates a fabricating apparatus 500 for a sintered SiC substrate applicable to the fabrication method of the SiC epitaxial wafer according to the embodiments. An inside 500A of the fabricating apparatus 500 is substituted by a vacuum atmosphere of about several Pa or with an Ar/$N_2$ gas.

A solid compression sintering method by hot press (HP) sintering is adopted into the fabricating apparatus 500. A graphite sintering die (graphite die) 900 filled with a powder or solid SiC polycrystalline body material is heated while being pressurized. A thermocouple or a radiation thermometer 920 is housed in the graphite die 900.

The graphite die 900 is connected to pressing shafts 600A and 600B via graphite bunches 800A and 800B and graphite spacers 700A and 700B. The SiC polycrystalline substance material is pressurized and heated by pressurizing between the pressing shaft 600A and 600B. A heating processing temperature is, for example, a maximum of approximately 1500° C. and an applied pressure P is, for example, a maximum of approximately 280 MPa. It is to be noted that, for example, Spark Plasma Sintering (SPS) may be applied to the hot press (HP) sintering.

According to the fabricating apparatus 500, since a heating range is limited, a rapid temperature increasing and cooling are more possible (several minutes to several hours) than atmosphere heating, such as in an electric furnace. It is possible to fabricate a dense SiC sintered body which suppresses grain growth by pressurizing and rapid temperature increasing. Moreover, it can be applied not only to the sintering but also to sintering bonding, porous body sintering, and the like.

Figure 33:
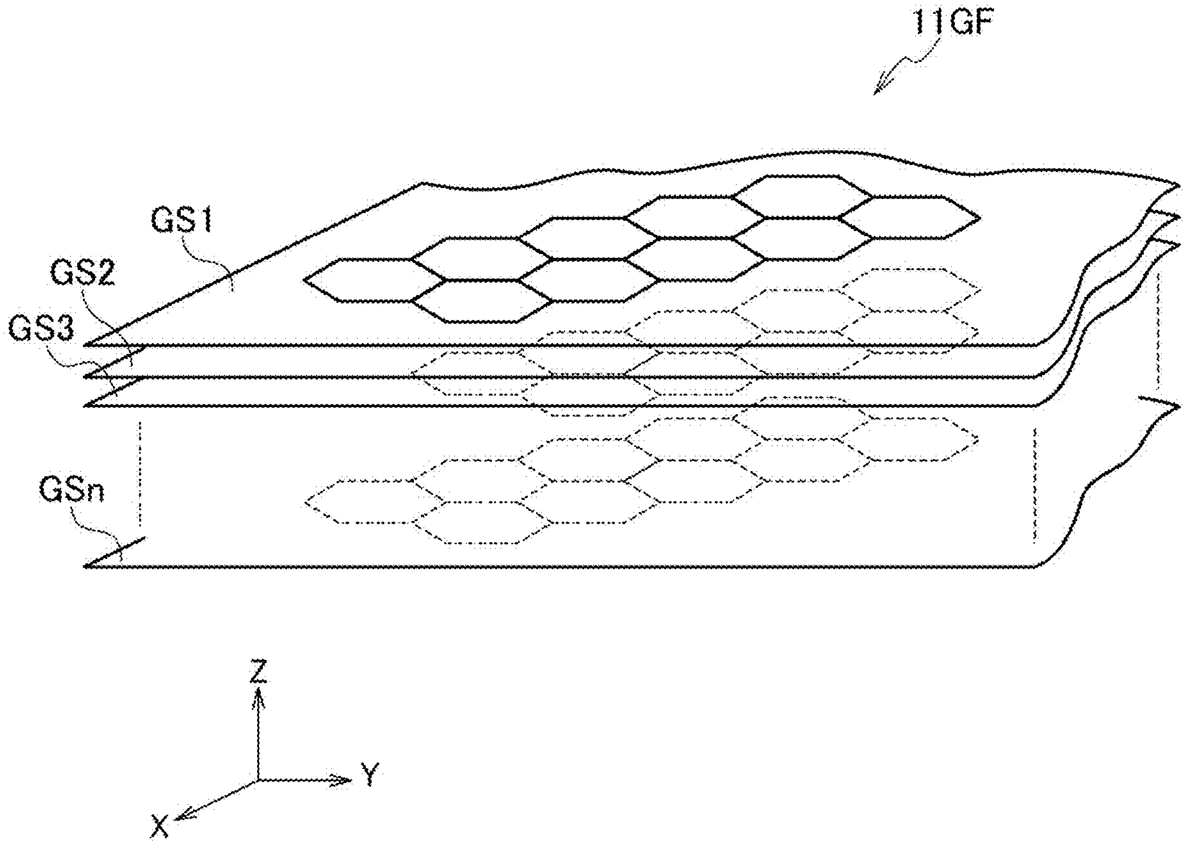
FIG. 33 illustrates a bird's-eye view of an example of a graphene layer applicable to the fabrication method for the SiC epitaxial wafer according to the embodiments, which is provided with a configuration in which a plurality of layers are laminated.

The graphene layers 11GR1, 11GR2, and the like applicable to the fabrication method for the SiC epitaxial wafer 1 according to the embodiments may include a single-layer structure, or may include a configuration obtained by laminating a plurality of layers. FIG. 33 illustrates a bird's-eye view an example of the graphene layer applicable to the fabrication method for the SiC epitaxial wafer according to the embodiments, which is provided with a configuration in which a plurality of layers are laminated.

A graphene layer 11GF provided with a configuration obtained by laminating a plurality of layers includes a laminated structure of graphite sheets GS1, GS2, GS3, . . . , GSn, as illustrated in FIG. 33. The graphite sheets GS1, GS2, GS3, . . . , GSn of respective planes composed of n layers have a large number of hexagonal carbon (C) covalent bonds in one laminated crystal structure, and the graphite sheets GS1, GS2, GS3, . . . , GSn of the respective plane are bonded to each other by Van der Waals force.

The SiC epitaxial wafer according to the embodiments is applicable to fabricating of various kinds of SiC semiconductor elements, for example. The following describes examples of SiC Schottky Barrier Diodes (SiC-SBDs), SiC Trench-gate type Metal Oxide Semiconductor Field Effect Transistors (SiC-TMOSFETs), and SiC planar-gate type MOSFETs, each using the SiC epitaxial wafer 1 according to the first embodiment. It is to be noted that the same configuration is possible using the SiC epitaxial wafer 1A according to the second embodiment.

(SiC-SBD)

Figure 34:
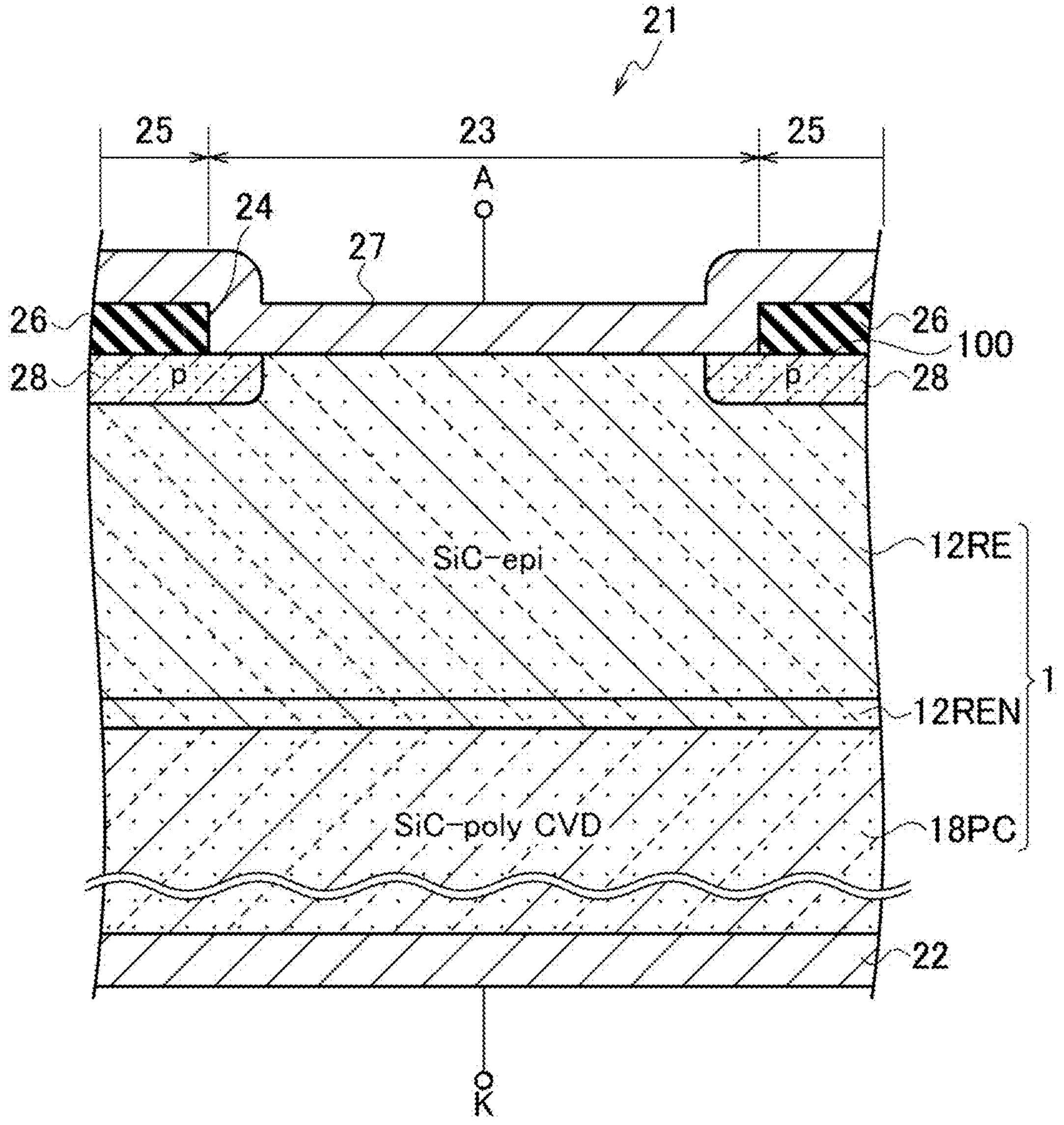
FIG. 34 illustrates a cross-sectional diagram illustrating a Schottky barrier diode fabricated using the SiC epitaxial wafer according to the first embodiment.

As a semiconductor device fabricated using the SiC epitaxial wafer according to the first embodiment, an SiC-SBD 21 includes a SiC epitaxial wafer 1 including an SiC polycrystalline growth layer (CVD) 18PC and an SiC epitaxial growth layer 12RE, as illustrated in FIG. 34. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ $cm^{-3}$ to approximately $1\times10^{21}$ $cm^{-3}$), and the SiC epitaxial growth layer 12RE is doped into an $n^-$ type (of which an impurity density is, for example, approximately $5\times10^{14}$ $cm^{-3}$ to approximately $5\times10^{16}$ $cm^{-3}$). The highly doped layer 12REN is doped at higher concentration than that of the SiC epitaxial growth layer 12RE.

Moreover, the SiC epitaxial growth layer 12RE may contain one crystal structure selected from a group consisting of 4H-SiC, 6H-SiC, and 2H-SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a cathode electrode 22 so as to cover the whole region of the back side surface, and the cathode electrode 22 is connected to a cathode terminal K.

A front side surface 100 ((0001) Si plane) of the SiC epitaxial growth layer 12 includes a contact hole 24 to which a part of the SiC epitaxial growth layer 12RE is exposed as an active region 23, and a field insulating film 26 is formed at a field region 25 which surrounding the active region 23.

Although the field insulating film 26 includes silicon oxide ($SiO_2$), the field insulating film 26 may include other insulating materials, e.g., silicon nitride (SiN). An anode electrode 27 is formed on the field insulating film 26, and the anode electrode 27 is connected to an anode terminal A.

Near the front side surface 100 (surface portion) of the SiC epitaxial growth layer 12, a p type Junction Termination Extension (JTE) structure 28 is formed so as to be contacted with the anode electrode 27. The JTE structure 28 is formed along an outline of the contact hole 24 so as to extend from the outside to inside of the contact hole 24 of the field insulating film 26.

(SiC-TMOSFET)

Figure 35:
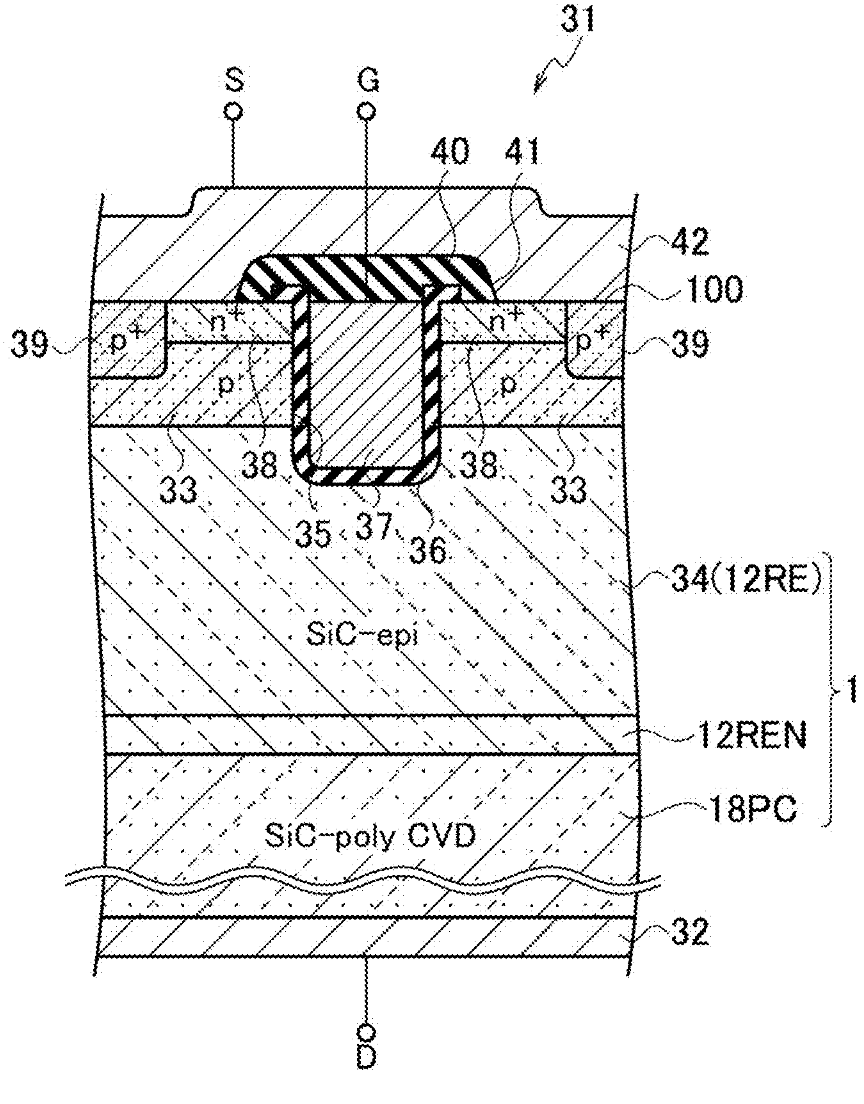
FIG. 35 illustrates a cross-sectional diagram illustrating a trench-gate type MOSFET fabricated with the SiC epitaxial wafer according to the first embodiment.

As a semiconductor device fabricated using the SiC epitaxial wafer according to the first embodiment, a trench-gate type MOSFET 31 includes a SiC epitaxial wafer 1 including an SiC polycrystalline growth layer 18PC and an SiC epitaxial growth layer 12RE, as illustrated in FIG. 35. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ $cm^{-3}$ to approximately $1\times10^{21}$ $cm^{-3}$), and the SiC epitaxial growth layer 12RE is doped into an $n^-$ type (of which an impurity density is, for example, approximately $5\times10^{14}$ $cm^{-3}$ to approximately $5\times10^{16}$ $cm^{-3}$). The highly doped layer 12REN is doped at higher concentration than that of the SiC epitaxial growth layer 12RE.

Moreover, the SiC epitaxial growth layer 12RE may contain one crystal structure selected from a group consisting of 4H-SiC, 6H-SiC, and 2H-SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a drain electrode 32 so as to cover the whole region of the back side surface, and the drain electrode 32 is connected to a drain terminal D.

Near the front side surface 100 ((0001) Si plane) (surface portion) of the SiC epitaxial growth layer 12RE, a p type body region 33 (of which an impurity concentration is, for example, approximately $1\times10^{16}$ $cm^{-3}$ to approximately $1\times10^{19}$ $cm^{-3}$) is formed. In the SiC epitaxial growth layer 12RE, a portion at a side of the SiC polycrystalline growth layer 18PC with respect to the body region 33 is an $n^-$ type drain region 34 (12RE) where a state of the SiC epitaxial growth layer RE is still kept.

A gate trench 35 is formed in the SiC epitaxial growth layer 12RE. The gate trench 35 passes through the body region 33 from the surface 100 of the SiC epitaxial growth layer 12RE, and a deepest portion of the gate trench 35 extends to the drain region 34 (12RE).

A gate insulating film 36 is formed on an inner surface of the gate trench 35 and the surface 100 of the SiC epitaxial growth layer 12RE so as to cover the whole of the inner surface of the gate trench 35. Moreover, a gate electrode 37 is embedded in the gate trench 35 by filling up the inside of the gate insulating film 36 with, for example, polysilicon. A gate terminal G is connected to the gate electrode 37.

An $n^+$ type source region 38 forming a part of a side surface of the gate trench 35 is formed on a surface portion of the body region 33.

Moreover, a $p^+$ type body contact region 39 (of which an impurity concentration is, for example, approximately $1\times10^{18}$ $cm^{-3}$ to approximately $1\times10^{21}$ $cm^{-3}$) which passes through the source region 38 from the surface 100 and is connected to the body region 33 is formed on the SiC epitaxial growth layer 12.

An interlayer insulating film 40 including $SiO_2$ is formed on the SiC epitaxial growth layer 12RE. A source electrode 42 is connected to the source region 38 and the body contact region 39 through a contact hole 41 formed in the interlayer insulating film 40. A source terminal S is connected to the source electrode 42.

A predetermined voltage (voltage equal to or greater than a gate threshold voltage) is applied to the gate electrode 37 in a state where a predetermined potential difference is generated between the source electrode 42 and the drain electrode 32 (between the source and the drain). Thereby, a channel can be formed by an electric field from the gate electrode 37 near the interface between the gate insulating film 36 and the body region 33. Thus, an electric current can be flowed between the source electrode 42 and the drain electrode 32, and thereby SiC-TMOSFET 31 can be turned ON state.

(SiC Planar-Gate Type MOSFET)

Figure 36:
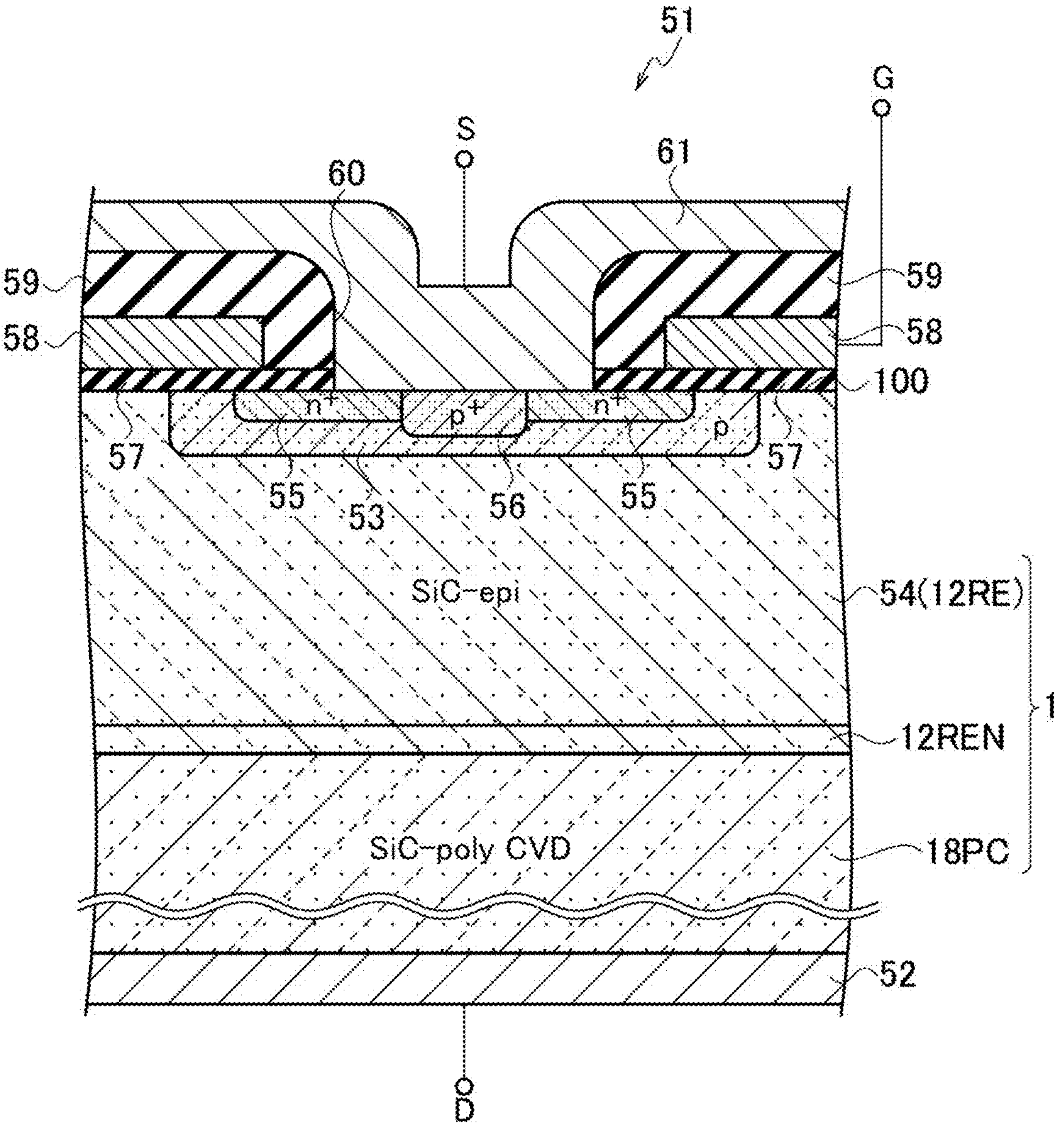
FIG. 36 illustrates a cross-sectional diagram illustrating a planar-gate type MOSFET fabricated with the SiC epitaxial wafer according to the first embodiment.

As a semiconductor device fabricated using the SiC epitaxial wafer 1 according to the first embodiment, a planar-gate type MOSFET 51 includes a SiC epitaxial wafer 1 including an SiC polycrystalline growth layer 18PC and an SiC epitaxial growth layer 12RE, as illustrated in FIG. 36. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ $cm^{-3}$ to approximately $1\times10^{21}$ $cm^{-3}$), and The SiC epitaxial growth layer 12 is doped into an $n^-$ type (of which an impurity density is, for example, approximately $5\times10^{14}$ $cm^{-3}$ to approximately $5\times10^{16}$ $cm^{-3}$).

Moreover, the SiC epitaxial growth layer 12 may contain one crystal structure selected from a group consisting of 4H-SiC, 6H-SiC, and 2H-SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC single crystal substrate 10SB includes a drain electrode 52 so as to cover the whole region of the back side surface, and the drain electrode 52 is connected to a drain terminal D.

Near the front side surface 100 ((0001) Si plane) (surface portion) of the SiC epitaxial growth layer 12RE, a p type body region 53 (of which an impurity concentration is, for example, approximately $1\times10^{16}$ $cm^{-3}$ to approximately $1\times10^{19}$ $cm^{-3}$) is formed in a well shape. In the SiC epitaxial growth layer 12RE, a portion at a side of the SiC single crystal substrate 10SB with respect to the body region 53 is an $n^-$ type drain region 54 (12RE) where a state after the epitaxial growth is still kept.

An $n^+$ type source region 55 is formed on a surface portion of the body region 53 with a certain space from a periphery of the body region 53.

A $p^+$ type body contact region 56 (of which an impurity concentration is, for example, approximately $1\times10^{18}$ $cm^{-3}$ to approximately $1\times10^{21}$ $cm^{-3}$) is formed inside of the source region 55. The body contact region 56 passes through the source region 55 in a depth direction, and is connected to the body region 53.

A gate insulating film 57 is formed on the front side surface 100 of the SiC epitaxial growth layer 12RE. The gate insulating film 57 covers the portion surrounding the source region 55 in the body region 53 (peripheral portion of the body region 53), and an outer peripheral portion of the source region 55.

A gate electrode 58 including polysilicon, for example, is formed on the gate insulating film 57. The gate electrode 58 is opposed to the peripheral portion of the body region 53 so as to sandwich the gate insulating film 57. A gate terminal G is connected to the gate electrode 58.

An interlayer insulating film 59 including $SiO_2$ is formed on the SiC epitaxial growth layer 12RE. A source electrode 61 is connected to the source region 55 and the body contact region 56 through a contact hole 60 formed in the interlayer insulating film 59. A source terminal S is connected to the source electrode 61.

A predetermined voltage (voltage equal to or greater than a gate threshold voltage) is applied to the gate electrode 58 in a state where a predetermined potential difference is generated between the source electrode 61 and the drain electrode 52 (between the source and the drain). Thereby, a channel can be formed by an electric field from the gate electrode 58 near the interface between the gate insulating film 57 and the body region 53. Thus, an electric current can be flowed between the source electrode 61 and the drain electrode 52, and thereby the planar-gate type MOSFET 51 can be turned ON state.

Although the embodiments have been explained above, the embodiment can also be implemented with other configurations.

Although illustration is omitted, for example, MOS capacitors can also be fabricated using the SiC epitaxial wafer 1 according to the embodiments. According to such MOS capacitors, a yield and reliability can be improved.

Although illustration is omitted, bipolar junction transistors can also be fabricated using the SiC epitaxial wafer 1 according to the embodiments. In addition, the SiC epitaxial wafer 1 according to the embodiments can also be used for fabrication of SiC pn diodes, SiC IGBTs, SiC complementary MOSFETs, and the like. Moreover, the SiC epitaxial wafer 1 according to the embodiments can also be applied to other type devices such as Light Emitting Diodes (LEDs) and Semiconductor Optical Amplifiers (SOAs), for example.

Figure 37A:
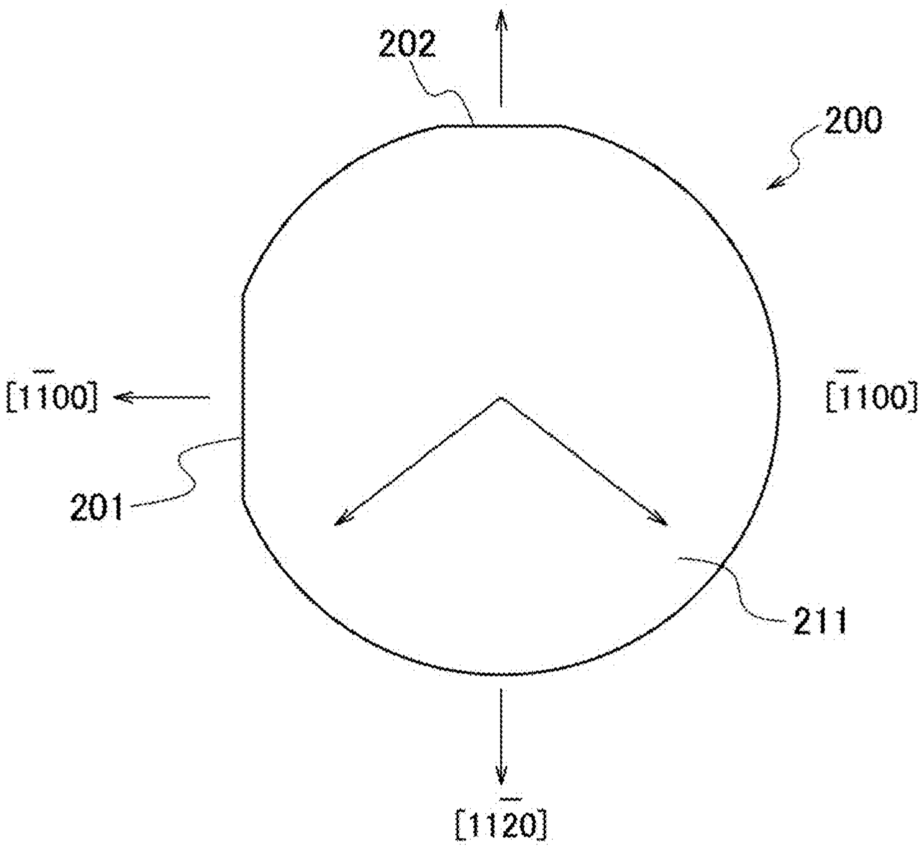
FIG. 37A illustrates a top view diagram for explaining a crystal plane of SiC.
Figure 37B:
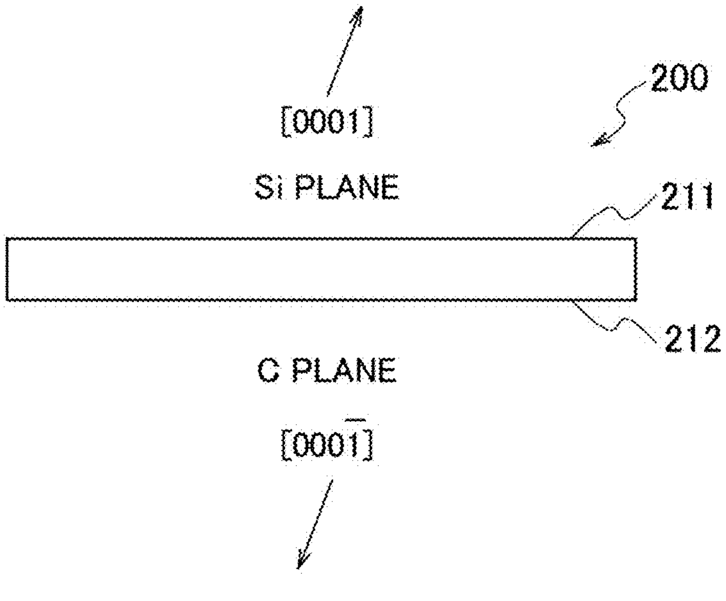
FIG. 37B illustrates a side view diagram for explaining the crystal plane of SiC.

FIG. 37 is a diagram for explaining a crystal plane of SiC. FIG. 37A is a top view diagram illustrating an Si plane 211 of an SiC wafer 200 on which a primary orientation flat 201 and a secondary orientation flat 202 are formed. In the side view diagram observed from the orientation of [−1100] illustrated in FIG. 37B, an Si plane 211 of the orientation of [0001] is formed on an upper surface, and a C plane 212 of an orientation of [000-1] is formed on a lower surface.

Figure 38:
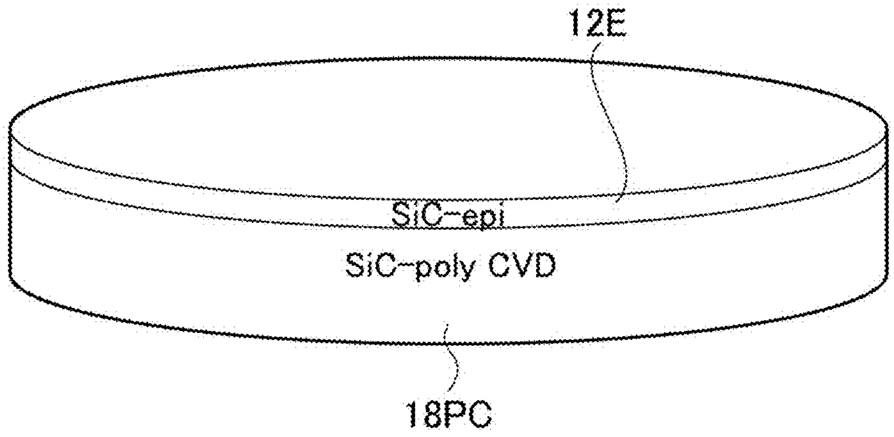
FIG. 38 illustrates a bird's-eye view of the SiC epitaxial wafer (wafer) according to the embodiments.

A schematic bird's-eye view configuration of the SiC epitaxial wafer (wafer) 1 according to the embodiments includes an SiC polycrystalline growth layer 18PC and an SiC epitaxial growth layer 12RE, as illustrated in FIG. 38.

A thickness of the SiC polycrystalline growth layer 18PC is, for example, approximately 200 μm to approximately 500 μm, and a thickness of the SiC epitaxial growth layer 12RE is, for example, approximately 4 μm to approximately 100 μm.

(Example of Crystal Structure)

Figure 39A:
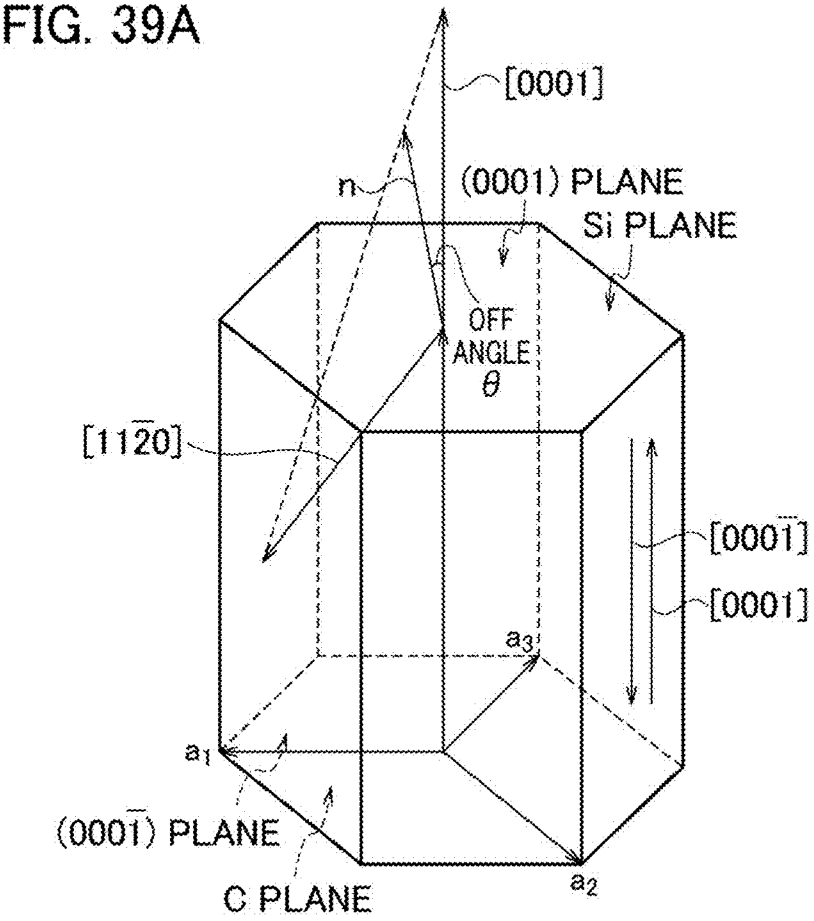
FIG. 39A illustrates a bird's-eye view of a unit cell of a 4H-SiC crystal applicable to the SiC epitaxial growth layer of the SiC epitaxial wafer according to the embodiments.
Figure 39B:
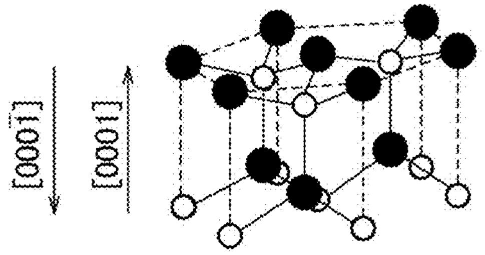
FIG. 39B illustrates a configuration diagram of a two-layer portion of the 4H-SiC crystal.
Figure 39C:
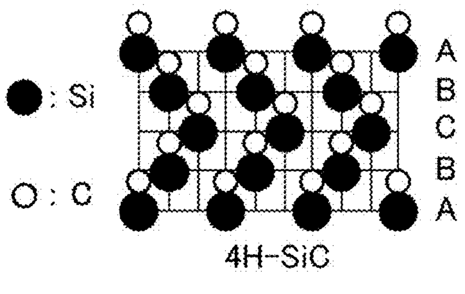
FIG. 39C illustrates a configuration diagram of a four-layer portion of the 4H-SiC crystal.

FIG. 39A illustrates a schematic bird's-eye view configuration of a unit cell of a 4H-SiC crystal applicable to the SiC epitaxial growth layer 12RE, FIG. 39B shows a schematic configuration of a two layer portion of the 4H-SiC crystal, and FIG. 39C shows a schematic configuration of four layer portion of the 4H-SiC crystal.

Figure 40:
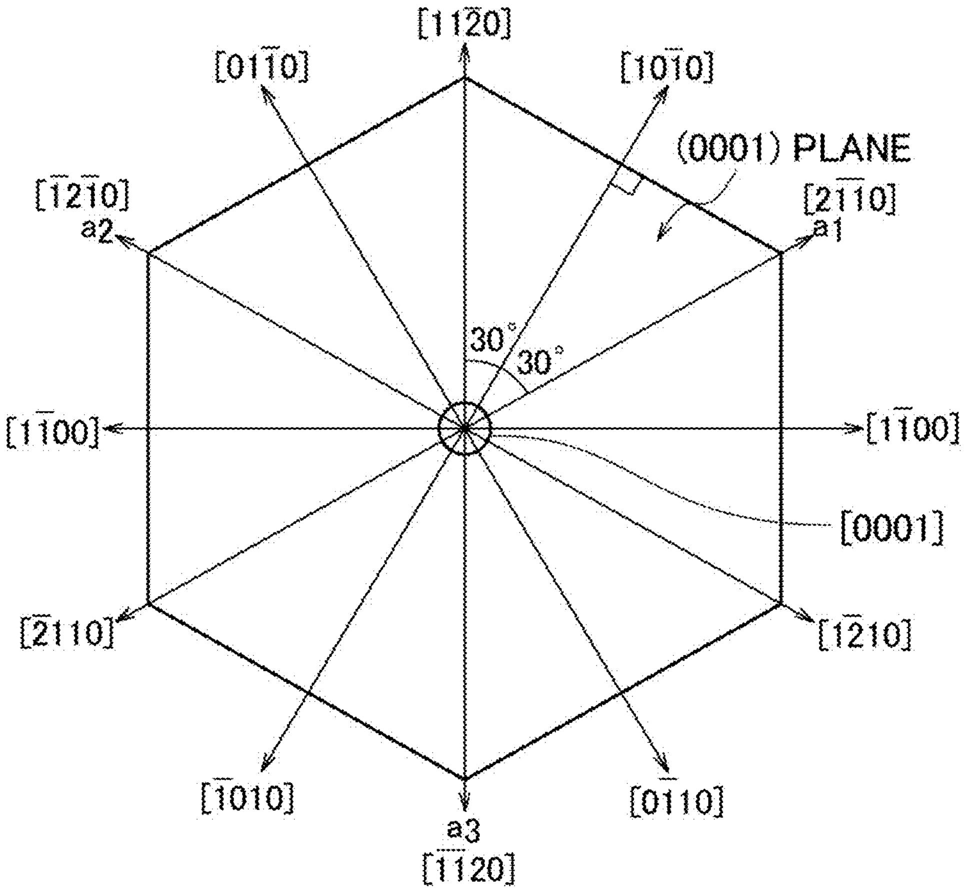
FIG. 40 illustrates a configuration diagram showing the unit cell of the 4H-SiC crystal shown in FIG. 37A observed from directly above a (0001) surface.

Moreover, FIG. 40 illustrates a schematic configuration of the unit cell of the 4H-SiC crystal structure of shown in FIG. 39A observed from directly above a (0001) surface.

As illustrated in FIGS. 39A to 39C, the crystal structure of the 4H-SiC can be approximated with a hexagonal system, and four C atoms are bound with respect to one Si atom. The four C atoms are positioned at four vertexes of a regular tetrahedron in which the Si atom is disposed at a center thereof. In the four C atoms, one Si atom is positioned in [0001] axial direction with respect to the C atom, and other three C atoms are positioned at a [000-1] axis side with respect to the Si atom. In FIG. 39A, an off angle θ is equal to or less than approximately 4 degrees.

The [0001] axis and [000-1] axis are along the axial direction of the hexagonal prism, and a plane (top plane of the hexagonal prism) using the [0001] axis as a normal line is (0001) plane (Si plane). On the other hand, a surface (bottom surface of the hexagonal prism) using the [000-1] axis as a normal line is (000-1) surface (C surface).

Moreover, directions vertical to the [0001] axis, and passing along the vertexes not adjacent with one another in the hexagonal prism observed from directly above the (0001) plane are respectively a1 axis [2-1-10], a2 axis [−12-10], and a3 axis [−1-120].

As shown in FIG. 40, a direction passing through the vertex between the a1 axis and the a2 axis is [11-20] axis, a direction passing through the vertex between the a2 axis and the a3 axis is [−2110] axis, and a direction passing through the vertex between the a3 axis and the a1 axis is [1-210] axis.

The axes which are incline at an angle of 30 degrees with respect to each axis of the both sides, and used as the normal line of each side surface of the hexagonal prism, between each of the axes of the above-mentioned six axes passing through the respective vertexes of the hexagonal prism, are respectively [10-10] axis, [1-100] axis, [0-110] axis, [−1010] axis, [−1100] axis, and [01-10] axis, in the clockwise direction sequentially from between the a1 axis and the [11-20] axes. Each plane (side plane of the hexagonal prism) using these axes as the normal line is a crystal surface right-angled to the (0001) plane and the (000-1) plane.

The epitaxial growth layer 12RE may include at least one type or a plurality of types semiconductor(s) selected from a group consisting of group IV semiconductors, group III-V compound semiconductors, and group II-VI compound semiconductors.

Moreover, the SiC single crystal substrate 10SB and the SiC epitaxial growth layer 12RE may contain any one material selected from a group consisting of 4H-SiC, 6H-SiC, and 2H-SiC materials.

In addition, the SiC single crystal substrate 10SB and the SiC epitaxial growth layer 12RE may contain at least one type selected from a group consisting of GaN, BN, AlN, $Al_2O_3$, $Ga_2O_3$, diamond, carbon, and graphite, as other materials except for SiC.

The semiconductor device including the SiC epitaxial wafer according to the embodiments may include any one of GaN-based, AlN-based, and gallium-oxide-based IGBTs, diodes, MOSFETs, and thyristors, except for SiC-based devices.

The semiconductor device including the SiC epitaxial wafer according to the embodiments may include a configuration of any one of a 1-in-1 module, a 2-in-1 module, a 4-in-1 module, a 6-in-1 module, a 7-in-1 module, an 8-in-1 module, a 12-in-1 module, or a 14-in-1 module.

In accordance with the SiC epitaxial wafer according to the embodiments, it is possible to use, for example, a low cost SiC polycrystalline substrate, instead of a high cost SiC single crystalline substrate, as a substrate material.

Other Embodiments

As explained above, the embodiments have been described, as a disclosure including associated description and drawings to be construed as illustrative, not restrictive. It will be apparent to those skilled in the art from the disclosure that various alternative embodiments, examples and implementations can be made.

Such being the case, the embodiments cover a variety of embodiments and the like, whether described or not.

INDUSTRIAL APPLICABILITY

The SiC epitaxial wafer and the semiconductor device including such a SiC epitaxial wafer of the present embodiments can be used for semiconductor module techniques, e.g., IGBT modules, diode modules, MOS modules (SiC, GaN, AlN, Gallium oxide), and the like; and can be applied to a wide range of application fields such as power modules for inverter circuits that drive electric motors used as power sources for electric vehicles (including hybrid vehicles), trains, industrial robots and the like or power modules for inverter circuits that convert electric power generated by other power generators (particularly, private power generators) such as solar cells and wind power generators into electric power of a commercial power source.

What is claimed is:

1. A fabricating apparatus of an SiC epitaxial wafer, the fabricating apparatus comprising:

a growth furnace including an inner tube, an outer tube, and a heat insulating material between the inner tube and the outer tube;

a gas mixing preliminary chamber disposed outside the growth furnace, the gas mixing preliminary chamber configured to mix carrier gas and/or material gas and to regulate a pressure thereof;

a gas diffusion plate at a lower portion of the inner tube;

a wafer boat inside the inner tube and configured so that a plurality of SiC wafer pairs, in which two substrates each having an SiC single crystal in contact with each other in a back-to-back manner, are disposed at equal intervals with a gap therebetween; and a heating unit configured to heat the wafer boat disposed in the growth furnace to an epitaxial growth temperature, wherein the carrier gas and/or the material gas are introduced into the inner tube of the growth furnace through the gas diffusion plate after preliminarily being mixed and pressure-regulated in the gas mixing preliminary chamber to epitaxially grow an SiC layer on a surface of each of the plurality of SiC wafer pairs at a temperature of 1500° C. to 1650° C.

2. The fabricating apparatus of the SiC epitaxial wafer according to claim 1, wherein the carrier gas and/or the material gas are introduced from a lower portion of the growth furnace; and when the plurality of SiC wafer pairs are disposed in the heated wafer boat, the carrier gas and/or the material gas flows over the surface of each of the SiC wafer pairs and rises, reverses a flow direction at an upper portion of the growth furnace and then falls, and then is evacuated from the lower portion of the growth furnace.

3. The fabricating apparatus of the SiC epitaxial wafer according to claim 1, wherein it is configured so that, when the plurality of SiC wafer pairs are disposed in the wafer boat, the flow of the carrier gas and/or the material gas is in parallel to a surface of the substrate the SiC wafer pairs.

4. The fabricating apparatus of the SiC epitaxial wafer according to claim 1, wherein it is configured so that, when the plurality of SiC wafer pairs are disposed in the wafer boat, the flow of the carrier gas and/or the material gas is perpendicular to a surface of the substrate the SiC wafer pairs.

5. The fabricating apparatus of the SiC epitaxial wafer according to claim 1, wherein the growth furnace comprises a vertical structure.

6. The fabricating apparatus of the SiC epitaxial wafer according to claim 1, wherein the heating unit comprises one selected by the group consisting of a high frequency heating coil, a resistance heating heater, and a heating lamp.

7. A fabrication method of an SiC epitaxial wafer, the fabrication method comprising:

disposing a growth furnace including an inner tube, an outer tube, and a heat insulating material between the inner tube and the outer tube;

disposing a gas mixing preliminary chamber configured to mix carrier gas and/or material gas and regulate a pressure thereof outside the growth furnace;

preparing an SiC wafer pair in which two substrates including an SiC single crystal being in contact with each other in a back-to-back manner;

disposing a plurality of the SiC wafer pairs at equal intervals with a gap between each other in a wafer boat;

disposing the wafer boat in the growth furnace;

heating the wafer boat to an epitaxial growth temperature;

introducing hydrogen gas into the inner tube to etch a surface of the SiC single crystal to stabilize nanofacets prior to growing the SiC layer;

introducing carrier gas and/or material gas into the gas mixing preliminary chamber;

mixing the carrier gas and/or the material gas and regulating the pressure thereof in advance in the gas mixing preliminary chamber;

introducing the carrier gas and/or the material gas into the inner tube of the growth furnace through a gas diffusion plate after mixing and pressure-regulating of the carrier gas and/or the material gas; and epitaxially growing an SiC layer on a surface of each of the plurality of SiC wafer pairs at a temperature of 1500° C. to 1650° C.

8. The fabrication method of the SiC epitaxial wafer according to claim 7, wherein the carrier gas and/or the material gas are introduced from a lower portion of the growth furnace; and the carrier gas and/or the material gas flows over the surface of each of the SiC wafer pairs disposed in the heated wafer boat and rises, reverses a flow direction at an upper portion of the growth furnace and then falls, and then is evacuated from the lower portion of the growth furnace.

9. The fabrication method of the SiC epitaxial wafer according to claim 7, further comprising flowing argon and/or nitrogen, during a period from a start of heating until the growth temperature is reached and the growth is started.

10. The fabrication method of the SiC epitaxial wafer according to claim 7, further comprising:

mixing the carrier gas and/or the material gas and regulating a pressure thereof to a growth pressure, in the gas mixing preliminary chamber; and introducing the mixed gas of the carrier gas and/or the material gas into the growth furnace at a timing when starting the growth of the SiC layer.

11. The fabrication method of the SiC epitaxial wafer according to claim 7, wherein the carrier gas contains at least one selected by the group consisting of hydrogen, argon, and nitrogen gas, and the material gas supplied with the carrier gas during the growth of the SiC layer contains at least one selected by the group consisting of silicon hydride, halide, halogen hydride gas, and hydrocarbon gas.

12. The fabrication method of the SiC epitaxial wafer according to claim 7, further comprising:

forming a graphene layer on the single crystal SiC substrate; and when introducing the mixed gas of the carrier gas and/or the material gas into the growth furnace, adjusting the growth pressure and/or the carrier gas and the material gas partial pressure ratio, in accordance with the epitaxial growth temperature, to suppress a variation of the layer thickness of the graphene layer.

13. The fabrication method of the SiC epitaxial wafer according to claim 7, further comprising:

disposing a single crystal SiC substrate as the substrate in the growth furnace and forming a graphene layer on the single crystal SiC substrate by an SiC surface thermal decomposition method; and forming an SiC epitaxial growth layer on the graphene layer, wherein the step of forming the graphene layer and the step of forming the SiC epitaxial growth layer are continuously performed in the growth furnace.

14. The fabrication method of the SiC epitaxial wafer according to claim 7, wherein the material gas contains Si-based gas of at least one selected from the group consisting of $SiH_4$, $SiH_3F$, $SiH_2F_2$, $SiHF_3$, and $SiF_4$.

15. The fabrication method of the SiC epitaxial wafer according to claim 7, wherein the material gas contains CH-based gas of at least one selected from the group consisting of $C_3H_8$, $C_2H_4$, $C_2H_2$, $CF_4$, $C_2F_6$, $C_3F_8$, $C_4F_6$, $C_4F_8$, $C_5F_8$, $CHF_3$, $CH_2F_2$, $CH_3F$, and $C_2HF_5$.

16. The fabrication method of the SiC epitaxial wafer according to claim 7, wherein the carrier gas contains at least one selected from the group consisting of $H_2$, Ar, $N_2$, HCl, and $F_2$.

17. The fabrication method of the SiC epitaxial wafer according to claim 9, wherein the SiC layer includes a dopant, wherein materials of the dopant contains, as n type doping impurities, at least one selected from the group consisting of nitrogen (N), phosphorus (P), and arsenic (As), and contains, as p type doping impurities, at least one selected from the group consisting of boron (B), aluminum (Al), and trimethylaluminum (TMA).

18. The fabrication method of the SiC epitaxial wafer according to claim 7, further comprising forming a graphene layer on the single crystal SiC substrate.

19. The fabricating apparatus of the SiC epitaxial wafer according to claim 1, wherein the inner tube is formed of graphite and the outer tube is formed of silica.

20. The fabrication method of the SiC epitaxial wafer according to claim 7, wherein the inner tube is formed of graphite and the outer tube is formed of silica.

* * * * *